(12) United States Patent
Belcher et al.

(10) Patent No.: US 10,199,588 B2
(45) Date of Patent: Feb. 5, 2019

(54) PLANAR MIXED-METAL PEROVSKITES FOR OPTOELECTRONIC APPLICATIONS

(71) Applicant: Massachusetts Institute of Technology, Cambridge, MA (US)

(72) Inventors: Angela M. Belcher, Lexington, MA (US); Matthew T. Klug, Cambridge, MA (US); Paula T. Hammond, Newton, MA (US)

(73) Assignee: MASSACHUSETTS INSTITUTE OF TECHNOLOGY, Cambridge, MA (US)

(*) Notice: Subject to any disclaimer, the term of this patent is extended or adjusted under 35 U.S.C. 154(b) by 0 days.

(21) Appl. No.: 15/241,031

(22) Filed: Aug. 18, 2016

(65) Prior Publication Data

US 2017/0053746 A1    Feb. 23, 2017

Related U.S. Application Data

(60) Provisional application No. 62/206,399, filed on Aug. 18, 2015.

(51) Int. Cl.
| | |
|---|---|
| H01L 31/00 | (2006.01) |
| H01L 51/42 | (2006.01) |
| H01L 51/00 | (2006.01) |
| H01L 31/0256 | (2006.01) |

(52) U.S. Cl.
CPC ........ *H01L 51/424* (2013.01); *H01L 51/0003* (2013.01); *H01L 51/0032* (2013.01); *H01L 51/0047* (2013.01); *H01L 2031/0344* (2013.01); *H01L 2251/301* (2013.01); *H01L 2251/308* (2013.01); *Y02E 10/549* (2013.01)

(58) Field of Classification Search
CPC ..................................................... H01L 51/424
USPC ........................................................ 136/256
See application file for complete search history.

(56) References Cited

U.S. PATENT DOCUMENTS

| | | | |
|---|---|---|---|
| 7,837,528 B2 | 11/2010 | Shigemura et al. | |
| 2004/0104197 A1 | 6/2004 | Shigemura et al. | |
| 2015/0122314 A1 | 5/2015 | Snaith et al. | |
| 2015/0144195 A1* | 5/2015 | Irwin .................. | H01G 9/2027 136/260 |
| 2015/0243444 A1* | 8/2015 | Irwin .................. | H01G 9/2027 136/261 |

(Continued)

FOREIGN PATENT DOCUMENTS

| | | |
|---|---|---|
| WO | 2014/173811 A1 | 10/2014 |
| WO | 2015/036905 A1 | 3/2015 |
| WO | 2015/084961 A1 | 6/2015 |

OTHER PUBLICATIONS

Babayigit, A. et al., "Assessing the toxicity of Pb- and Sn-based perovskite solar cells in model organism Danio rerio," Science Report 6, 18721 (2016) p. 1-11.

(Continued)

*Primary Examiner* — Angelo Trivisonno
(74) *Attorney, Agent, or Firm* — Steptoe & Johnson LLP

(57) ABSTRACT

A planar mixed-metal perovskite solar cell can exhibit many favorable properties including high efficiencies and tunable electronic properties. The incorporation of different metal species (i.e. Co, Cu, Fe, Mg, Mn, Ni, Sn, Sr, and Zn) into the film is made possible by the solubility of either each metal's divalent acetate or halide compound in a solvent.

26 Claims, 75 Drawing Sheets

(56) References Cited

U.S. PATENT DOCUMENTS

2015/0249172 A1* 9/2015 Irwin ............... H01L 31/0324
                                                                             136/261
2016/0268510 A1* 9/2016 Moon ............... H01L 51/424

OTHER PUBLICATIONS

Bailie, C. D. et al., "Semi-transparent perovskite solar cells for tandems with silicon and CIGS," Energy Environ Sci 8, (2015) p. 956-963.

D. Bi, et al. "Efficient luminescent solar cells based on tailored mixed-cation perovskites," Sci. Adv., (2016) p. 1-7.

Boix, P. P., et al., "Perovskite Solar Cells: Beyond Methylammonium Lead Iodide," J. Phys. Chem. Left. 6, (2015) p. 898-907.

Cortecchia, D., et al. "Lead-Free $MA_2CuCl_xBr_{4-x}$ Hybrid Perovskites," Inorg. Chem., 55, (2016) p. 1044-1052.

Cui, X-P., et al., "Cupric bromide hybrid perovskite heterojunction solar cells," Synth. Met., 209, (2015) p. 247-250.

Dualeh, A., et al. "Thermal Behavior of Methylammonium Lead-Trihalide Perovskite Photovoltaic Light Harvesters," Chem. Mater. 26, (2014) p. 6160-6164.

Eperon, G. E., et al., "Formamidinium lead trihalidae: a broadly tunable perovskite for efficient planar heterojunction solar cell," Energy Environ. Sci., 7, (2014) p. 982-988.

Eperon, G. E., et al. "Inorganic caesium lead iodide perovskite solar cells," J Mater Chem A, 3 (2015) p. 19688-19695.

Eperon, G. E., et al., "Neutral Color Semitransparent Microstructured Perovskite Solar Cells," ACS Nano 8, (2014) p. 591-598.

Hao, F., et al. "Anomalous Band Gap Behavior in Mixed Sn and Pb Perovskites Enable Broadening of Absorption Spectrum in Solar Cell," J. Am. Chem. Soc., 136 (2014) p. 8094-8099.

Hao, F., et al., "Lead-free solid-state organic-inorganic halide perovskite solar cells," Nat. Photonics, 8 (2014) p. 489-494.

National Renewable Energy Laboratories (NREL) Efficiency Chart, Rev. Mar. 9, 2016.

Heo, J. H., et al., "Hysteresis-less inverted $CH_3NH_3PbI_3$ planar perovskite hybrid solar cells with 18.1% power conversion efficiency," Energy Env. Sci, 8, (2015) p. 1602-1608.

Kojima, A., et al., "Organometal Halide Perovskites as Visible-Light Sensitizers of Photovoltaic Cells," J. Am. Chem. Soc., 131 (2009) p. 6050-6051.

Kulkarni, S. A. et al., "Band-gap tuning of lead halide perovskites using a sequential deposition process," J Mater Chem A 2, (2014) p. 9221-9225.

Krishnamoorthy, T. et al. "Lead-free germanium iodide perovskite materials for photovoltaic applications," J Mater Chem A 3, (2015) p. 23829-23832.

Lee, J.-W., et al., "Formamidinium and Cesium Hybridization for Photo- and Mositure-Stable Perovskite Solar Cell," Adv. Energy Mater. 5 (2015) p. 1-9.

Li, X., et al. "Outdoor Performance and Stability under Elevated Temperatures and Long-Term Light Soaking of Triple-Layer Mesoporous Perovskite Photovoltaics," Energy Technol., 3 (2015) p. 551-555.

Löper, P., et al., "Organic-inorganic halide perovskite/crystalline silicon four-terminal tandem solar cells," Phys Chem Chem Phys 17, (2015) p. 1619-1629.

Mailoa, J. P., et al., "A 2-terminal perovskite/silicon multijunction solar cell enabled by a silicon tunnel junction," Appl. Phys. Lett. 106 (2015).

McMeekin, D. P., et al., "A mixed-cation lead mixed-halide perovskite absorber for tandem solar cells," Science 351 (2016) p. 151-155.

Mitzi, D. B., et al. "Organic-inorganic electronics," IBM J. Res. Dev. 45, (2001) p. 29-45.

National Renewable Energy Laboratories (NREL) Efficiency Chart (2015).

Noel, N. K., et al. "Lead-Free Organic-Inorganic Tin Halide Perovskites for Photovoltaic Applications," Energy Environ. Sci., (2014) p. 3061-3068.

Noh, J. H., et al., "Chemical Management for Colorful, Efficient, and Stable Inorganic-Organic Hybrid Nanostructured Solar Cells," Nano Lett. (2013) p. 1764-1769.

Ogomi, Y. et al., "$CH_3NH_3Sn_xPb(1-x)I_3$ Perovskite Solar Cells Covering up to 1060 nm," J. Phys. Chem. Lett. 5 (2014) p. 1004-1011.

Pathak, S., et al., "Perovskite Crystals for Tunable White Light Emissions," Chem. Mater, 27, (2015) p. 8066-8075.

Saliba, M., et al., "Cesium-containing triple cation perovskite solar cells: improved stability, reproducibility and high efficiency," Energy Environ. Sci., (2016) p. 1989-1997.

Semary, M.A., M. F. Mostafa and M. A. Ahmed, "Magnetic Susceptibility of $(CH_3NH_3)_2FeCl_3Br$ : An example of a Canted Spin System," Solid State Commun., 25 (1978) p. 443-445.

Serrano-Lujan, L. et al., "Tin- and Lead-Based Perovskite Solar Cells under Scrutiny: An Environmental Perspective," Adv. Energy Mater. 5 (2015).

Snaith, H. J., "Perovskites: The Emergence of a New Era for Low-Cost, High-Efficiency Solar Cells," J. Phys. Chem. Lett. 4, 2013) p. 3623-3630.

Stoumpos, C. C., et al., "Semiconducting Tin and Lead Iodide Perovskites with Organic Cations: Phase Transitions, High Mobilities, and Near-Infrared Photoluminescent Preoperties," Inorg. Chem., 52 (2013) p. 9019-9038.

Stoumpos, C. C., et al., "Hybrid Germanium Iodide Perovskite Semiconductors: Active Lone Pairs, Structural Distortions, Direct and Indirect Energy Gaps, and Strong Nonlinear Optical Properties," J. Am. Chem. Soc. 137, (2015) p. 6804-6819.

Stranks, S. D., et al., "Metal-halide perovskites for photovoltaic and light-emitting devices," Nat. Nanotechnol. 10 2015) p. 391-402.

Stranks, S. D. , "Electron-Hole Diffusion Lengths Exceeding 1 Micrometer in an Organometal Trihalide Perovskite Absorber," Science, 342 (2013) p. 341-344.

Sutton, R. J., et al., "Bandgap-Tunable Cesium Lead Halide Perovskites with High Thermal Stability for Efficient Solar Cells," Adv. Energy Mater., (2016).

Xiao, Z., et al. "Efficient, high yield perovskite photovoltaic devices grown by interdiffusion of solution-processed precursor stacking layers," Energy Environ. Sci., 7 (2014) p. 2619-2623.

Yi, C., et al., "Entropic stabilization of mixed A-cation $ABX_3$ metal halide perovskites for high performance perovskite solar cells," Energy Environ. Sci., 9 (2016) p. 656-662.

Zhang, W., et al., "Ultrasmooth organic-inorganic perovskite thin-film formation and crystallization for efficient planar heterojunction solar cells," Nat. Commun., 6 (2015).

Zuo, F., et al., "Binary-Metal Perovskites Toward High-Performace Planar-Heterojunction Hybrid Solar Cells," Adv. Mater., 26 (2014) p. 6454-6460.

International Search Report dated Dec. 28, 2016, issued in International Application No. PCT/US2016/047648.

Written Opinion of the International Searching Authority dated Dec. 28, 2016, issued in International Application No. PCT/US2016/047648.

Notification of Transmittal of The International Search Report and The Written Opinion of the International Searching Authority, or The Declaration dated Dec. 28, 2016, issued in International Application No. PCT/US2016/047648.

Navas J. et al., "New insights into organic?inorganic hybrid perovskite $CH_3NH_3PbI_3$ nanoparticles. An experimental and theoretical study of doping in $Pb^{2+}$ sites with $Sn^{2+}$, $Sr^{2+}$, $Cd^{2+}$ and $Ca^{2+}$", Nanoscale [online], Feb. 26, 2015 (Feb. 26, 2015) [retrieved on Oct. 14, 2016], vol. 7, issue 14, retrieved from the internet:<DOI: 10.1039/C5NR00041F>, pp. 6216-6229; see entire document, especially p. 6216-6217 and 6219.

* cited by examiner

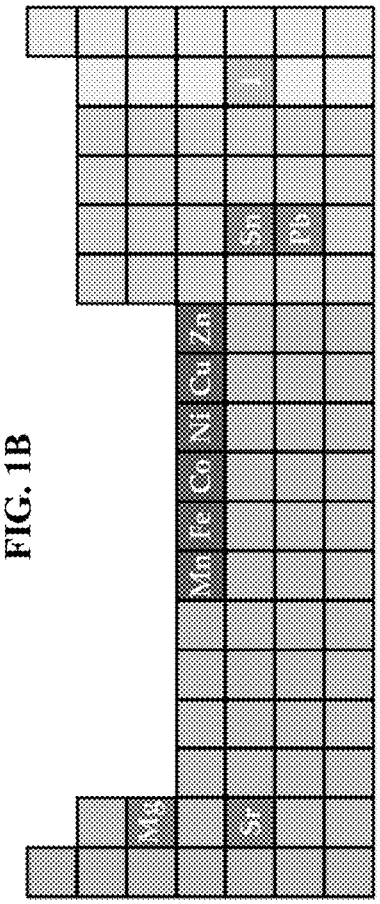
FIG. 1B
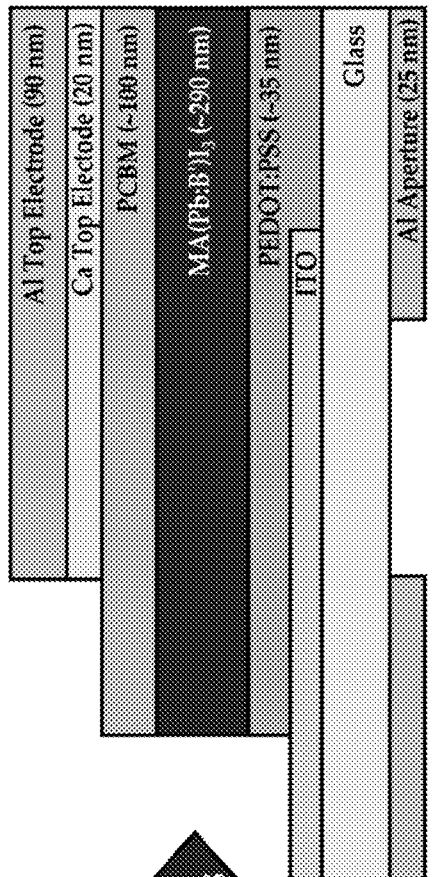
FIG. 1C
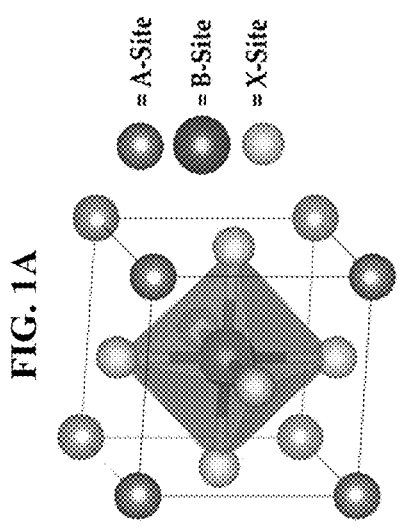
FIG. 1A
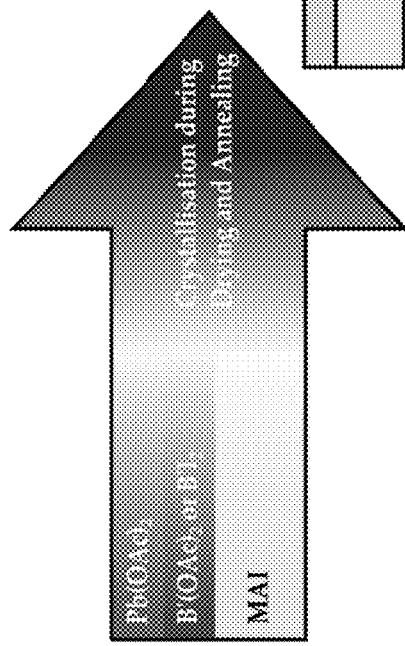

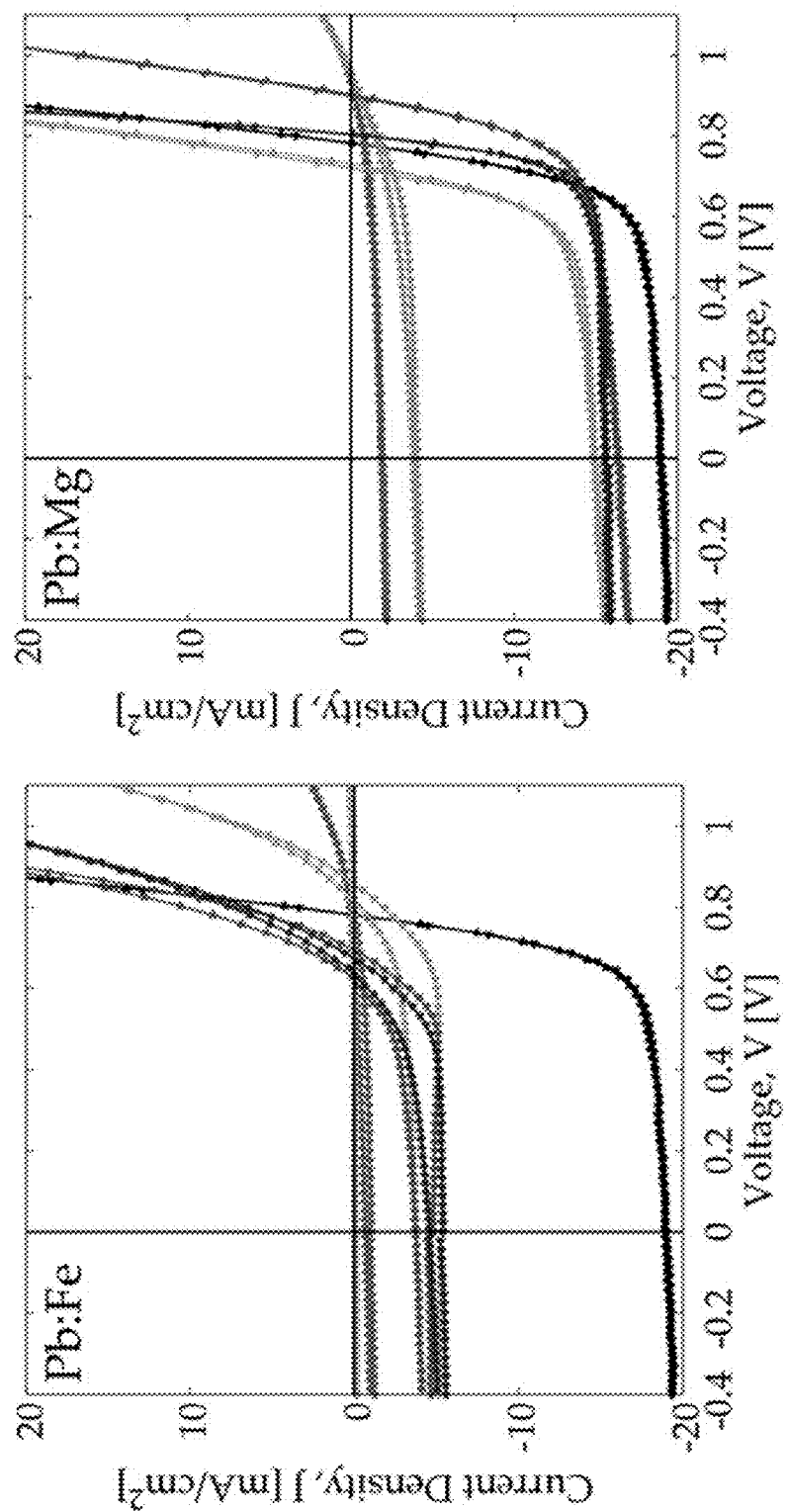

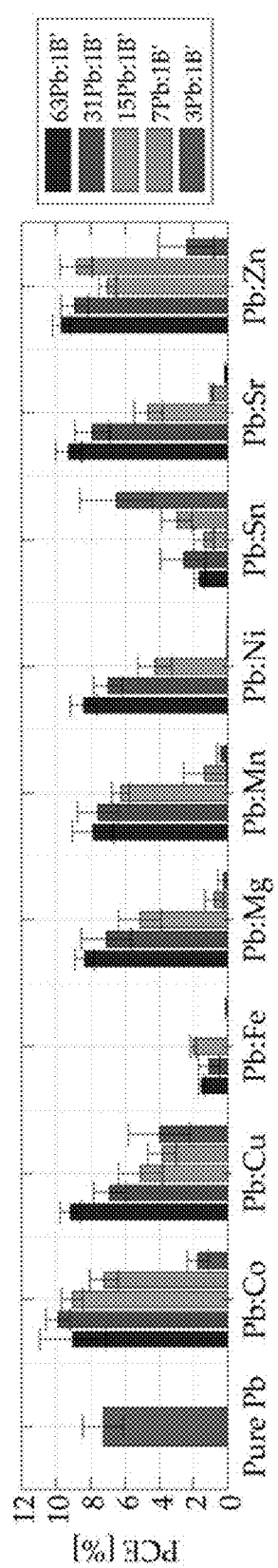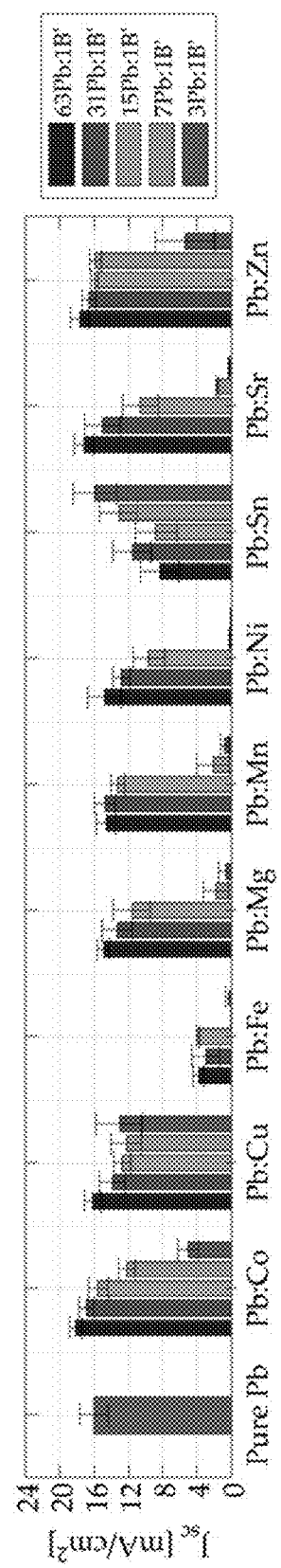
FIG. 3A
FIG. 3B

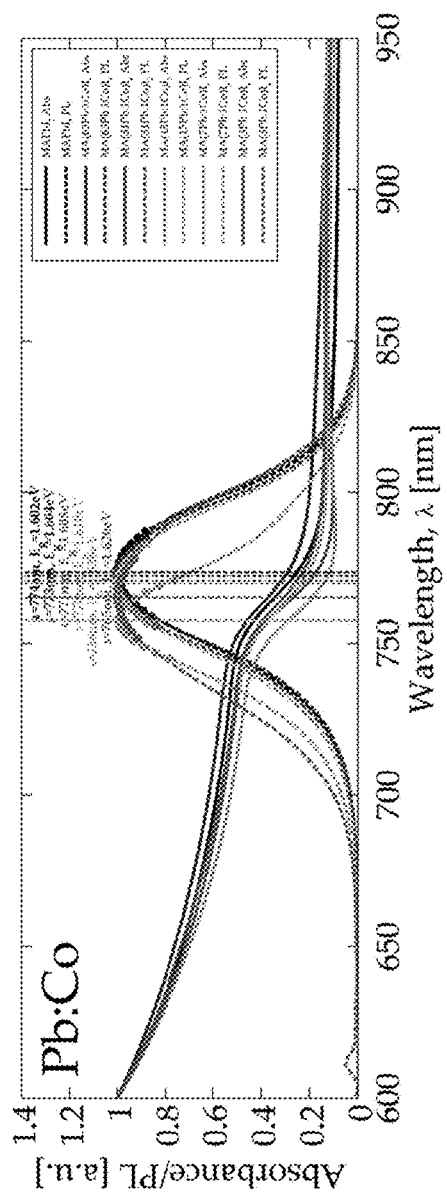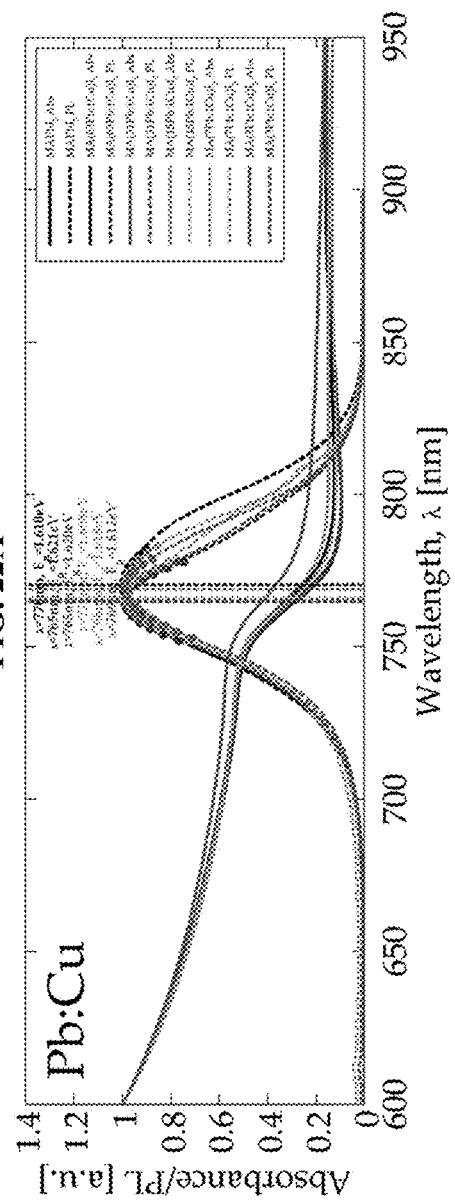
FIG. 22A
FIG. 22B

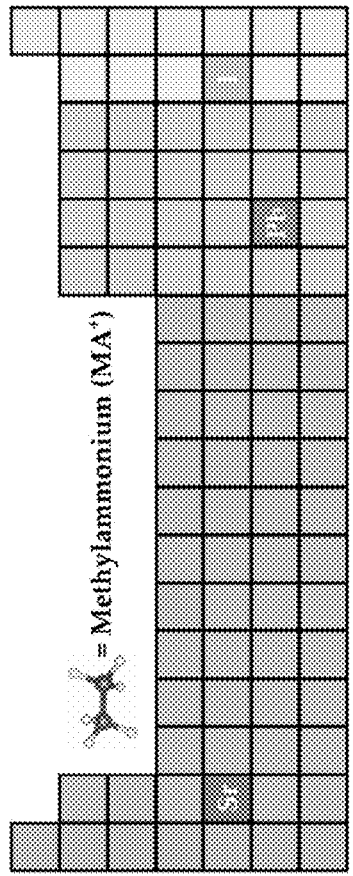
FIG. 43B
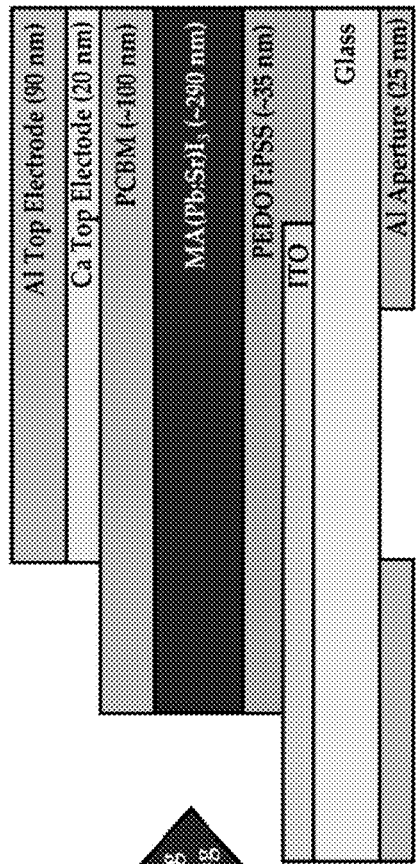
FIG. 43C
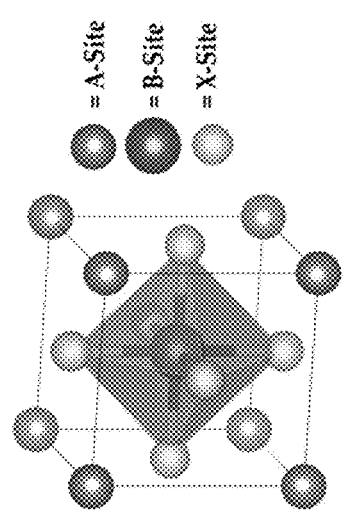
FIG. 43A
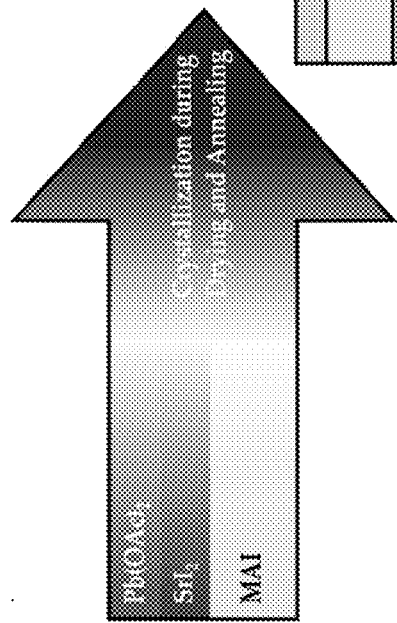

PLANAR MIXED-METAL PEROVSKITES FOR OPTOELECTRONIC APPLICATIONS

CLAIM OF PRIORITY

This application claims the benefit of prior U.S. Provisional Application No. 62/206,399 filed on Aug. 18, 2015, which is incorporated by reference in its entirety.

TECHNICAL FIELD

This invention relates to perovskite materials and optoelectronic devices including the perovskite materials.

BACKGROUND

Unlike the crystalline silicon that currently dominates the photovoltaic market, lead halide perovskite materials are flexible, lightweight, processable at low temperatures, and display a wide variety of colors and degrees of transparency. These attributes open new opportunities to integrate solar power creatively and inexpensively into new markets such as electric vehicles and architecture, as well as augment the performance of current solar technology in tandem cell configurations. Recent advances in the efficiency of lead-based perovskite photovoltaics towards the 25% achievable by record-setting crystalline silicon solar cells have been fueled by tailoring the composition of the organic and halide ions in the material. While this approach of compositional engineering has yielded materials that display a wide array of material properties, it remains largely unknown how replacing a portion of the lead content in perovskite films with alternative metal species impacts material properties and photovoltaic performance. This is relevant given that crystalline silicon is especially sensitive to metal impurities and requires intense fabrication procedures to produce high-purity material. By experimentally screening through a large set of mixed-metal perovskite compositions, the perovskite film is tolerant of many extrinsic metal species and that the electronic properties of the lead-based perovskites can be tuned and the photovoltaic performance even improved relative to the baseline material for several cases.

An emerging class of solar materials called metal-halide perovskites is poised to revolutionise the solar industry and disrupt the energy landscape by promising solar panels with both high-efficiency and reduced cost. Within the last 3 years, the PCE of perovskite solar cells has leapt from 3.8% to over 22% placing these materials within striking distance of the 25% achievable by champion c-Si devices. See, National Renewable Energy Laboratories (NREL) Efficiency Chart (2015), which is incorporated by reference in its entirety. Whereas c-Si is rigid, brittle, and requires costly, energy-intensive fabrication procedures, perovskites are a thousand times thinner, flexible, easily processed at low temperatures, and can display a wide variety of colours and degrees of transparency. See, Eperon, G. E. et al. Formamidinium lead trihalide: a broadly tunable perovskite for efficient planar heterojunction solar cells. *Energy Environ. Sci.* 7, 982 (2014), Hao, F., Stoumpos, C. C., Cao, D. H., Chang, R. P. H. & Kanatzidis, M. G. Lead-free solid-state organic-inorganic halide perovskite solar cells. *Nat. Photonics* (2014), Kulkarni, S. A. et al. Band-gap tuning of lead halide perovskites using a sequential deposition process. *J Mater Chem A* 2, 9221-9225 (2014), Noh, J. H., Im, S. H., Heo, J. H., Mandal, T. N. & Seok, S. I. Chemical Management for Colorful, Efficient, and Stable Inorganic-Organic Hybrid Nanostructured Solar Cells. *Nano Lett.* 130321112645008 (2013), Sutton, R. J. et al. Bandgap-Tunable Cesium Lead Halide Perovskites with High Thermal Stability for Efficient Solar Cells. *Adv. Energy Mater.* 1502458 (2016), McMeekin, D. P. et al. A mixed-cation lead mixed-halide perovskite absorber for tandem solar cells. *Science* 351, 151-155 (2016), Eperon, G. E., Burlakov, V. M., Goriely, A. & Snaith, H. J. Neutral Color Semitransparent Microstructured Perovskite Solar Cells. *ACS Nano* 8, 591-598 (2014), and Bailie, C. D. et al. Semi-transparent perovskite solar cells for tandems with silicon and CIGS. *Energy Env. Sci* 8, 956-963 (2015), each of which is incorporated by reference in its entirety. Furthermore, perovskites are solution-processable, which enables their manufacture with scalable, low-cost methods such as roll-to-roll and inkjet printing. See, Stranks, S. D. & Snaith, H. J. Metal-halide perovskites for photovoltaic and light-emitting devices. *Nat. Nanotechnol.* 10, 391-402 (2015), which is incorporated by reference in its entirety. These attributes open new opportunities to integrate solar power creatively and inexpensively into previously inaccessible markets, such as electric vehicles and buildings, as well as augment the performance of current photovoltaics by layering thin perovskite films atop c-Si in tandem configurations. See, Löper, P. et al. Organic-inorganic halide perovskite/crystalline silicon four-terminal tandem solar cells. *Phys Chem Chem Phys* 17, 1619-1629 (2015), and Mailoa, J. P. et al. A 2-terminal perovskite/silicon multijunction solar cell enabled by a silicon tunnel junction. *Appl. Phys. Lett.* 106, 121105 (2015), each of which is incorporated by reference in its entirety.

SUMMARY

In one aspect, a composition can include a perovskite material having the formula (I):

$$A'(Pb:B')X_3 \qquad (I)$$

wherein A' is an organic or inorganic cation, B' is a divalent metal cation, and X is a halide ion and B' replaces 0.5% to 50% of the Pb in the composition.

In another aspect, a structure, such as an electrooptical device, can include a hole transport layer, an electron transport layer, and a perovskite layer between the hole transport layer and the electron transport layer, wherein the perovskite layer includes a composition comprising:

a perovskite material having the formula (I):

$$A'(Pb:B')X_3 \qquad (I)$$

wherein A' is an organic or inorganic cation, B' is a divalent metal cation, and X is a halide ion and B' replace 0.5% to 50% of the Pb in the composition.

In certain circumstances, the A' can be methylammonium, ammonium, formamidimium, phosphonium or cesium.

In certain circumstances, the divalent metal cation can be an alkaline earth metal cation or a transition metal cation, for example, $Sr^{2+}$, $Co^{2+}$, $Cu^{2+}$, $Fe^{2+}$, $Mg^{2+}$, $Mn^{2+}$, $Ni^{2+}$, $Sn^{2+}$ or $Zn^{2+}$.

In certain circumstances, a ratio of $Pb:Sr^{2+}=15:1$. In certain circumstances, an amount of the B' can be between 1/64 and 1/4 of a total amount of the divalent metal cation. In certain circumstances, the B' can be $Co^{2+}$, $Cu^{2+}$, $Sr^{2+}$ or $Zn^{2+}$, and a ratio of Pb:B'=63:1; the B' can be $Mg^{2+}$, $Mn^{2+}$ or $Ni^{2+}$, and a ratio of Pb:B'=63:1; the B' can be $Co^{2+}$, $Cu^{2+}$, $Sr^{2+}$ or $Zn^{2+}$, and a ratio of Pb:B'=7:1; the B' can be $Co^{2+}$, $Cu^{2+}$, $Sn^{2+}$ or $Zn^{2+}$, and a ratio of Pb:B'=3:1.

In certain circumstances, the halide ion can be $I^-$, $Br^-$ or $Cl^-$.

In certain circumstances, a structure can include a patterned transparent electrode and a pattered top electrode wherein the electrode are outside of the hole transport layer, the electron transport layer and the perovskite layer. The hole transport layer can include PEDOT:PSS. The electron transport layer can include a fullerene derivative. A substrate can be outside of the patterned transparent electrode. The structure can include an evaporated aperturing mask outside of the substrate.

In another aspect, a solar cell can include the composition described above.

In another aspect, a method of manufacturing a structure can include preparing a solution including A'X, lead acetate (Pb(OAc)$_2$); and a divalent metal salt in a solvent, wherein A' is an organic or molecular cation and X is a halide ion, spin-coating the solution onto a hole transport layer, and crystallizing a perovskite film by drying and annealing the film.

In certain circumstances, the divalent metal salt can be a divalent metal acetate (B'(OAc)$_2$) or a divalent metal halide (B'X$_2$), wherein B' is a divalent metal cation, and X is a halide ion.

In certain circumstances, A'X can be methylammonium iodide (MAI). A molar ratio of MAI to a total metal salt content can be 3:1, wherein the total metal salt content includes the lead acetate (Pb(OAc)$_2$) and the divalent metal salt, for example, a strontium salt such as strontium acetate (Sr(OAc)$_2$) or SrX, wherein X is a halide ion. In certain circumstances, the solvent can include dimethylformamide (DMF).

In certain circumstances, the method can include spin-coating an electron transport layer and, optionally, depositing a top electrode material which can include, for example, Ca and Al. In certain circumstances, the method can include treating the hole transport layer with 1,8-diiodooctane (DIO) prior to spin-coating the solution onto the hole transport layer.

Other aspects, embodiments, and features will be apparent from the following description, the drawings, and the claims.

BRIEF DESCRIPTION OF THE DRAWINGS

FIG. 1A shows schematic of the ABX$_3$ perovskite crystal structure. FIG. 1B shows elements that are used as ions in the mixed-metal perovskite materials. FIG. 1C shows mixed-metal perovskite materials integrated into an inverted device architecture.

FIGS. 2A-2I show forward (right-pointing triangles) and reverse (left-pointing triangles) current-voltage characteristic scans measured from the best performing solar cell for each composition in each mixed-metal material set: Pb:Co (FIG. 2A), Pb:Cu (FIG. 2B), Pb:Fe(FIG. 2C), Pb:Mg (FIG. 2D), Pb:Mn (FIG. 2E), Pb:Ni (FIG. 2F), Pb:Sn (FIG. 2G), Pb:Sr (FIG. 2H), and Pb:Zn (FIG. 2I).

FIGS. 3A-3D show compiled average performance metrics of mixed-metal perovskite solar cells produced from mixed-metal films with each secondary metal species at five different molar ratios with Pb: power conversion efficiency, PCE (FIG. 3A); short-circuit current density, J$_{sc}$ (FIG. 3B); open-circuit voltage, V$_{oc}$ (FIG. 3C); and fill factor, FF (FIG. 3D). Average values and standard deviations for the error bars are calculated from at least 36 different solar cells, spanning at least two separate device batches.

FIG. 10A shows the compiled average performance metrics of the control devices. Error bars correspond to the standard deviation. FIGS. 10B-10C show forward and reverse current-voltage characteristic scans measured from the best performing solar cell for each control set. FIGS. 10D-10E show typical external quantum efficiency measurements for each solar cell control.

FIGS. 22A-22D show the normalized absorbance (solid lines) and photoluminescence emission (dotted lines) spectra of perovskite films from the following composition sets: Pb:Co (FIG. 22A), Pb:Cu (FIG. 22B), Pb:Fe (FIG. 22C), and Pb:Mg (FIG. 22D).

FIG. 43A shows schematic of the ABX$_3$ perovskite crystal structure. FIG. 43B shows ions that are used in the Pb:Sr mixed-metal perovskite materials. FIG. 43C shows mixed-metal perovskite materials are integrated into an inverted device architecture.

DETAILED DESCRIPTION

Figure 2B:
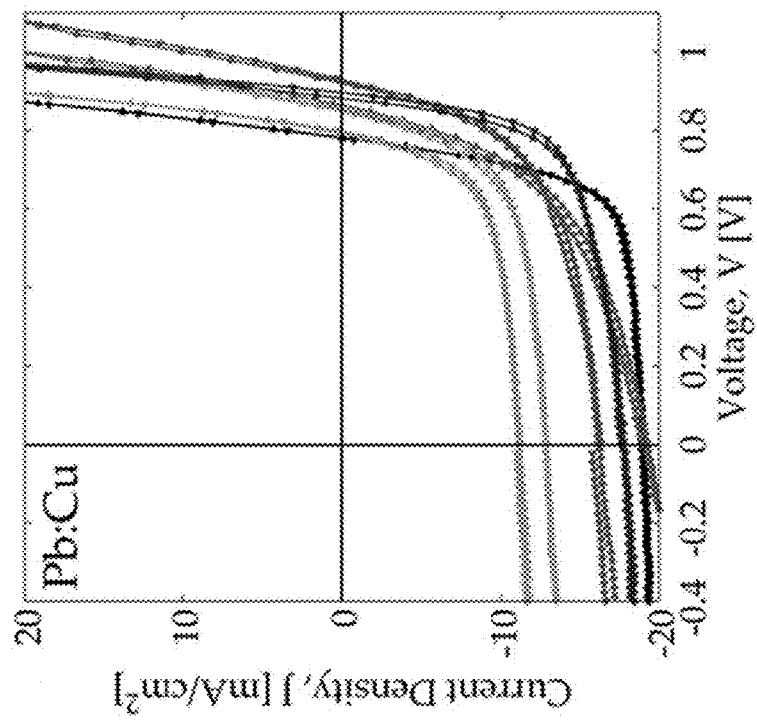
Figure 2A:
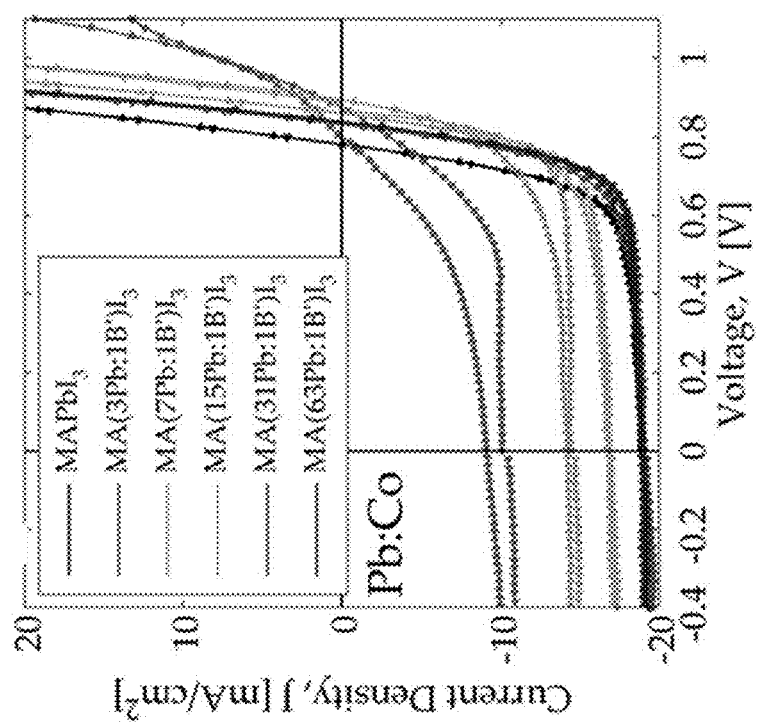
Figure 2F:
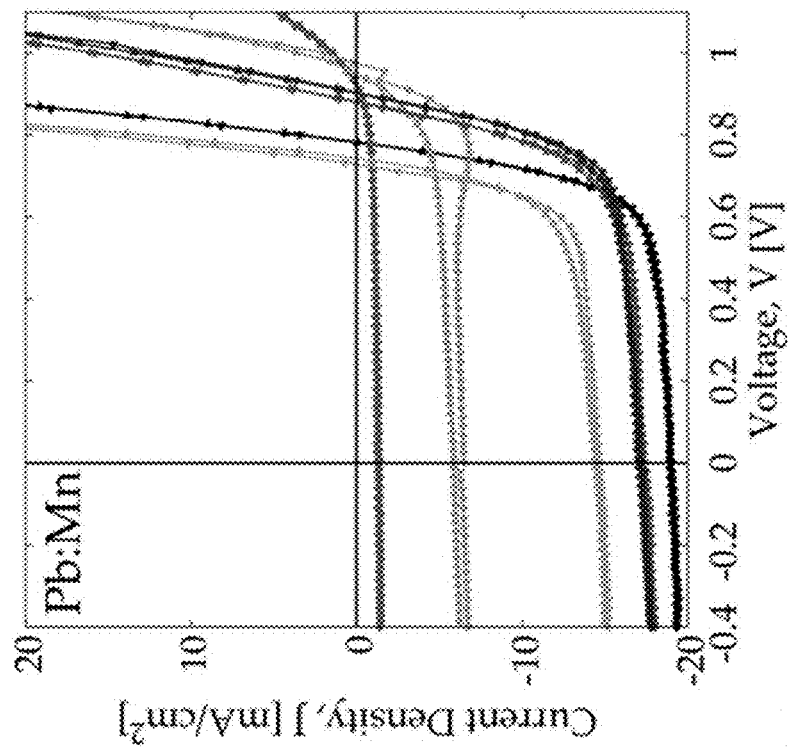
Figure 2E:
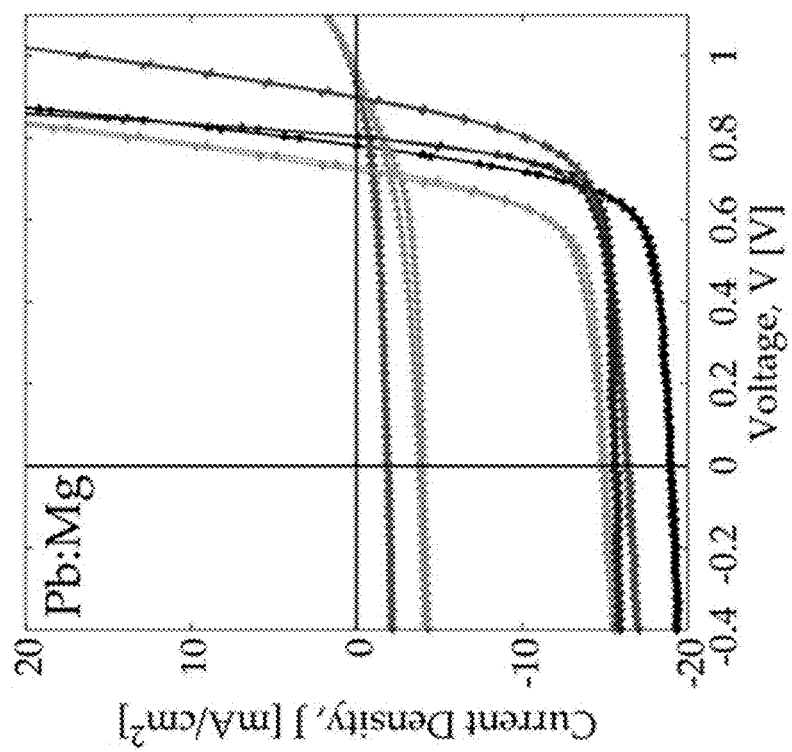
Figure 2H:
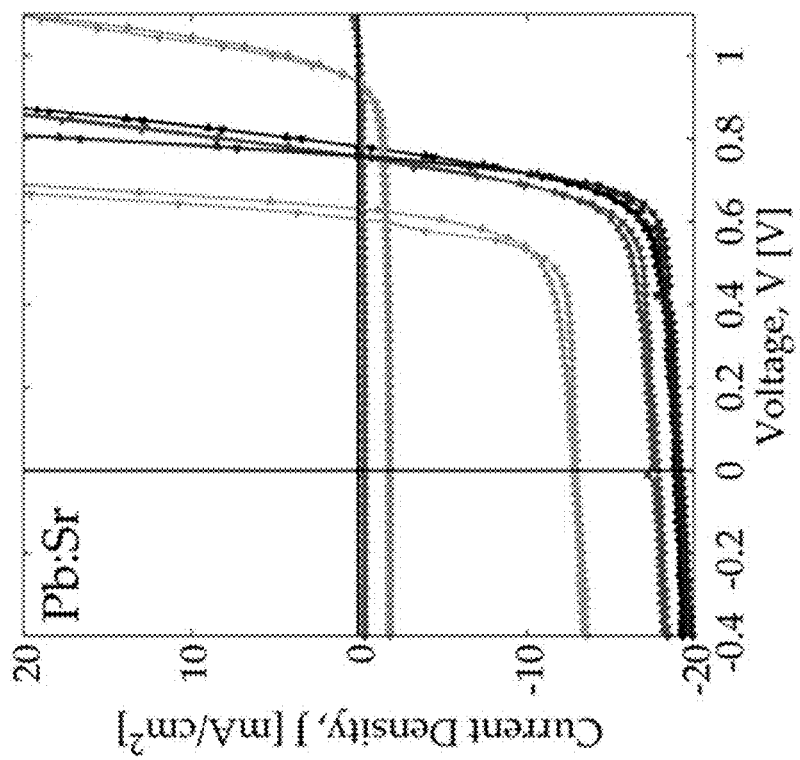
Figure 2G:
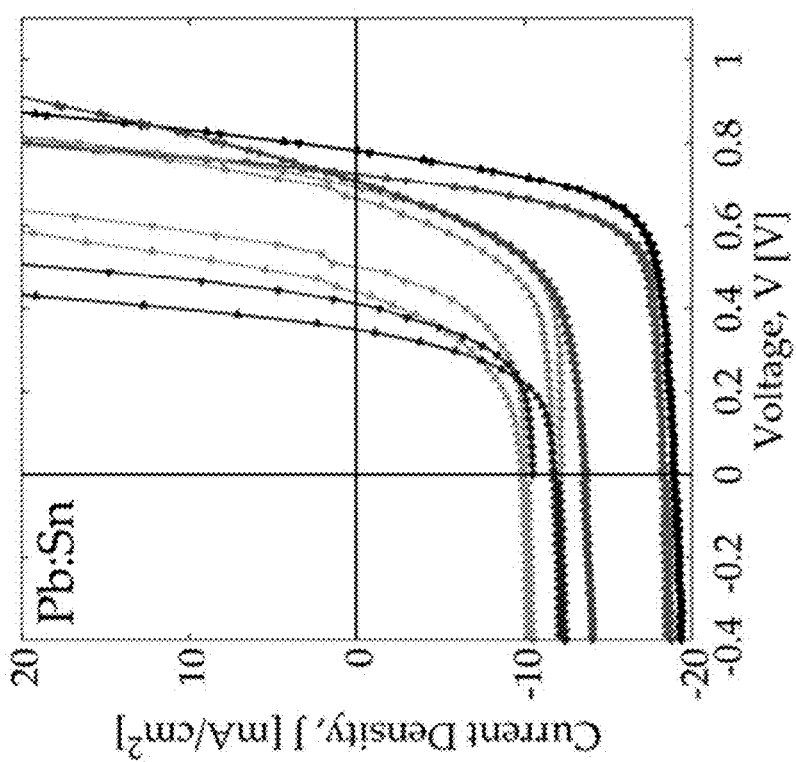
Figure 2I:
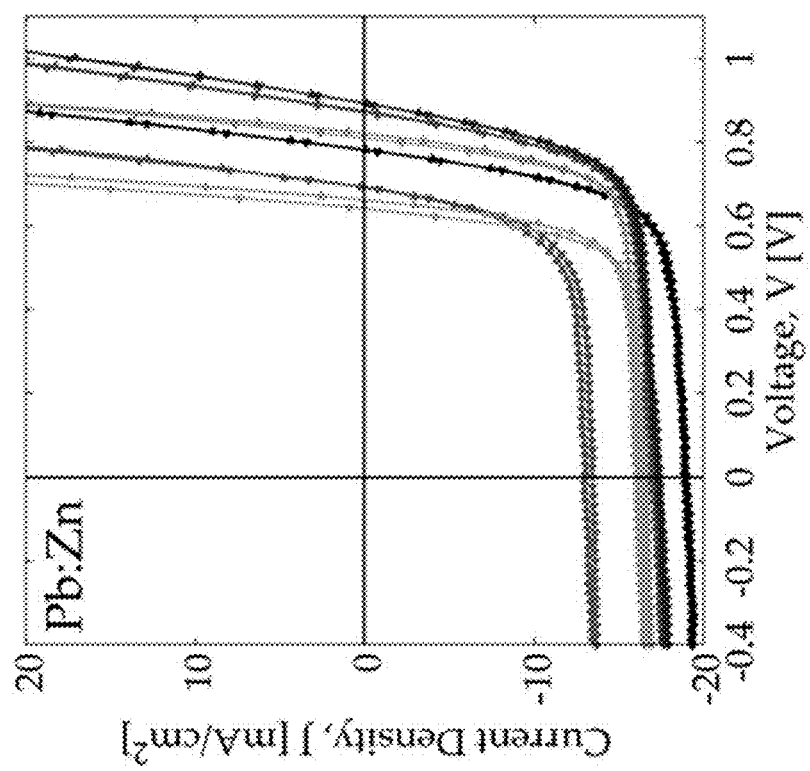

Aside from achieving power conversion efficiencies above 20%, one of the most attractive attributes of lead-based metal halide perovskites is that several important material properties can be tuned by adjusting their elemental composition. Exchanging halide anions modifies the material band gap, whereas exchanging organic cations improves the material stability. Yet it has remained largely unexplored how substituting a fraction of the lead ions in perovskite films with another metal species, especially those outside the Group IV elements, impacts their material properties and optoelectronic device performance. The optoelectronic device can be a photovoltaic device, a light emitting device, or a photosensitive device.

A composition can include a perovskite material having the formula (I)

A'(Pb:B')X$_3$     (I)

where A' is an organic or large inorganic cation (such as ammonium, methylammonium, formamidimium, phosphonium, cesium, etc.), B' is a divalent metal cation (such as Co$^{2+}$, Cu$^{2+}$, Fe$^{2+}$, Mg$^{2+}$, Mn$^{2+}$, Ni$^{2+}$, Sn$^{2+}$, Sr$^{2+}$, or Zn$^{2+}$), and X is a halide ion (such as I$^-$, Br$^-$, or Cl$^-$). The B' can replace 0.5% to 50%, 0.75% to 40%, 1% to 30%, or about 1% to 25% of the Pb in the composition.

A solar cell can include a hole transport layer, an electron transport layer; and a perovskite layer between the hole transport layer and the electron transport layer, wherein the perovskite layer includes a composition comprising a perovskite material having the formula (I).

A method of manufacturing a solar cell can include preparing a solution including A'X, lead acetate (Pb(OAc)$_2$)

and a divalent metal salt in a solvent, wherein A' is an organic or inorganic cation and X is a halide ion, spin-coating the solution onto a hole transport layer and crystallizing a perovskite film by drying and annealing the film. Alternatively, the perovskite film can be built on an electron transport layer, for example, titanium dioxide or tin oxide, and a a hole transport layer can be deposited on top of the perovskite film.

In certain embodiments, a composition can include methylammonium lead triiodide ($MAPbI_3$) perovskite film where a portion of the Pb content is replaced with various alternative divalent metal species, such as Co, Cu, Fe, Mg, Mn, Ni, Sn, Sr, and Zn. An experimental screening study is presented where between 1.6% and 25% of the Pb in methylammonium lead triiodide ($MAPbI_3$) perovskite films is systematically replaced with nine different alternative, divalent metal species to form methylammonium mixed-metal triiodide perovskite film embodiments, denoted as $MA(Pb:B')I_3$ where B'={Co, Cu, Fe, Mg, Mn, Ni, Sn, Sr, and Zn}. The tolerance of the $MAPbI_3$ material was empirically assessed to extrinsic metal species by experimentally evaluating how replacing various amounts of Pb with this set of transition and alkaline earth metals influences photovoltaic performance relative to the pure Pb baseline. The findings indicate that the perovskite material is tolerant to most metal species with Co, Cu, Sr, and Zn yielding devices with notable improvements in relative photovoltaic performance. Characterization of the mixed-metal perovskite materials reveals that introducing certain secondary metal species influences film morphology, modifies the material band gap, shifts the Fermi and band edge energies, and impacts photoluminescence properties. Therefore, adjusting the metal composition of perovskite materials offers new opportunities to tune the electronic properties of next-generation optoelectronic devices.

The rapid rise in performance of lead-based metal halide perovskite solar cells over the past five years from an initial 3.8% efficiency to a recent value of 22.1% places this nascent class of materials on par with other commercial solar materials such as crystalline silicon (c-Si), cadmium telluride (CdTe), and copper indium gallium selenide (CIGS). See, A. Kojima, K. Teshima, Y. Shirai and T. Miyasaka, *J. Am. Chem. Soc.,* 2009, 131, 6050-6051, National Renewable Energy Laboratories (NREL) Efficiency Chart, Rev. Mar. 9, 2016, and S. D. Stranks and H. J. Snaith, *Nat. Nanotechnol.,* 2015, 10, 391-402, each of which is incorporated by reference in its entirety. This achievement coupled with initial reports demonstrating little to no performance degradation over extended outdoor testing indicates that perovskite devices are quickly approaching a maturity level ripe for commercialization. See, X. Li, M. Tschumi, H. Han, S. S. Babkair, R. A. Alzubaydi, A. A. Ansari, S. S. Habib, M. K. Nazeeruddin, S. M. Zakeeruddin and M. Grätzel, *Energy Technol.,* 2015, 3, 551-555, which is incorporated by reference in its entirety. An attractive feature of metal halide perovskites is that key material properties can be tailored by engineering the ionic composition of the $ABX_3$ lattice (FIG. 1A). For instance, the band gap of perovskite materials can be tuned throughout a significant portion of the visible and near-infrared spectrum with mixed-halide systems that vary the content at the X-site. See, G. E. Eperon, S. D. Stranks, C. Menelaou, M. B. Johnston, L. M. Herz and H. J. Snaith, *Energy Environ. Sci.,* 2014, 7, 982., F. Hao, C. C. Stoumpos, D. H. Cao, R. P. H. Chang and M. G. Kanatzidis, *Nat. Photonics,* 2014, 8, 489-494, S. A. Kulkarni, T. Baikie, P. P. Boix, N. Yantara, N. Mathews and S. Mhaisalkar, *J Mater Chem A,* 2014, 2, 9221-9225, J. H. Noh, S. H. Im, J. H. Heo, T. N. Mandal and S. I. Seok, *Nano Lett.,* 2013, 130321112645008, R. J. Sutton, G. E. Eperon, L. Miranda, E. S. Parrott, B. A. Kamino, J. B. Patel, M. T. Hörantner, M. B. Johnston, A. A. Haghighirad, D. T. Moore and H. J. Snaith, *Adv. Energy Mater.,* 2016, 1502458, D. P. McMeekin, G. Sadoughi, W. Rehman, G. E. Eperon, M. Saliba, M. T. HÃ¶rantner, A. Haghighirad, N. Sakai, L. Korte, B. Rech, M. B. Johnston, L. M. Herz and H. J. Snaith, *Science,* 2016, 351, 151-155, and S. Pathak, N. Sakai, F. Wisnivesky Rocca Rivarola, S. D. Stranks, J. Liu, G. E. Eperon, C. Ducati, K. Wojciechowski, J. T. Griffiths, A. A. Haghighirad, A. Pellaroque, R. H. Friend and H. J. Snaith, *Chem. Mater.,* 2015, 27, 8066-8075, each of which is incorporated by reference in its entirety.

This affords the opportunity to develop even higher efficiency multi-junction solar cells based on stacks of multiple perovskite materials or the pairing of perovskites with current solar technologies such as c-Si or CIGS. See, C. D. Bailie, M. G. Christoforo, J. P. Mailoa, A. R. Bowring, E. L. Unger, W. H. Nguyen, J. Burschka, N. Pellet, J. Z. Lee, M. Grätzel, R. Noufi, T. Buonassisi, A. Salleo and M. D. McGehee, *Energy Env. Sci,* 2015, 8, 956-963, P. Löper, S.-J. Moon, S. Martin de Nicolas, B. Niesen, M. Ledinsky, S. Nicolay, J. Bailat, J.-H. Yum, S. De Wolf and C. Ballif, *Phys Chem Chem Phys,* 2015, 17, 1619-1629, and J. P. Mai*loa*, C. D. Bailie, E. C. Johlin, E. T. Hoke, A. J. Akey, W. H. Nguyen, M. D. McGehee and T. Buonassisi, *Appl. Phys. Lett.,* 2015, 106, 121105, each of which is incorporated by reference in its entirety. Likewise, the thermal stability and photo-stability of lead-based perovskites can be improved by exchanging the conventional methylammonium cation at the A-site of the perovskite lattice with formamidinium, cesium, or mixtures of these. See, G. E. Eperon, S. D. Stranks, C. Menelaou, M. B. Johnston, L. M. Herz and H. J. Snaith, *Energy Environ. Sci.,* 2014, 7, 982, G. E. Eperon, G. M. Paterno, R. J. Sutton, A. Zampetti, A. A. Haghighirad, F. Cacialli and H. J. Snaith, *J Mater Chem A,* 2015, 3, 19688-19695, D. P. McMeekin, G. Sadoughi, W. Rehman, G. E. Eperon, M. Saliba, M. T. Hoerantner, A. Haghighirad, N. Sakai, L. Korte, B. Rech, M. B. Johnston, L. M. Herz and H. J. Snaith, *Science,* 2016, 351, 151-155, C. Yi, J. Luo, S. Meloni, A. Boziki, N. Ashari-Astani, C. Gratzel, S. M. Zakeeruddin, U. Rothlisberger and M. Gratzel, *Energy Environ. Sci.,* 2016, 9, 656-662, J.-W. Lee, D.-H. Kim, H.-S. Kim, S.-W. Seo, S. M. Cho and N.-G. Park, *Adv. Energy Mater.,* 2015, 5, and M. Saliba, T. Matsui, J.-Y. Seo, K. Domanski, J.-P. Correa-Baena, N. Mohammad K., S. M. Zakeeruddin, W. Tress, A. Abate, A. Hagfeldt and M. Gratzel, *Energy Environ. Sci.,* 2016, each of which is incorporated by reference in its entirety. This approach of compositional engineering has produced perovskites devices with remarkably high efficiencies by blending ions at both the A-site and X-site to form mixed-cation lead mixed-halide materials. See, D. P. McMeekin, G. Sadoughi, W. Rehman, G. E. Eperon, M. Saliba, M. T. Hoerantner, A. Haghighirad, N. Sakai, L. Korte, B. Rech, M. B. Johnston, L. M. Herz and H. J. Snaith, *Science,* 2016, 351, 151-155, M. Saliba, T. Matsui, J.-Y. Seo, K. Domanski, J.-P. Correa-Baena, N. Mohammad K., S. M. Zakeeruddin, W. Tress, A. Abate, A. Hagfeldt and M. Gratzel, *Energy Environ. Sci.,* 2016, and D. Bi, W. Tress, M. I. Dar, P. Gao, J. Luo, C. Renevier, K. Schenk, A. Abate, F. Giordano, J.-P. Correa Baena, J.-D. Decoppet, S. M. Zakeeruddin, M. K. Nazeeruddin, M. Graetzel and A. Hagfeldt, *Sci. Adv.,* 2016, 2, each of which is incorporated by reference in its entirety. In contrast, mixed-metal perovskite compositions that replace a portion of the Pb-content with a secondary metal species remain largely unexplored, even though they provide one possible pathway towards reducing the inherent toxicity of the perovskite material.

The construction of lead-based mixed-metal halide perovskite crystals requires that all B-site metal cations in the $ABX_3$ crystal lattice be divalent. To date, only Sn has been successfully blended with Pb, which has the effect of narrowing the material band gap. See, F. Hao, C. C. Stoumpos, R. P. H. Chang and M. G. Kanatzidis, *J. Am. Chem. Soc.*, 2014, 136, 8094-8099, which is incorporated by reference in its entirety. These mixed-metal Pb:Sn perovskites have achieved efficiencies up to 9.8% in an inverted device architecture and 7.4% in a conventional device architecture, with molar metal ratios of 17Pb:3Sn and 3Pb:1Sn, respectively. See, F. Zuo, S. T. Williams, P.-W. Liang, C.-C. Chueh, C.-Y. Liao and A. K.-Y. Jen, *Adv. Mater.*, 2014, 26, 6454-6460, and F. Hao, C. C. Stoumpos, D. H. Cao, R. P. H. Chang and M. G. Kanatzidis, *Nat. Photonics*, 2014, 8, 489-494, each of which is incorporated by reference in its entirety. However, one of the major drawbacks of Sn is that $Sn^{2+}$ readily oxidizes to $Sn^{4+}$ upon exposure to air, which causes the perovskite to destabilize into multiple phases, thereby damaging photovoltaic performance. See, N. K. Noel, S. D. Stranks, A. Abate, C. Wehrenfennig, S. Guarnera, A. Haghighirad, A. Sadhanala, G. E. Eperon, S. K. Pathak, M. B. Johnston, A. Petrozza, L. Herz and H. Snaith, *Energy Environ. Sci.*, 2014, which is incorporated by reference in its entirety. Furthermore, a recent toxicology study reveals that Sn-based perovskites also pose serious health risk through environmental acidification that arises during degradation. See, A. Babayigit, D. Duy Thanh, A. Ethiraj an, J. Manca, M. Muller, H.-G. Boyen and B. Conings, *Sci. Rep.*, 2016, 6, 18721, which is incorporated by reference in its entirety. Therefore, it remains an attractive pursuit to identify alternative metal species that are capable of tuning the material properties of the perovskite and preserving the excellent photovoltaic properties without exacerbating the stability or toxicity of the inherent material. As is indicated by FIG. 1B, many of the alkaline earth and transition metals can achieve a divalent oxidation state and are compatible with solution-processing, which makes them also suitable candidate species for generating new mixed-metal perovskite compositions.

Although the properties of perovskites are indeed remarkable, there remain two critical issues that must be addressed to secure future commercialization of the technology: (1) the best perovskite materials to date contain lead (Pb), a toxic element. Therefore, it is highly desirable to find non-toxic compositions that achieve similar photovoltaic performance; and (2) most perovskites are sensitive to moisture and elevated temperatures, which raise concerns over device degradation in the field. Strategies are needed that ensure performance stability and longevity.

The toxicity of perovskite materials is compounded by their solubility in water. See, Babayigit, A. et al. Assessing the toxicity of Pb- and Sn-based perovskite solar cells in model organism *Danio rerio*. *Sci. Rep.* 6, 18721 (2016), which is incorporated by reference in its entirety. While encapsulation techniques could minimise environmental impact during operation and end-of-life lead recovery processes could dramatically reduce human and marine health risks (see, Serrano-Luj an, L. et al. Tin- and Lead-Based Perovskite Solar Cells under Scrutiny: An Environmental Perspective. *Adv. Energy Mater.* 5, 1501119 (2015), which is incorporated by reference in its entirety), the identification of less-toxic perovskite materials that retain the excellent photovoltaic properties of their pure-lead counterparts remains an attractive pursuit.

Likewise, the long-term stability of lead-based perovskites during operation remains an open question that requires further investigation, although initial efforts seem promising. See, Li, X. et al. Outdoor Performance and Stability under Elevated Temperatures and Long-Term Light Soaking of Triple-Layer Mesoporous Perovskite Photovoltaics. *Energy Technol.* (2015), which is incorporated by reference in its entirety.

The method and composition disclosed herein can simultaneously mitigate the toxicity and instability of the perovskite materials by introducing a second less-toxic metal species into the perovskite film, demonstrating the tolerance of the lead-based perovskite film to other metal species. By replacing small, but not insignificant, amounts of the lead content with a second metal species, it was estimated that the $MAPbI_3$ lattice might be tolerant of the extrinsic species and that the excellent electronic properties of the lead-based perovskite might be perturbed but not completely disrupted, allowing for efficient or even improved photovoltaic performance. Likewise, a perovskite film that has been extrinsically doped with a second divalent metal ion species or the formation of a second material phase in the film might improve material stability by either inhibiting ion migration during operation or by mitigating degradation in humid environments. In order to determine how tolerant device performance of mixed-metal perovskite solar cells is to increasing levels of lead replacement, devices were constructed from solutions containing lead acetate ($Pb(OAc)_2$) and methylammonium iodide (MAI) precursors as well as a second divalent metal compound ($B'(OAc)_2$ or $B'I_2$).

To explore the opportunities available with alternative mixed-metal perovskite compositions, between 1.6% and 25% of the Pb-content has been replaced with a second less-toxic divalent metal species to form methylammonium mixed-metal triiodide films, denoted here as $MA(Pb:B')I_3$ where B'={Co, Cu, Fe, Mg, Mn, Ni, Sn, Sr, and Zn}. Some of these elements, such as Cu and Fe, have been used in two-dimensional (2D) layered perovskite structures and three-dimensional (3D) See, P. P. Boix, S. Agarwala, T. M. Koh, N. Mathews and S. G. Mhaisalkar, *J. Phys. Chem. Lett.*, 2015, 6, 898-907, X.-P. Cui, K.-J. Jiang, J.-H. Huang, Q.-Q. Zhang, M.-J. Su, L.-M. Yang, Y.-L. Song and X.-Q. Zhou, *Synth. Met.*, 2015, 209, 247-250, D. Cortecchia, H. A. Dewi, J. Yin, A. Bruno, S. Chen, T. Baikie, P. P. Boix, M. Grätzel, S. Mhaisalkar, C. Soci and N. Mathews, *Inorg. Chem.*, 2016, 55, 1044-1052, M. A. Semary, M. F. Mostafa and M. A. Ahmed, *Solid State Commun.*, 1978, 25, 443-445, each of which is incorporated by reference in its entirety. However, this is the first report that systematically replaces a fraction of the Pb content in 3D perovskite films with several other divalent transition or alkaline earth metal and constructs functioning solar cells with the mixed-metal materials. Experimental screen through this large set of alternative metals and benchmarking mixed-metal perovskites against the $MAPbI_3$ baseline material enables (1) investigation of how tolerant the photovoltaic performance of $MAPbI_3$ devices is to the introduction of a second metal species, (2) identification of new candidates that might reduce the Pb-content of the perovskite films without sacrificing device efficiency, and (3) characterization of the material and electronic properties of the mixed-metal perovskite films to elucidate the mechanisms responsible for improvements in relative performance. By systematically replacing different amounts of the lead content with a secondary metal species, the MAPbI$_3$ lattice is tolerant of many extrinsic species and that the excellent electronic properties of the lead-based perovskite are perturbed but not completely disrupted, allowing certain compositions to generate improvements in relative photovoltaic performance. Specifically, (1) device performance can often be improved upon modest levels of replacement, with a 63Pb:1Co molar ratio yielding the champion performance, (2) devices with power conversion efficiency exceeding the average baseline efficiency for MAPbI$_3$ can be achieved with metal compositions of 7Pb:1Zn, 3Pb:1Sn, or 3Pb:1Cu, and (3) introducing Co into the MAPbI$_3$ material shifts the Fermi and band edge energies without modifying the material band gap, thereby providing a new route to tailoring the interfacial energetics of the perovskite. These findings suggest that mixing metals provides a new dimension for tuning the electronic properties of perovskite materials.

As shown in FIG. 1C, the perovskite solar cells can be fabricated using acetate salts as the metal precursors and the inverted device configuration using a one-step method where methylammonium iodide (MAI), lead acetate (Pb(OAc)$_2$), and a second divalent metal salt (B'(OAc)$_2$ or B'I$_2$) are dissolved in dimethylformamide (DMF), the solution is spin-coated onto PEDOT:PSS, and the perovskite is crystallized by drying and annealing the film. The perovskite can be deposited on a hole transporter such as PEDOT:PSS and use fullerene derivatives as an electron transporter layer. See, W. Zhang, M. Saliba, D. T. Moore, S. K. Pathak, M. T. Hörantner, T. Stergiopoulos, S. D. Stranks, G. E. Eperon, J. A. Alexander-Webber, A. Abate, A. Sadhanala, S. Yao, Y. Chen, R. H. Friend, L. A. Estroff, U. Wiesner and H. J. Snaith, *Nat. Commun.*, 2015, 6, 6142, Z. Xiao, C. Bi, Y. Shao, Q. Dong, Q. Wang, Y. Yuan, C. Wang, Y. Gao and J. Huang, *Energy Environ. Sci.*, 2014, 7, 2619, and J. H. Heo, H. J. Han, D. Kim, T. K. Ahn and S. H. Im, *Energy Env. Sci,* 2015, 8, 1602-1608, each of which is incorporated by reference in its entirety. Inverted devices exhibit minimal hysteresis effects and this configuration was chosen to eliminate the device architecture itself as a source of hysteresis in the event mixed-metal devices displayed such behavior in the current-voltage characteristics. Divalent metal acetates, B'(OAc)$_2$, were chosen as the metal precursor materials because most acetate salts, with the exception of calcium and strontium, are soluble in dimethylformamide (DMF) and lead acetate produces remarkably smooth perovskite films. See, W. Zhang, M. Saliba, D. T. Moore, S. K. Pathak, M. T. Hörantner, T. Stergiopoulos, S. D. Stranks, G. E. Eperon, J. A. Alexander-Webber, A. Abate, A. Sadhanala, S. Yao, Y. Chen, R. H. Friend, L. A. Estroff, U. Wiesner and H. J. Snaith, *Nat. Commun.*, 2015, 6, 6142, which is incorporated by reference in its entirety. As is represented by the schematic in FIG. 1C, most mixed-metal perovskite films were synthesized in a one-step process by spin-coating a solution containing methylammonium iodide (MAI), Pb(OAc)$_2$, and B'(OAc)$_2$ in DMF with a 3:1 molar ratio of MAI to total metal acetate content. The one exception to this method was the case of strontium, where a 3:1 molar ratio of MAI:Pb(OAc)$_2$ was blended with a 1:1 molar ratio of MAI:SrI$_2$ due to the poor solubility of Sr(OAc)$_2$ in DMF. To build the inverted device architecture, the perovskite solution was spin-coated on a PEDOT:PSS layer and crystallized by drying and annealing the film. This was followed by spin-coating and heat-treating a layer of the n-type fullerene derivative, phenyl-C61-butyric acid methyl ester (PCBM), and the sequential deposition of Ca and Al as the top electrode materials through thermal evaporation. In order to improve the quality of the perovskite film, the PEDOT:PSS surface was first treated with 1,8-diiodooctane (DIO) prior to spin-coating the perovskite solution (see FIG. 9 and Table 2).

A functioning solar cell can include lead-based metal halide perovskites that contain divalent metal ions within a planar perovskite film. Specifically, replacing some of the lead content in the perovskite with less-toxic divalent cations such as $Co^{2+}$, $Cu^{2+}$, $Fe^{2+}$, $Mg^{2+}$, $Mn^{2+}$, $Ni^{2+}$, $Sn^{2+}$, $Sr^{2+}$, Zn can achieve working solar cells with repeatable performance metrics. A solar cell including $Sn^{2+}$ has previously been reported in Zuo, F. et al. Binary-Metal Perovskites Toward High-Performance Planar-Heterojunction Hybrid Solar Cells. *Adv. Mater.* 26, 6454-6460 (2014), and Ogomi, Y. et al. CH$_3$NH$_3$Sn$_x$Pb$_{(1-x)}$I$_3$ Perovskite Solar Cells Covering up to 1060 nm. *J. Phys. Chem. Lett.* 5, 1004-1011 (2014), each of which is incorporated by reference in its entirety. Other halides such as bromide or chloride ions can substitute iodide wholly or in part to achieve similar mixed-metal mixed-halide perovskite photovoltaic materials.

As illustrated in FIG. 1C, planar mixed-metal perovskite films, abbreviated as MA(Pb:B')I$_3$, can be synthesized in a single step by spin-coating solutions containing methylammonium iodide (MAI), lead acetate (Pb(OAc)$_2$) as the lead precursor, and either a second metal acetate (B'(OAc)$_2$) or metal iodide (B'I$_2$) compound as the source for the secondary divalent metal ions listed above.

Working mixed-metal planar solar cells can be achieved by building the "inverted architecture" device structure illustrated in FIG. 1C, where the mixed-metal perovskite film is sandwiched between a hole-transporting layer (such as PEDOT:PSS) and an electron-transporting layer (such as a fullerene derivative like PC$_{60}$BM) with appropriately selected electrode materials outside each of these layers. In principle, this same technique can be used to construct solar cells with the conventional architecture, where the perovskite is deposited on an electron transport layer such as TiO$_2$, SnO$_2$, or a fullerene-based compound and a hole transport layer such as spiro-OMeTAD or poly(triaryl)amine (PTAA) would be deposited on top of the perovskite.

Figure 3C:
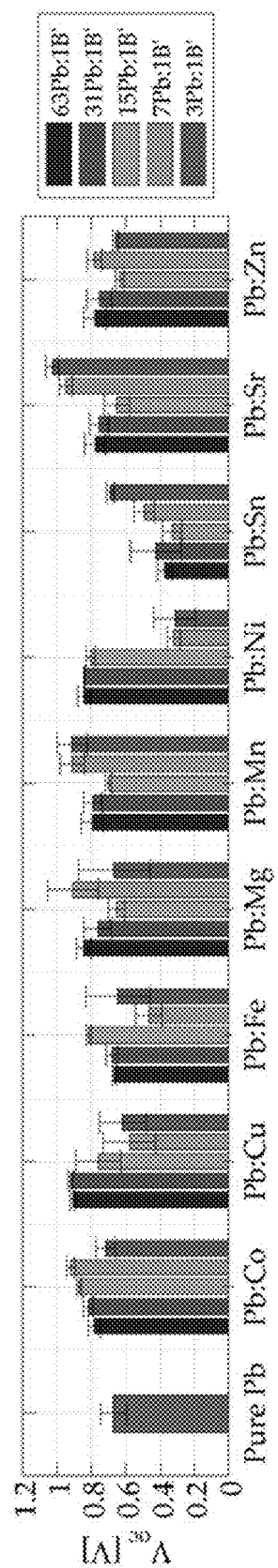

Between 1.56% (63Pb:1B' blends) and 25% (3Pb:1B' blends) of the lead content of the perovskite film was replaced with several less-toxic divalent metal ions including $Co^{2+}$, $Cu^{2+}$, $Fe^{2+}$, $Mg^{2+}$, $Mn^{2+}$, $Ni^{2+}$, $Sn^{2+}$, $Sr^{2+}$, and $Zn^{2+}$. The effect of each of these substitutions on device performance was investigated by constructing at least 4 different devices (each containing 10 solar cells) of each mixed-metal condition over at least two separate batches. The current-voltage characteristics (JV curves) for the best performing device of each mixed-metal embodiment is presented in FIGS. 2A-2I and the compiled performance metrics of the entire study are presented in FIGS. 3S-3D. As is shown in FIGS. 2A-2I and 3A-3D, several mixed-metal perovskite embodiments that replace a portion of the $Pb^{2+}$ content of the perovskite film with $Co^{2+}$, $Cu^{2+}$, $Mg^{2+}$, $Ni^{2+}$, $Sn^{2+}$, $Sr^{2+}$, or $Zn^{2+}$ have repeatedly demonstrated improved power conversion efficiencies with statistical significance by improving either the generated short-circuit current, the open-circuit voltage, fill factor, or any combination thereof. Any other divalent metal ions such as $Ba^{2+}$, $Be^{2+}$, $Ca^{2+}$, $Cd^{2+}$, $Cr^{2+}$, $Ge^{2+}$, $Hg^{2+}$, $Pd^{2+}$, $Eu^{2+}$, $Yb^{2+}$ could also be utilized, however these were excluded from consideration in this current study due to concerns over toxicity, expense, or practical fabrication considerations.

Additionally, companion films were synthesized at the same time for photoluminescence and absorption spectra measurements to determine whether the substitution shifted the bandgap of the perovskite material. Several embodiments have demonstrated shifts in the bandgap upon incorporation, the data from measurements for each of these are presented in FIGS. 22A-22D and 23A-23D.

Perovskites can be synthesized in an "inverted architecture" using metal acetate precursors. The solubility of most metal acetates in the N,N-dimethylformamide (DMF) solvent used for film processing enables the synthesis of many mixed-metal embodiments. By assembling an inverted architecture (i.e. a perovskite device where the photogenerated electrons are collected at the evaporated top electrode and the holes are collected at the patterned transparent electrode deposited on the transparent substrate, as shown in FIG. 1C), the device performance is able to minimize any hysteresis between the forward and reverse sweeps of the current-voltage characteristics.

The molecule 1,8-diiodooctane (DIO) can be used to treat the surface of the hole-transporting layer (i.e. PEDOT:PSS) and can improve the open-circuit voltage of the pure-Pb (i.e. $MAPbI_3$) perovskite device.

High power conversion efficiencies (PCE) were achieved with devices that replaced 25% of the lead content with a non-toxic divalent metal species. Specifically, a PCE of 8.3% and 9.3% was measured for champion $MA(3Pb:1Cu)I_3$ and $MA(3Pb:1Sn)I_3$ devices, respectively. The current-voltage characteristics measured for these devices are presented in FIGS. 2A-2I.

It was experimentally demonstrated that methylammonium mixed-metal triiodide perovskite compositions, where a portion of the lead (Pb) content has been replaced with strontium (Sr) demonstrate improved resistance to thermal degradation.

The efficiency of the $MAPbI_3$ baseline material is reduced by an order of magnitude after heating at 150° C. for an hour (from 10.2% to 0.2%), whereas mixed-metal $MA(Pb:Sr)I_3$ materials display an increasing resistance to performance degradation with increasing Sr content. The champion power conversion efficiency for the $MA(15Pb:1Sr)I_3$ (i.e. where $1/16^{th}$ of the Pb content is replaced with Sr) is 8.8%.

The performance trends correlate directly with the trends of material degradation, as evidenced by measurements made with thermogravimetric analysis and absorbance spectroscopy. That is, the $MAPbI_3$ material decomposes at lower temperatures than the mixed Pb:Sr perovskite compositions, which is correspondingly reflected in the photovoltaic performance.

EXAMPLES

Materials.
Lead(II) acetate trihydrate (99.999%, $Pb(OAc)_2$), iron(II) acetate (>99.99%, $Fe(OAc)_2$), hydroiodic acid (57 wt % in water, HI), chlorobenzene (anhydrous 99.8%, CB), and N,N-dimethylformamide (anhydrous 99.8%, DMF) were sourced from Sigma-Aldrich. Cobalt(II) acetate tetrahydrate (99.999%, $Co(OAc)_2$), copper(II) acetate (99.999%, $Cu(OAc)_2$), magnesium acetate tetrahydrate (99.997% Puratronic, $Mg(OAc)_2$), manganese(II) acetate tetrahydrate (99.999% Puratronic, $Mn(OAc)_2$), nickel(II) acetate tetrahydrate (99.999% Puratronic, $Ni(OAc)_2$), zinc acetate (anhydrous 99.98%, $Zn(OAc)_2$), strontium iodide (anhydrous 99.99%, $SrI_2$), tin(II) acetate (95%, $Sn(OAc)_2$), 1,8-diiodooctane (>97%, DIO), calcium shot (99.5%), and aluminum shot (99.999% Puratronic) were sourced from Alfa Aesar. Methylamine solution (40 wt % in methanol, $CH_3NH_2$) was sourced from TCI. Phenyl-C61-butyric acid methyl ester (99.5%, PCBM) was sourced from Nano-C, Inc. Poly(3,4-ethylenedioxythiophene)-poly(styrenesulfonate) (Clevios P VP AI 4083, PEDOT:PSS) was sourced from Heraeus.

Methylammonium Iodide (MAI) Synthesis.
HI solution (30 mL, 57 wt % in water) and $CH_3NH_2$ solution (27.8 mL, 40 wt % in methanol) were mixed and stirred in an ice bath for 2 hours. MAI was produced by sequentially removing the solvent in a rotary evaporator, recrystallizing the solid with ethanol, and washing and filtering the precipitate with diethyl ether to achieve the purified product. The material, in the form of white crystals, was then dried in a vacuum oven at 60° C. for 24 hours and stored in a dark, dry environment until further use.

Mixed-Metal Perovskite Solutions.
Mixed-metal perovskite solutions were freshly prepared before use by fully dissolving the MAI and divalent metal acetate $(B'(OAc)_2)$ precursors in DMF to achieve final solutions containing 2.4 M MAI and 0.8 M total metal acetate content. The metal acetate content in the perovskite solutions was varied from a 1Pb:1B' ratio (i.e. 400 mM $Pb(OAc)_2$ and 400 mM $B'(OAc)_2$ final solution) to 63Pb:1B' (i.e. 787.5 mM $Pb(OAc)_2$ and 12.5 mM $X(OAc)_2$ final solution) where B'={Co, Cu, Fe, Mg, Mn, Ni, Sn, Zn}. Due to the poor solubility of $Sr(OAc)_2$ in DMF, the iodide precursor ($SrI_2$) was used instead and mixed Pb: Sr perovskite solutions were prepared by making separate stocks of (2.4 M MAI):(0.8 M $Pb(OAc)_2$) and (0.8 M MAI):(0.8 M $SrI_2$), respectively, in DMF. These two stock solutions were mixed immediately before use to achieve the desired ratios of Pb:Sr.

Solar Cell Fabrication.
Patterned indium tin oxide (ITO) coated glass substrates (Thin Film Devices, Inc.) were cleaned by scrubbing and sonication in a detergent solution (Alconox) followed by thorough rinsing with Milli-Q water (18.2 MΩ, Millipore). The substrates were then sequentially sonicated for around 10 minutes in Milli-Q water, acetone, and isopropanol solvents, dried under flowing nitrogen, and exposed to air plasma for 10 minutes to remove organic contaminants and render the surface hydrophilic. The as-received PEDOT:PSS solution was initially filtered through a 0.45 μm syringe filter (Pall Corp. Acrodisc Supor membrane) and warmed to room temperature. Several drops of the PEDOT:PSS solution were dispensed through a second syringe filter directly onto the plasma treated substrate and then spun at 3,000 rpm for 50 s with a 1 s ramp. The substrates were immediately transferred to an oven and annealed in air at 125° C. for at least 15 minutes, after which they were transferred to a nitrogen glove box for the remainder of the device processing.

The PEDOT:PSS layer was treated by statically dispensing and spin-coating 45 μL of a DIO solution (2 vol % in CB) at 2,250 rpm for 40 s with a 1 s ramp. Immediately afterwards, 45 μL of a freshly prepared mixed-metal perovskite solution was statically dispensed onto the substrate and spin-coated at 2,250 rpm for 40 s. After spinning, the substrate was immediately removed from the spin-coater chuck and let rest at room temperature for 10 minutes, during which the film color changed from nearly colorless to a light brown hue. Each device was then annealed on a hot plate at 100° C. for 30 minutes and the perovskite film darkened to achieve its final color within seconds.

A solution of PCBM (35 mg $mL^{-1}$ in CB) was prepared the day before use and kept at 80° C. overnight to ensure full dissolution. The warm solution was filtered through both a 100 nm and 200 nm PTFE (Whatman) filter an hour before use and kept at 80° C. until spin-coating. The perovskite substrates were warmed at 80° C. for 10 minutes and 45 μL of the warm PCBM solution was statically dispensed and spin-coated at 1,200 rpm for 35 s. Each substrate was immediately transferred to a hotplate and annealed at 90° C. for 45 minutes. Afterwards, top electrodes consisting of 20 nm Ca and 90 nm of Al were thermally evaporated on top of the fullerene layer to complete the device. Finally, a patterned aluminium film (25 nm thick) was evaporated directly onto the glass backside of each device to act as an aperture mask during photovoltaic performance testing. The final patterned device substrate contained 10 individual solar cells, each with an apertured active area of 0.0113 cm$^2$.

The approximate thicknesses of each solution-processed layer in the solar cell, as determined by a profilometer (Veeco Dektak 6M), are: PEDOT:PSS (35 nm), perovskite (290 nm), and PC$_{60}$BM (100 nm). Representative thickness measurements of films with each mixed-metal perovskite composition are presented in Table 3.

Device Characterization Methods.

Current-voltage (JV) characteristics were recorded using a Keithley 2636A source meter under simulated solar light (1-Sun, 100 mW cm$^{-2}$) generated by a Newport 96000 solar simulator equipped with an AM1.5G filter. After warming the solar simulator, the light intensity was calibrated with a Newport 91150V reference cell prior to testing each batch of devices. Each device was soaked under the AM 1.5G illumination for 5 minutes prior to measurement and the delay between data points was 20 ms. The external quantum efficiency (EQE) measurements were conducted under chopped monochromatic light from an optical fiber in an under-filled geometry without bias. Illumination was provided by coupling the white light from a xenon lamp (Thermo Oriel 66921) through a monochromator (Acton) into the optical fiber and the photocurrent was recorded using a lock-in amplifier (Stanford Research System SR830). Devices were continuously kept in a nitrogen atmosphere after electrode evaporation, including during both JV and EQE measurements. Devices were tested within 12 hours of evaporating the top electrodes.

Materials Characterization Methods.

Perovskite films for the X-ray diffraction (XRD) and scanning electron microscopy (SEM) measurements were prepared on PEDOT:PSS-coated glass substrates (same size as the device substrates) in the same manner used to fabricate devices. Films for cross-sectioning and energy-dispersive x-ray spectroscopy (EDX) measurements were prepared on PEDOT:PSS-coated silicon substrates (same size as the device substrates) in the same manner used to fabricate devices.

XRD patterns were collected using a Bruker D8 x-ray diffractometer with Cu Kα radiation in order to verify the crystal structure and material phases of the deposited films. SEM micrographs were obtained with a Zeiss FESEM Ultra Plus operating at 3-5 kV. The film thicknesses reported in Table S2 were measured from each of the SEM samples using a Veeco Dektak 6M profilometer.

Focused ion beam milling with gallium ions was performed using a Zeiss NVision 40 to prepare a cross-sectional sample for transmission electron microscopy (TEM). A thin platinum protective layer was deposited on the sample surface prior to the milling procedure. Scanning transmission electron microscopy (STEM) imaging and energy-dispersive x-ray spectroscopy (EDS) maps were performed with a Hitachi HD-2700 Cs-corrected CFEG-STEM operating at 200 kV. High resolution transmission electron microscopy (HRTEM) micrographs were collected using a JEOL 2010F STEM operating at 200 kV.

Optical Characterization Methods.

Perovskite films for the steady-state photoluminescence (PL), absorbance, and time-resolved photoluminescence (TRPL) measurements were prepared by spin-coating the perovskite solution on glass substrates (same size as the device substrates) after plasma treatment with an oxygen plasma for 10 minutes to render the surface hydrophilic. The perovskite samples were prepared with the same procedure used for devices. The final perovskite films were capped with a layer of PMMA by statically dispensing 45 µL of 10 mg/mL poly(methylmethacrylate) (PMMA) in chlorobenzene on the film and spin-coating at 1,200 rpm for 60 s with a 1 s ramp time. The PMMA capping layer is intended to prevent film degradation during spectroscopy measurements.

Steady-state PL emission spectra were obtained by exciting perovskite films with a 532 nm laser diode and measuring the emission spectra using a visible wavelength detector with a Horiba Jobin Yvon Fluorimeter with an integration time of 1 s and wavelength step of 1 nm. Optical absorbance measurements were made using a Beckman-Coulter DU800 UV-vis spectrophotometer with a wavelength step size of 0.5 nm.

TRPL measurements were acquired using a custom-built time-correlated single photon counting (TCSPC) confocal microscope (Nikon Eclipse Ti) setup with a 40× objective (Nikon Plan Apo, 0.95 NA, OFN25 DIC N2). Samples were photoexcited using a 405 nm laser head (LDH-P-C-405, PicoQuant GmbH) with pulse duration of <90 ps, fluence of ~5 µJ/cm$^2$/pulse, and a repetition rate of 1 MHz. The photoluminescence from the sample is collected by the same objective and the resulting collimated beam passes through a long-pass filter with a cut-off at 416 nm (Semrock Inc., BLP01-405R-25) to remove any residual scattered or reflected excitation light. A single photon detecting avalanche photodiode (APD) (MPD PDM Series 50 mm) is used for the detection, with the APD output connected to a timing module with a resolution of 4 ps (PicoQuant Pico-Harp 300), which detects the arrival time of each photon for the TCSPC measurements. The measurements were acquired using the commercial software SymphoTime 64 (PicoQuant GmbH).

Ultraviolet Photoelectron Spectroscopy Methods.

Ultraviolet photoelectron spectroscopy (UPS) measurements were performed in an Omicron ultrahigh vacuum (UHV) system with a base pressure of 1×10$^{-10}$ mbar. Perovskite samples were deposited onto conducting ITO-coated glass substrates coated with DIO-treated PEDOT:PSS, as described in the main manuscript. Samples were transferred from a nitrogen glovebox (<1 ppm O$_2$, <10 ppm H$_2$O) to the UHV system without exposure to air using a custom-built transfer system. During measurement, samples were biased at −5.0 V relative to the electron energy analyzer, and illumination at 21.22 eV was provided by the He(I) line of a helium discharge lamp. Electrons were collected at 0° from substrate normal, and spectra were collected in <45 s to minimize the effects of charging and degradation.

Impact of Secondary Metal Species on Photovoltaic Performance.

The current-voltage (JV) characteristics were measured after five minutes of light soaking and both the forward and reverse sweeps of the champion solar cell for each mixed-metal composition are shown in FIGS. 2A-2I. For each composition, at least 36 individual solar cells were tested from two different device batches in order to ensure that observed trends in photovoltaic performance were repeatable. The average values for each photovoltaic performance metric are reported in FIGS. 3A-3D. By comparing the average performance metrics of the mixed-metal devices to the baseline obtained from pure Pb devices, several observations can be made about the tolerance of MAPbI$_3$ solar cells to other metal species: (1) Performance improvements are generally seen upon replacing a small fraction of the Pb atoms with a second metal species. (2) Further increases in the B' mole fraction is generally accompanied by decreases in the photocurrent, which correspondingly decreases the PCE. (3) Iron is the only alternative metal species whose inclusion in the perovskite is always detrimental to performance, even at the lowest Fe content considered (i.e. 63Pb: 1Fe). (4) Blends of Pb:Sn demonstrate the opposite behavior to most other mixed-metal materials, where the performance is low at 63Pb:1Sn but increases with increasing amounts of Sn.

The most notable efficiency enhancements arise when $1/64^{th}$ of the Pb content, denoted as 63Pb:1B', is replaced with Co, Cu, Sr, or Zn, which improves both the short-circuit current density, $J_{sc}$, and open-circuit voltage, $V_{oc}$. Modest PCE improvements are also observed for 63Pb:1B' samples of Mg, Mn, and Ni, largely due to increases in $V_{oc}$, which clearly demonstrate that the MAPbI$_3$ perovskite material is not only fairly tolerant of several metal species at relatively low concentrations, but that introducing these atoms can be beneficial to device performance. As more Pb is replaced, the photocurrent begins to decrease and the drop becomes quite appreciable between the 15Pb:1B' and 7Pb:1B' molar ratios for Mg, Mn, Ni, and Sr. The perovskite active layer is even more tolerant of Co, Cu, Sn, and Zn whose champion 3Pb:1B' device achieves efficiencies of 4.1%, 8.3%, 9.3%, and 6.0%, respectively (see FIGS. 2A-2I for corresponding JV characteristics), whereas all other metal species at this replacement level achieve champion efficiencies below 1% (Table 4). Although each secondary metal species has its own tolerance limit, as a general rule the perovskite active layer suffers significant decreases in photocurrent for Pb replacement levels exceeding 7Pb:1B'. The transition metal that appears to be the most highly tolerated by the perovskite material is Zn, whose MA(7Pb:1Zn)I$_3$ composition achieves an average PCE of 8.8%, which exceeds the average 7.3% achieved by the MAPbI$_3$ baseline devices. Even though a champion efficiency of 8.3% was produced by MA(3Pb: 1Cu)I$_3$, this performance was only obtained for the initial measurement and subsequent scans of the same device were substantially degraded (FIGS. 38 and 39A-39F). Copper is unique among the secondary metal species investigated since its ions are more stable in a +1 rather than a +2 oxidation state in the presence of F and the mixed-metal Pb:Cu compositions demonstrated some unusual photovoltaic behavior. The champion photovoltaic metrics from this study for each level of Pb replacement are listed in Table 1 and a comprehensive tabulation of the champion and average values for each mixed-metal composition can be found in Tables 4 and 5. In order to ensure that the observed improvement with Pb content substitution was not simply a result of thinner perovskite films or a stoichiometric mismatch between the MAI and Pb(OAc)$_2$ precursors, two sets of control devices were created and tested in the same manner as the mixed-metal devices (see FIGS. 10A-10D and 11 and Tables 6 and 7 for details).

Figure 3D:
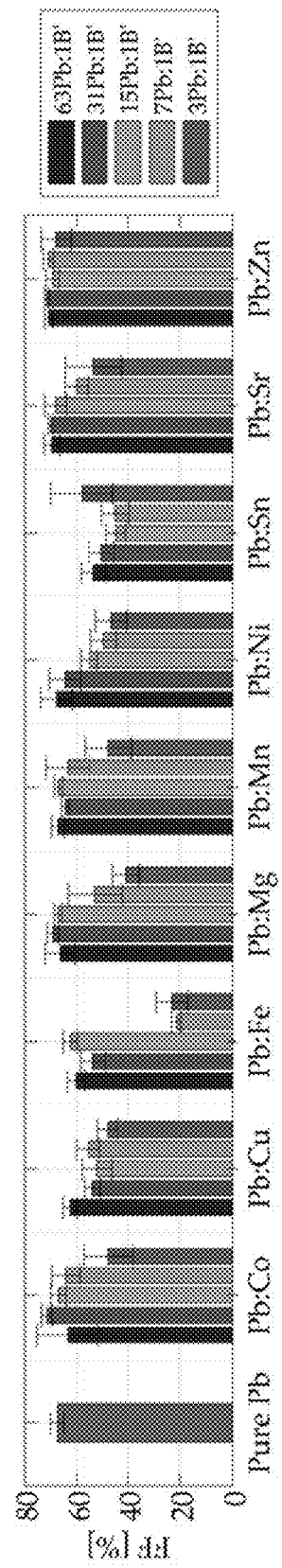

FIG. 3D shows that the average fill factor, FF, varies little between the MAPbI$_3$ baseline and most of the mixed-metal compositions, however there are a few notable exceptions where the values are noticeably reduced. The champion JV characteristic for each of the Pb:Cu compositions (FIG. 2B) displays a decreased shunt resistance, which is likely due to the formation of CuI shunting pathways. Conversely, most of the champion Pb:Sn compositions (FIG. 2G) along with the 7Pb:1B' and 3Pb:1B' mixtures of Fe (FIG. 2C), Mg (FIG. 2D), and Ni (FIG. 2F) show increased series resistances. These champion JV characteristics also reflect the trend for $V_{oc}$ presented in FIG. 3C, where increases in photovoltage occur in mixed-metal compositions with Co, Cu, Mg, Mn, Ni, Sr, and Zn.

While hysteresis is minimal for MAPbI$_3$ and mixtures with Cu, Mg, Sr, and Zn, it arises in the other mixed-metal systems and generally becomes more pronounced as more Pb atoms are substituted with the secondary metal species. For many of these embodiments, the scan from short-circuit to forward bias (i.e. forward scan) demonstrates a reduced fill factor, but the scan from forward bias to short circuit (i.e. reverse scan) often noticeably overshoots the current near the maximum power point for 7Pb:1B' and 15Pb:1B' compositions, as is clearly demonstrated by 7Pb:1Mn in FIG. 2E. Hysteresis in perovskite systems has generally been attributed to ion migration primarily affecting interfacial charge transfer and interfacial traps (see, W. Tress, N. Marinova, T. Moehl, S. M. Zakeeruddin, M. K. Nazeeruddin and M. Grätzel, Energy Env. Sci, 2015, 8, 995-1004, which is incorporated by reference in its entirety), however understanding the underlying physical mechanisms at work in the mixed-metal systems will require further in-depth study.

TABLE 1

Summary of champion solar cells for various levels of Pb replacement by a second metal species.

| B' [%] | Pb [%] | B' | Device Designation | PCE (%) | $J_{sc}$ $\left(\frac{mA}{cm^2}\right)$ | Voc (V) | FF (%) |
|---|---|---|---|---|---|---|---|
| 0% | 100% | — | MAPbI$_3$ | 10.3 | 19.0 | 0.78 | 69.2 |
| 1.6% | 98.4% | Co | MA(63Pb:1Co)I$_3$ | 11.4 | 19.0 | 0.84 | 71.5 |
| 3.1% | 96.9% | Co | MA(31Pb:1Co)I$_3$ | 11.1 | 19.1 | 0.83 | 70.0 |
| 6.3% | 93.7% | Co | MA(15Pb:1Co)I$_3$ | 10.2 | 16.9 | 0.86 | 70.3 |
| 12.5% | 87.5% | Zn | MA(7Pb:1Zn)I$_3$ | 9.9 | 16.6 | 0.82 | 73.1 |
| 25.0% | 75.0% | Sn | MA(3Pb:1Sn)I$_3$ | 9.3 | 18.3 | 0.73 | 69.5 |
| 50.0% | 50.0% | Sn | MA(1Pb:1Sn)I$_3$ | 2.2 | 8.9 | 0.62 | 39.3 |
| 50.0% | 50.0% | Cu | MA(1Pb:1Cu)I$_3$ | 3.4 | 11.3 | 0.70 | 47.5 |

Impact of Secondary Metal Species on Material Properties.

Mixed-metal perovskite films of each material composition were characterized using scanning electron microscopy (SEM), x-ray diffraction (XRD), spectrophotometry, steady-state photoluminescence, and time-resolved photoluminescence (TRPL) in order to assess how each secondary metal species affects the structural and electronic properties of the perovskite film. The full data set for each material composition is reported in SEM images of film morphologies in FIGS. 12-20, absorbance and steady-state photoluminescence (PL) emission spectra in FIGS. 21, 22A-22D and 23A-23D with tabulated peak locations in Table 8, XRD spectra in FIGS. 24-32 with tabulated peak locations in Table 9, and TRPL decay profiles in FIGS. 33A-33H with tabulated lifetimes in Table 10. The external quantum efficiency (EQE) spectrum was also measured for devices constructed from each mixed-metal composition in order to evaluate how efficiently photocurrent is generated at different wavelengths and provide an additional measure of material band gap from the onset of photocurrent generation (FIGS. 35A-35I and 36A-36I). Several key findings have been distilled from this broad set of measurements that reveal how the secondary metal species can influence the material properties of the perovskite film.

Figures 4A, 4B:
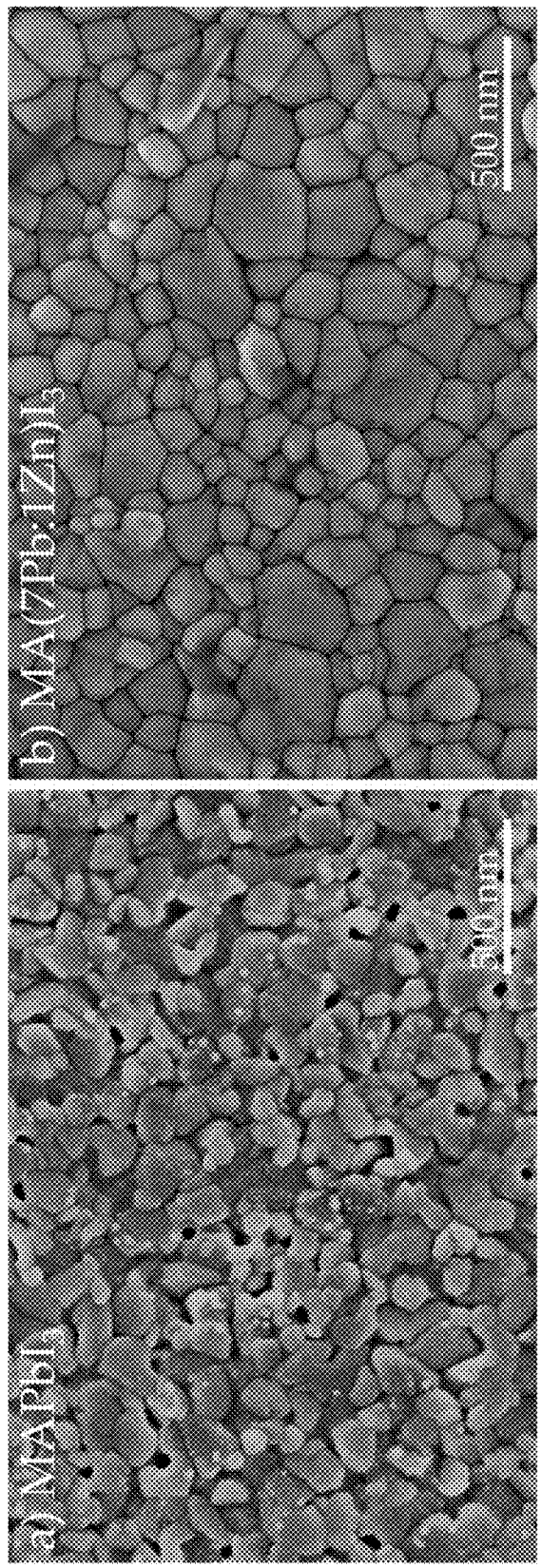
FIGS. 4A-4B show replacing 12.5% of the Pb molar content with Zn can dramatically change the film morphology from loosely packed grains with pinholes in the pure MAPbI$_3$ material (FIG. 4A) to larger, more densely packed grains with reduced pinhole density in the MA(7Pb:1Zn)I$_3$ mixed-metal system (FIG. 4B).
Figure 34:
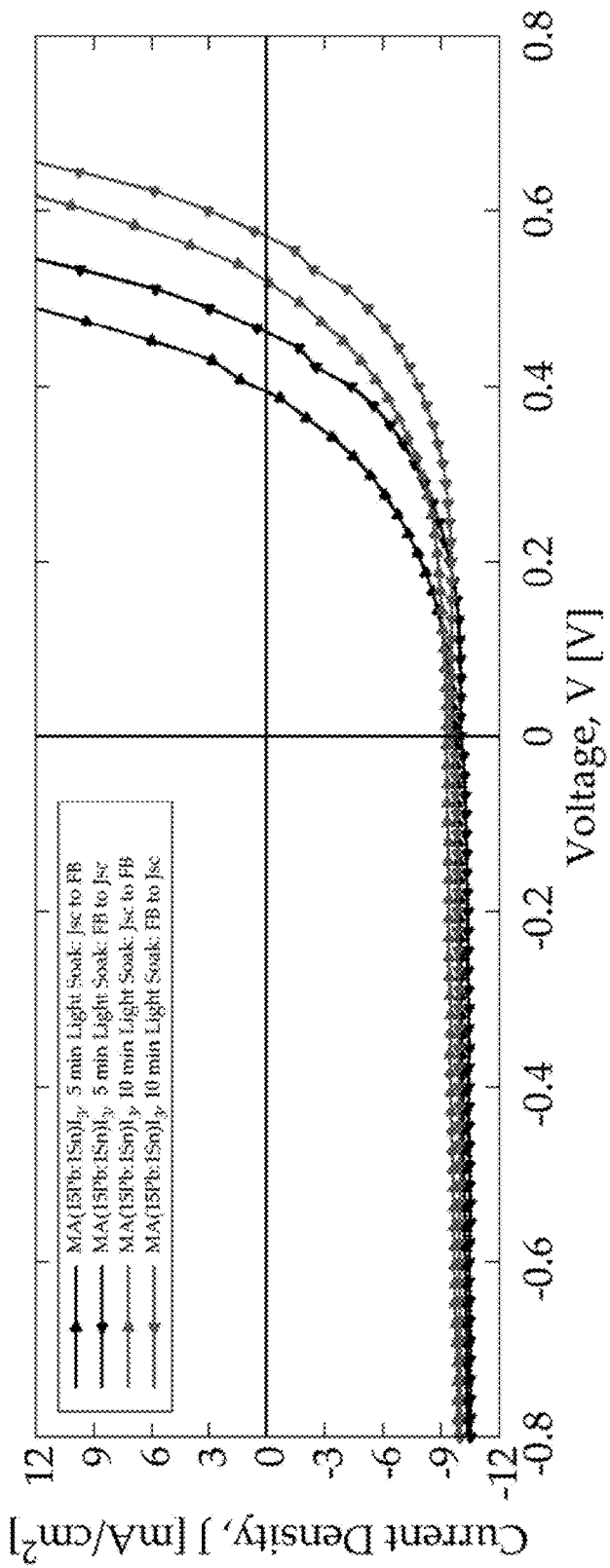
FIG. 34 shows light-soaking the same solar cell with the MA(15Pb:1Sn)I$_3$ mixed-metal composition for an additional 5 minutes improves device performance by increasing the open-circuit voltage.
Figure 35B:
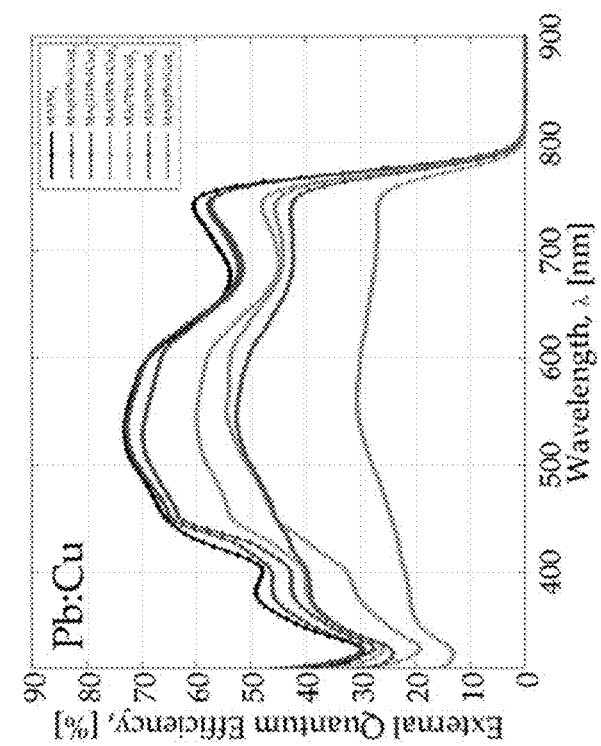
FIGS. 35A-35I show typical external quantum efficiency measurements for the compositions in each set of mixed-metal perovskite devices: Pb:Co (FIG. 35A), Pb:Cu (FIG. 35B), Pb:Fe (FIG. 35C), Pb:Mg (FIG. 35D), Pb:Mn (FIG. 35E), Pb:Ni (FIG. 35F), Pb:Sn (FIG. 35G), Pb:Sr (FIG. 35H), and Pb:Zn (FIG. 35I).
Figure 35A:
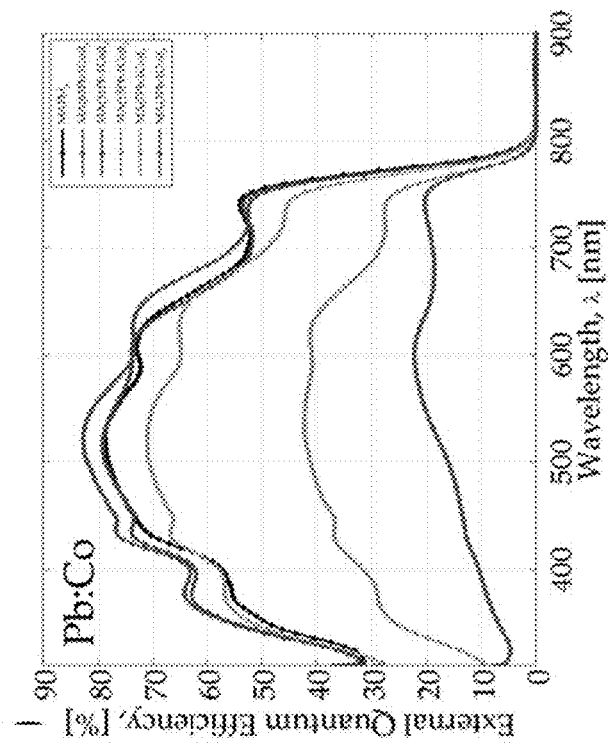
Figure 35D:
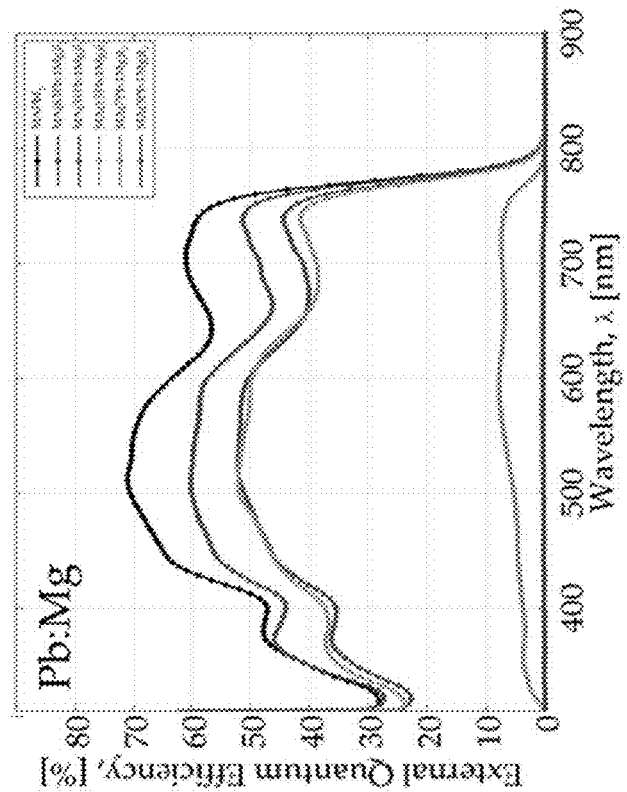
Figure 35C:
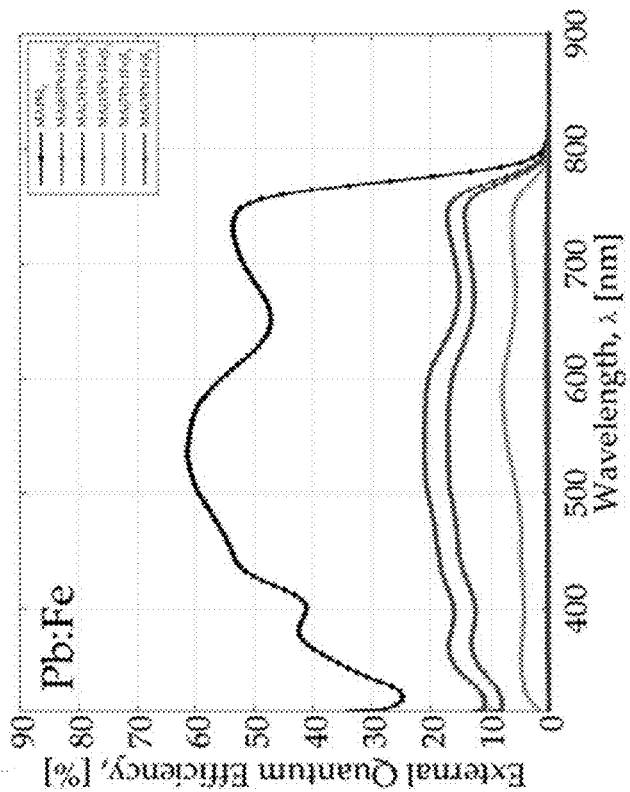
Figure 35F:
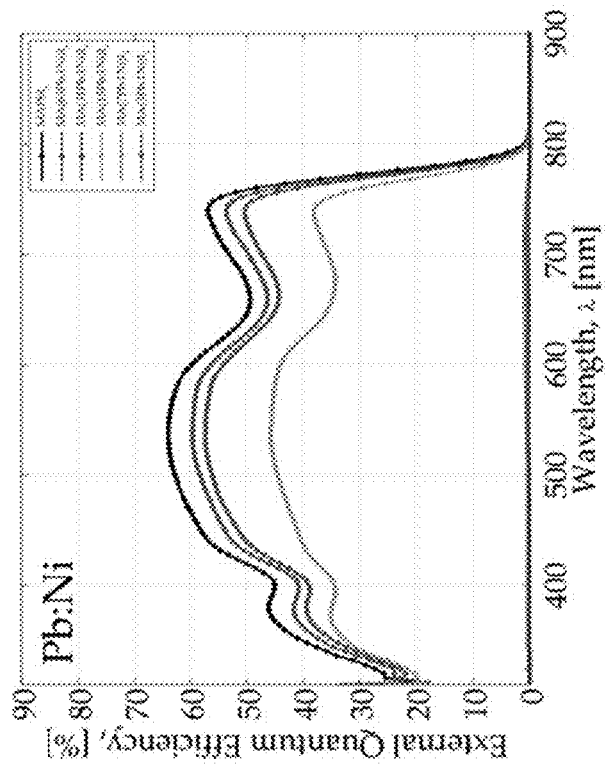
Figure 35E:
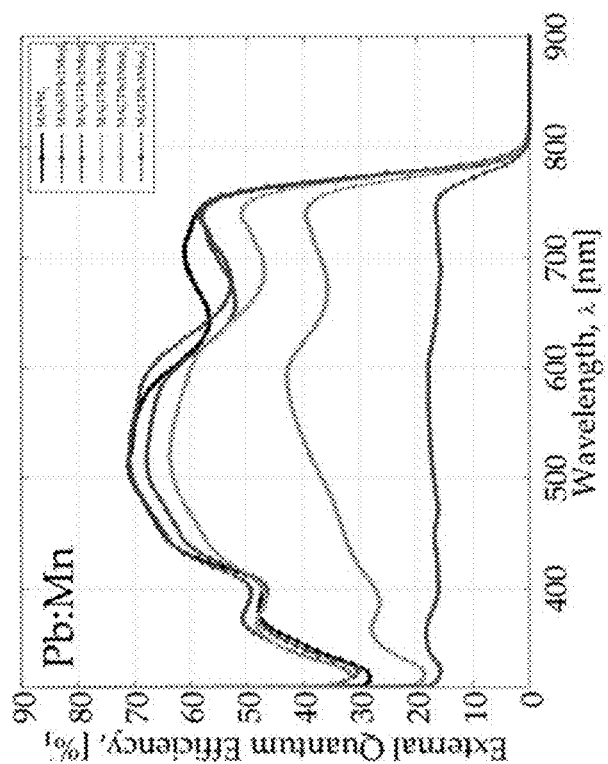
Figure 35H:
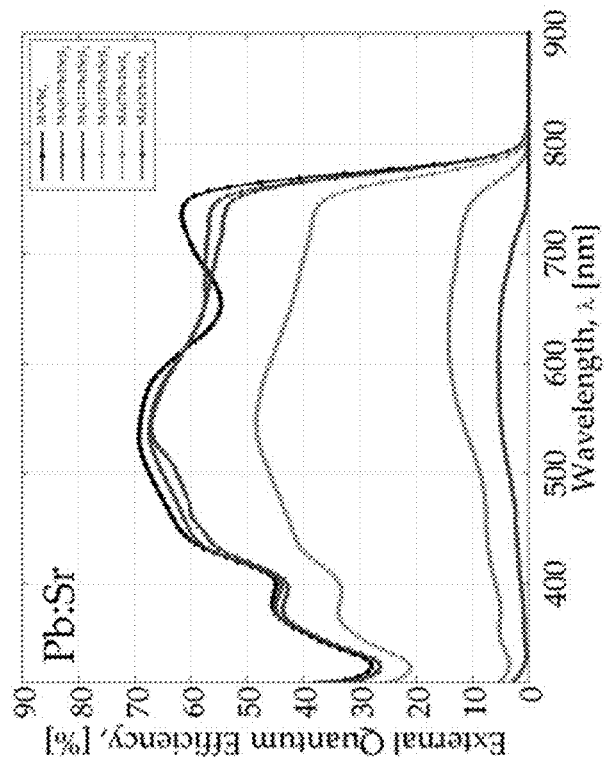
Figure 35G:
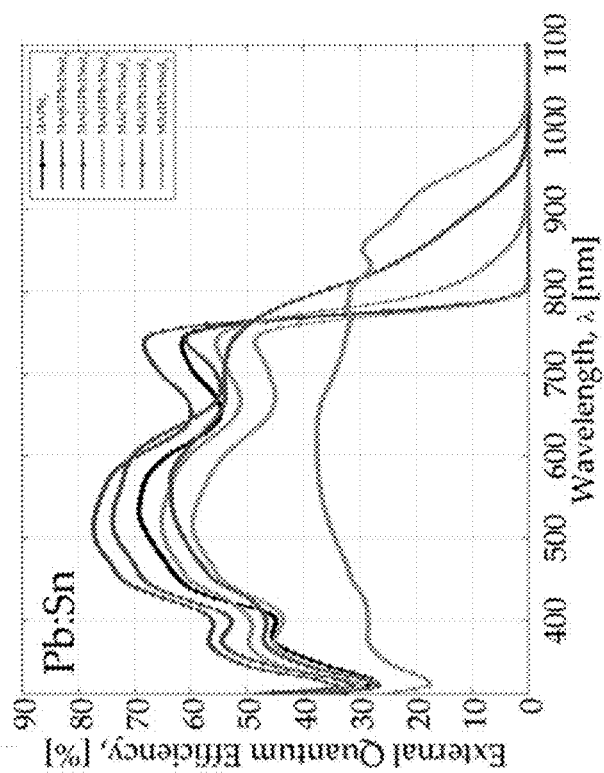
Figure 35I:
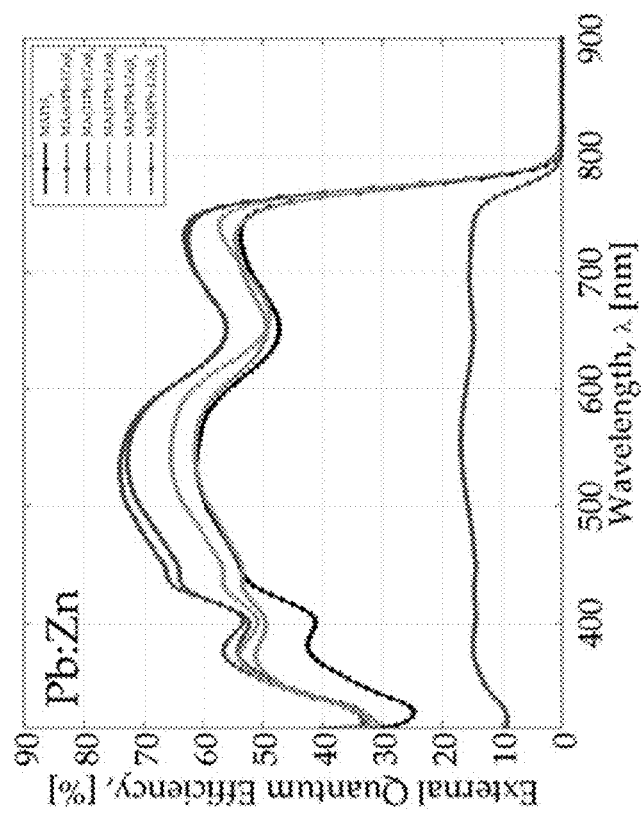
Figure 36A:
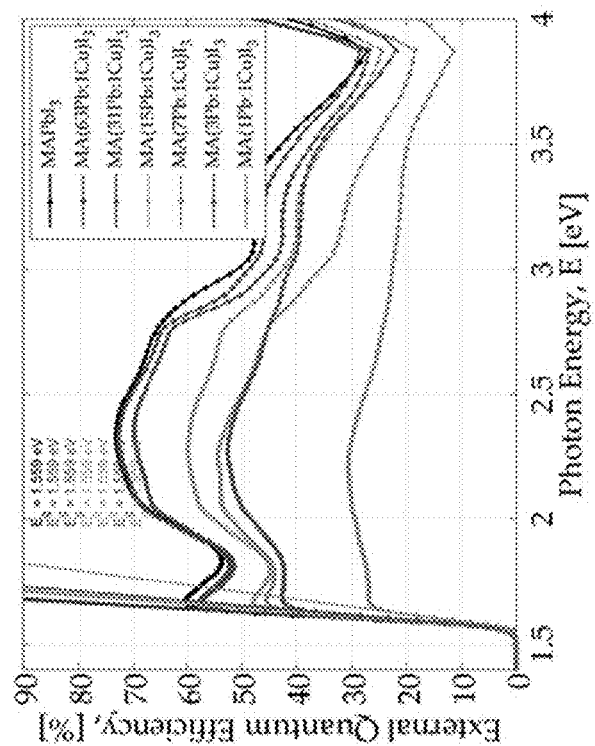
FIGS. 36A-36I show the optical band gap, $E_g$, is estimated by fitting a line to the edge of the EQE and extracting the intercept at the x-axis for each set of mixed-metal devices: Pb:Co (FIG. 36A), Pb:Cu (FIG. 36B), Pb:Fe (FIG. 36C), Pb:Mg (FIG. 36D), Pb:Mn (FIG. 36E), Pb:Ni (FIG. 36F), Pb:Sn (FIG. 36G), Pb:Sr (FIG. 36H), and Pb:Zn (FIG. 36I).
Figure 36B:
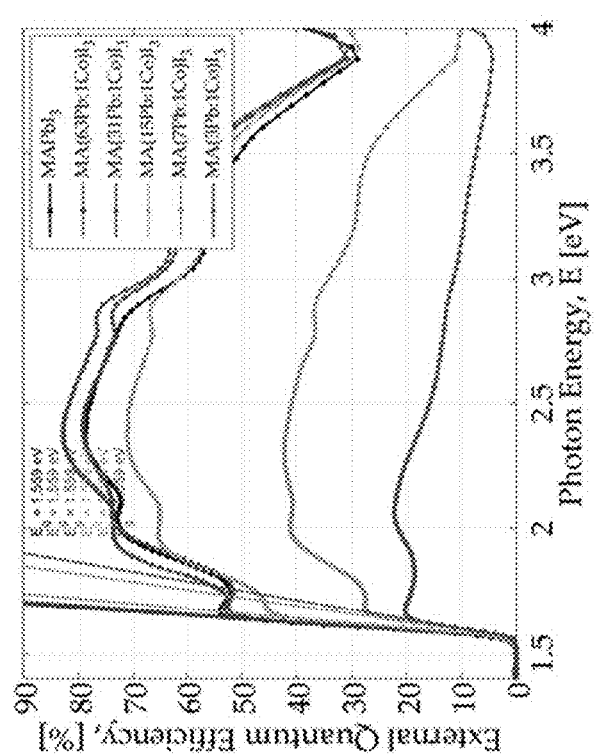
Figure 36D:
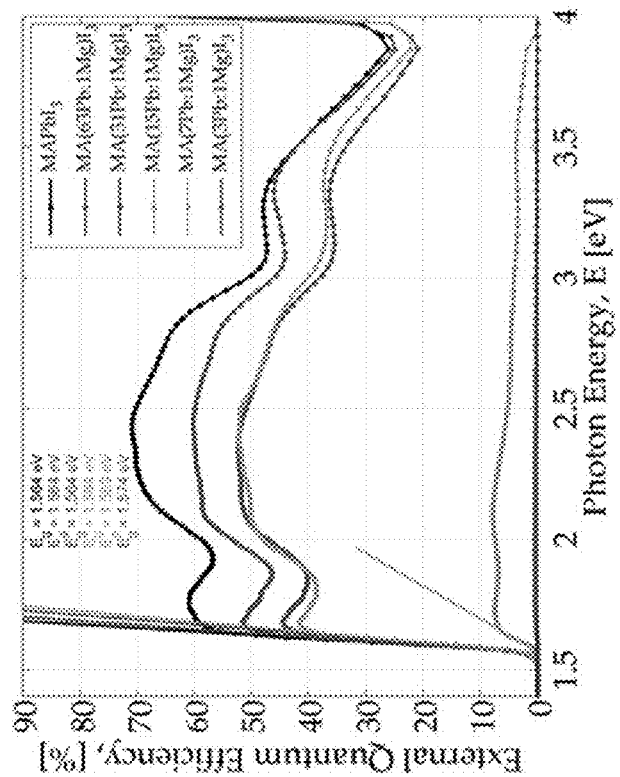
Figure 36C:
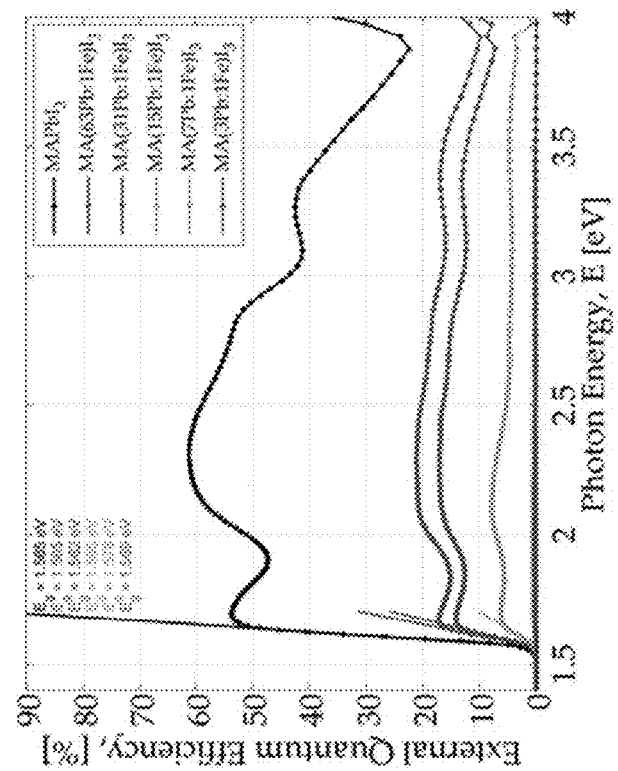
Figure 36F:
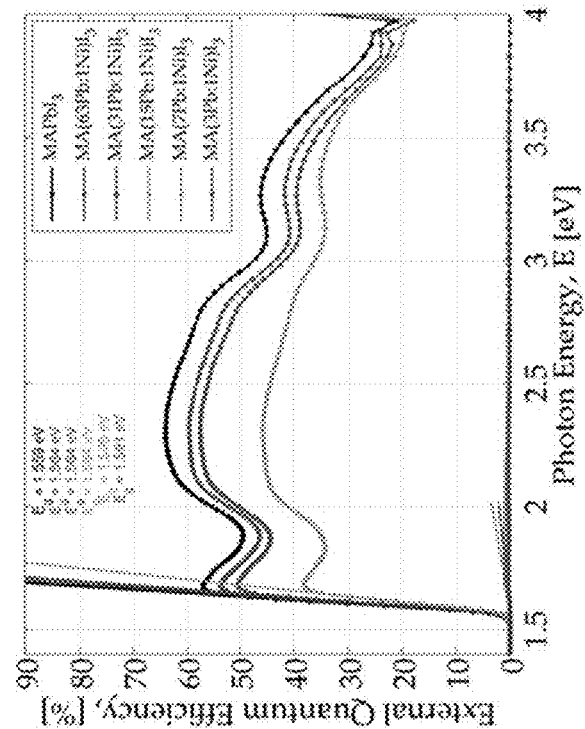
Figure 36E:
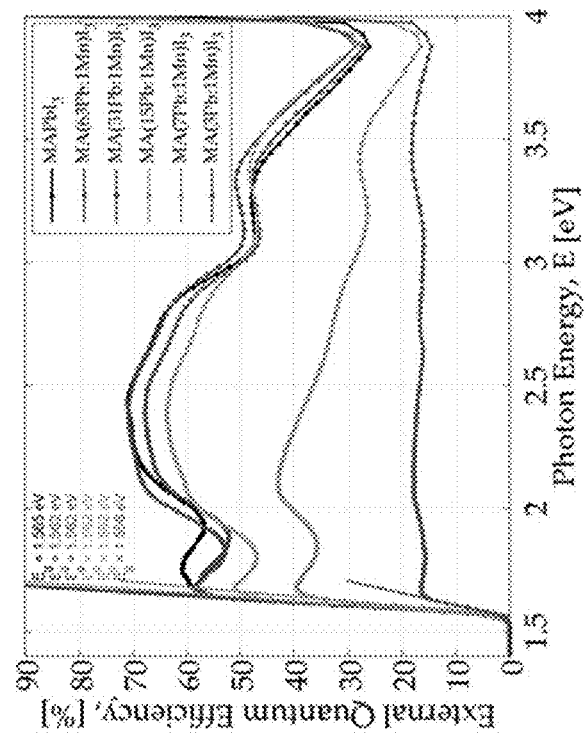
Figure 36H:
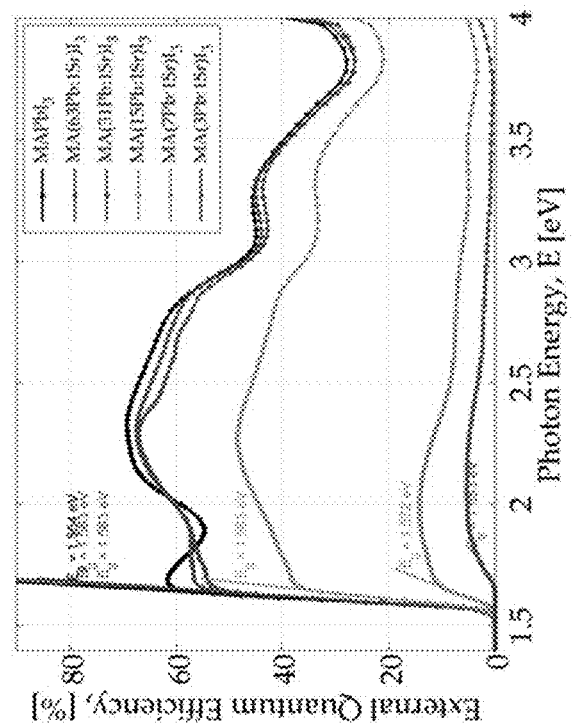
Figure 36G:
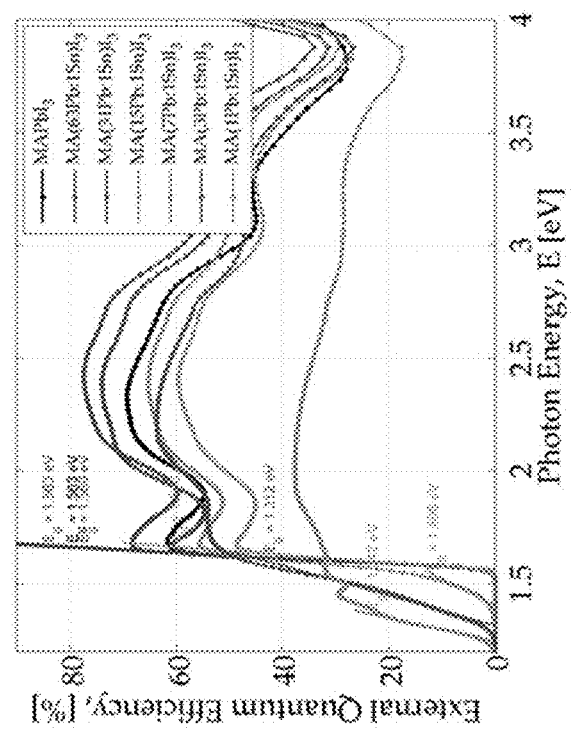
Figure 36I:
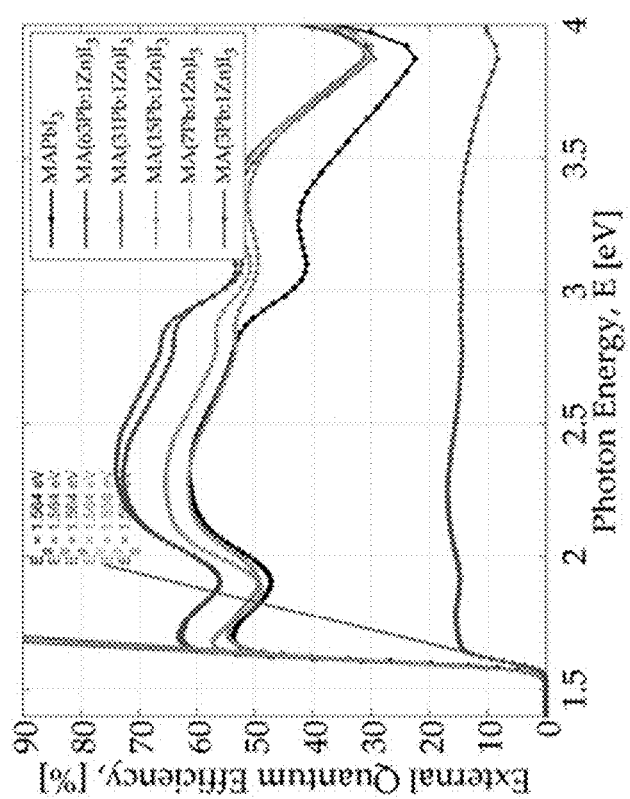

First, the film morphology can change dramatically upon introducing a second species. For most sets of mixed-metals materials, the grain size generally appears to decrease from the MAPbI$_3$ control at Pb replacement levels below 15Pb:1B' but often increases for higher secondary metal concentrations. This is highlighted in FIGS. 4A-4B, which compares the film morphologies of MAPbI$_3$ and MA(7Pb:1Zn)I$_3$ and demonstrates that replacing 12.5% of the Pb content with Zn produces a film with fewer pinholes and larger, more-densely packed grains. These morphological features are desirable in perovskite films and are generally associated with higher device efficiencies, which is reflected in FIG. 3A by the MA(7Pb:1Zn)I$_3$ composition out-performing the baseline MAPbI$_3$ material. Conversely, compositions with large isolated grains, such as 3Pb:1Co (FIG. 12) and 3Pb:1Cu (FIG. 13), tend to yield reduced photocurrents and fill factors. Changes in film morphology might also explain in part the contrary performance trend of Pb:Sn mixtures shown in FIGS. 2A-2I and 3A-3D, where the device efficiency initially drops upon introducing a small amount of Sn but improves with increasing Sn content. The SEM images shown in FIG. 18 reveal that the 3Pb:1Sn film has substantially larger grains than the films with lower Sn content, which display some of the smallest grains observed across the whole set of mixed-metal compositions investigated. It has been demonstrated that perovskite films with larger grains generally exhibit improved photovoltaic performance since there is less chance of non-radiative recombination occurring at grain boundaries. See, W. Zhang, S. Pathak, N. Sakai, T. Stergiopoulos, P. K. Nayak, N. K. Noel, A. A. Haghighirad, V. M. Burlakov, D. W. deQuilettes, A. Sadhanala, W. Li, L. Wang, D. S. Ginger, R. H. Friend and H. J. Snaith, *Nat Commun*, 2015, 6, which is incorporated by reference in its entirety. Hence, the finer grained films are more likely to experience lower photocurrents and lower photovoltages. With 95% being the highest commercially available purity, Sn(OAc)$_2$ is the least pure acetate precursor salt used in this study and it is possible an impurity is producing the detrimental effects. Unlike all other compositions, the open-circuit voltages and fill factors were improved in the Pb:Sn devices upon additional light-soaking (FIG. 34). However, the results reported in FIGS. 2A-2I and 3A-3D and Tables 4-5 correspond only to the measurements made after five minutes of light-soaking in order to be consistent with the other mixed-metal systems.

Figure 5A:
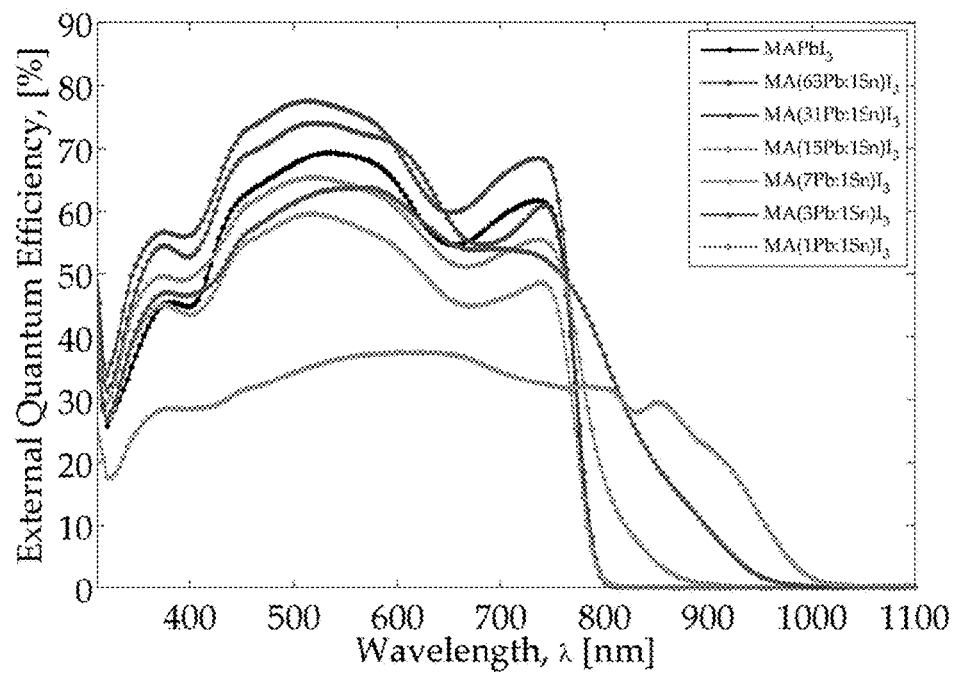
FIGS. 5A-5D show external quantum efficiency for representative MA(Pb:Sn)I$_3$ (FIG. 5A) and MA(Pb:Co)I$_3$ (FIG. 5B) solar cells. The x-ray diffraction spectra for MA(Pb:Sn)I$_3$ (FIG. 5C) and MA(Pb:Co)I$_3$ (FIG. 5D) perovskite films.
Figure 5B:
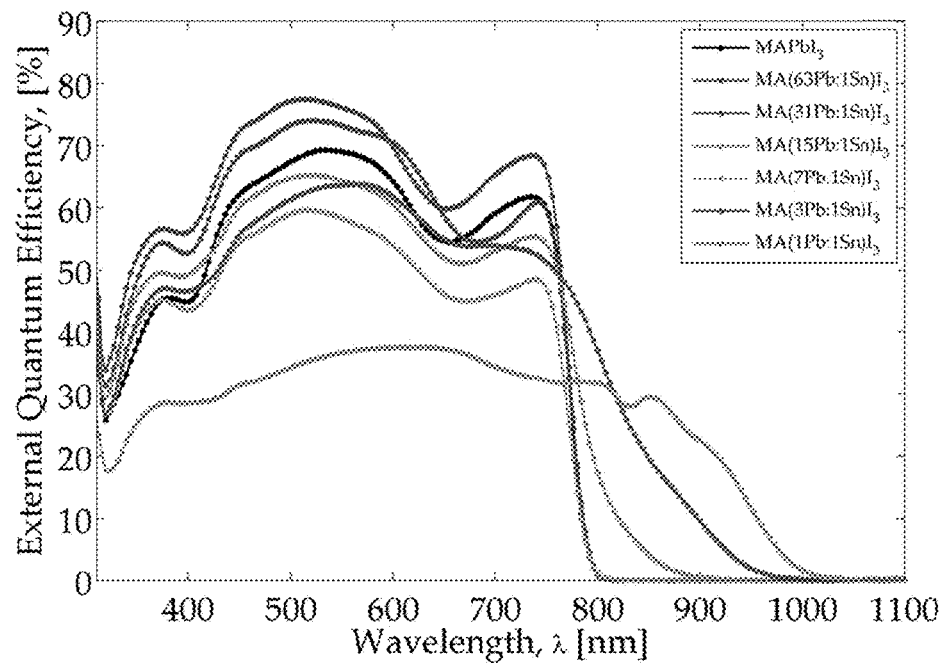

Second, the introduction of a second metal species into MAPbI$_3$ can modify the band gap of the material. Band gap narrowing occurs in the Pb:Sn mixtures as is evidenced by the EQE spectra plotted in FIG. 5A, which shows current generation occurring deeper and deeper into the infrared region as the fraction of Sn is increased. The same trend has been observed in other reports of mixed Pb:Sn systems (see, F. Hao, C. C. Stoumpos, R. P. H. Chang and M. G. Kanatzidis, *J. Am. Chem. Soc.*, 2014, 136, 8094-8099, F. Zuo, S. T. Williams, P.-W. Liang, C.-C. Chueh, C.-Y. Liao and A. K.-Y. Jen, *Adv. Mater.*, 2014, 26, 6454-6460, and C. C. Stoumpos, C. D. Malliakas and M. G. Kanatzidis, *Inorg. Chem.*, 2013, 52, 9019-9038, each of which is incorporate by reference in its entirety), however this is the first time it has been shown in devices produced with acetate precursors. By plotting the EQE as a function of photon energy rather than wavelength, the band gap can be determined in a manner similar to Tauc plots of absorption (FIGS. 36A-36I). Note that the MAPbI$_3$ curve in each plot corresponds to the control device that was fabricated in the same device set as the presented mixed-metal devices. These plots reveal that mixtures with a Sn fraction at or below 15Pb:1Sn do not show any band gap shift and maintain the 1.56 eV of MAPbI$_3$. However, the band gap observably narrows continually as the Sn fraction is increased with 7Pb:1Sn, 3Pb:1Sn, and 1Pb:1Sn mixtures yielding respective values of 1.41, 1.31, and 1.24 eV. This suggests that the Sn atoms are likely substituting the Pb ions at the B-site of the ABX$_3$ lattice. Similar plots of the EQE edge reveal that Pb:Fe, Pb:Mg, Pb:Ni, and Pb:Sr yield slightly widened band gaps for 7Pb:1B' and 3Pb:1B' mixtures (FIGS. 36A-36I and Table 11). In contrast, FIG. 5B demonstrates that introducing Co into the perovskite does not shift the EQE edge at any Pb:Co ratio, which also holds true for mixtures of Pb:Cu, Pb:Mn, and Pb:Zn (FIGS. 36A-36I and Table 11). These trends are also observed in the position of the PL emission peaks and the absorption edges presented in FIGS. 21, 22A-22D and 23A-23D. Although certain species have a greater effect than others, the ability to tune the band gap of the material provides opportunities to move beyond the p-i-n device architecture presented here towards multi-junction architectures.

Figure 5C:
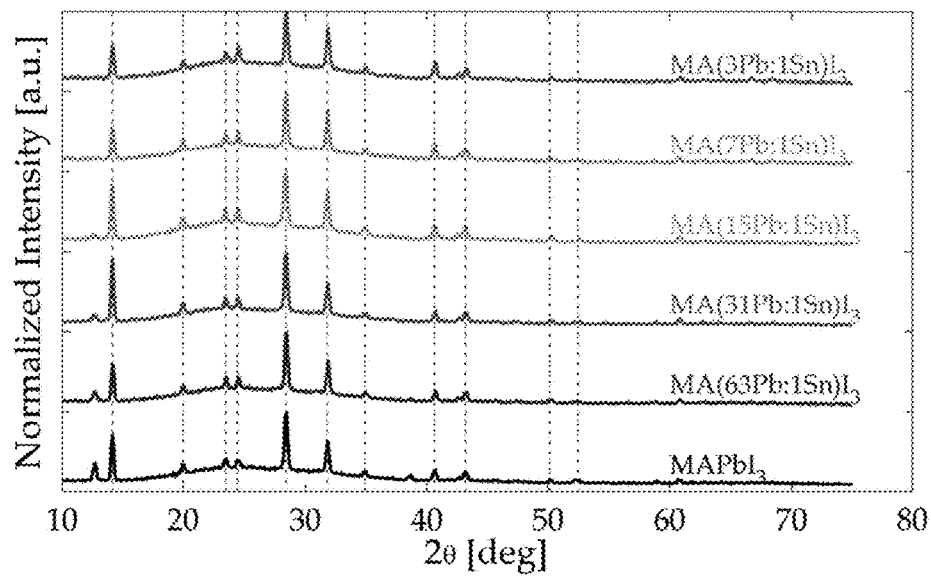
Figure 5D:
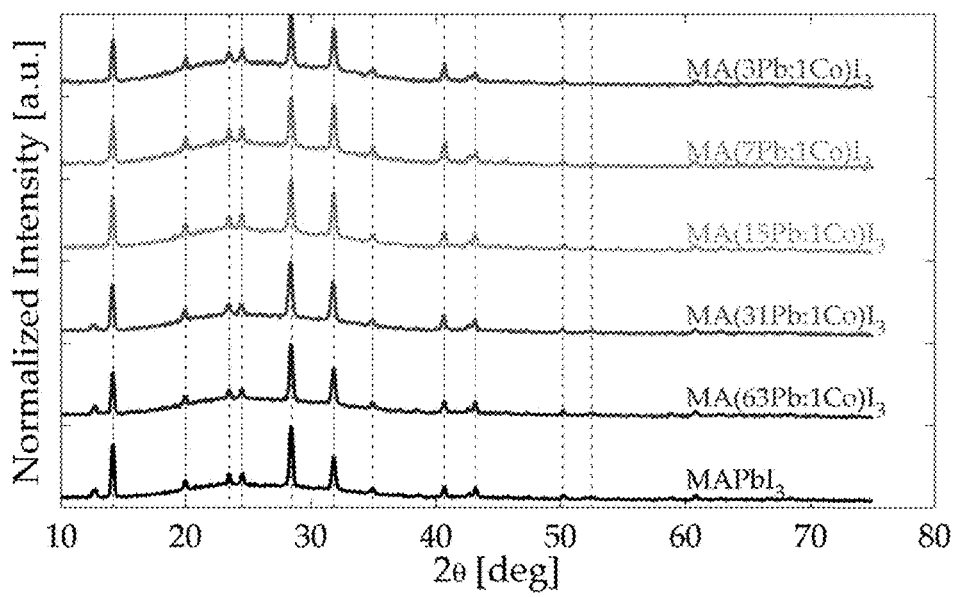

Third, as shown by the XRD spectra in FIGS. 5C and 5D, there is little perceptible shift in the XRD peak positions for both the Pb:Sn and Pb:Co mixed-metal compositions. This suggests that either the overall crystal structure is not significantly changed when 25% or less of the Pb ions are substituted at the B-site, as is likely the case with Sn, or that the material largely remains MAPbI$_3$ and the additional elements are pushed into amorphous or disorganized regions such as grain boundaries. Hence, it remains an open question whether the elements are substituting the Pb at the B-site of the perovskite crystal lattice or are located elsewhere in the film microstructure. The complete set of XRD data presented in FIGS. 24-32 and Table 9 suggests that this is true for most mixed-metal perovskite compositions, as evidenced by the general lack of peak shifts or extraneous peaks corresponding to additional secondary metal material phases. The only consistent trend found across all mixed-metal material sets is that two small PbI$_2$ peaks present at $2\theta = 12.6°$ and $38.6°$ for the MAPbI$_3$ sample continually decrease in intensity as the fraction of the secondary metal species is increased.

Figure 37B:
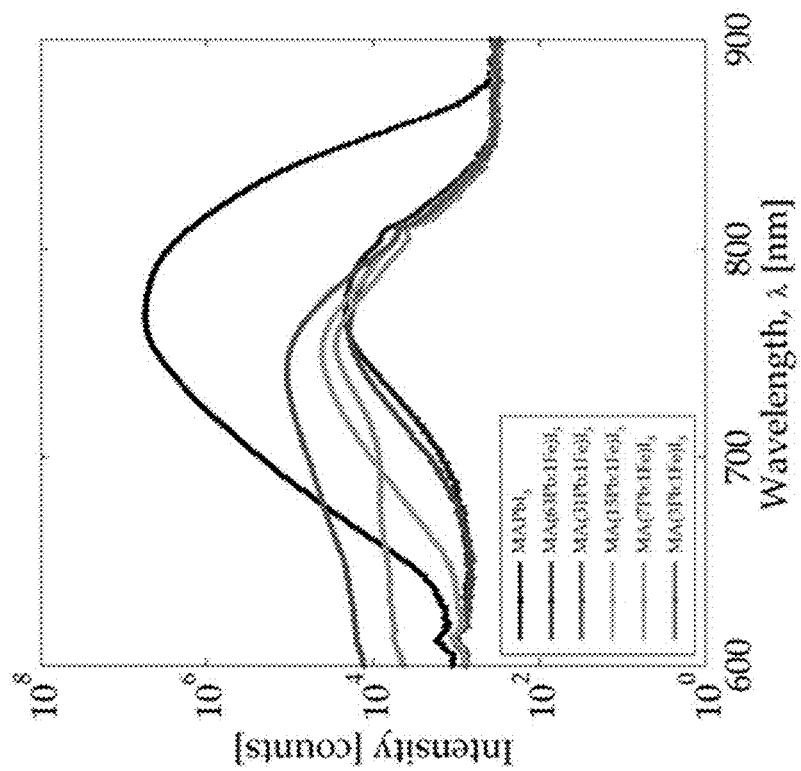
FIGS. 37A-37B show the photoluminescence emission spectra for MA(Pb:Fe)I$_3$ perovskite films by linear (FIG. 37A) and logarithmic (FIG. 37B) plots of emission intensity.
Figure 37A:
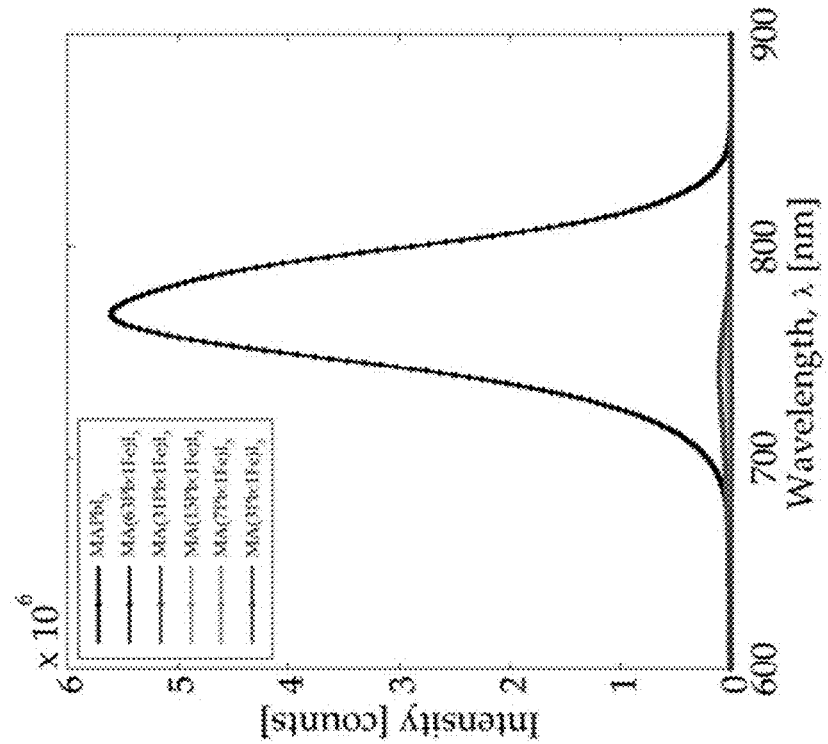

Fourth, certain metal species can have a significant impact on the photoluminescence properties of the perovskite. The most dramatic example is the case of Pb:Fe blends, where the PL intensity for every film is two orders of magnitude lower than the MAPbI$_3$ control. As shown in FIGS. 37A-37B, the PL intensity exhibits a 260-fold decrease when only $\frac{1}{64}^{th}$ of the Pb content is replaced with Fe. This suggests that an abundance of non-radiative recombination is occurring within the perovskite layer, which is consistent with the dramatic reductions in photocurrent observed with all Pb:Fe compositions (FIGS. 2A-2I and 3A-3D). It has been reported that the introduction of Fe into silicon solar cells is also detrimental to performance, as iron atoms have a large capture cross-section and preferentially trap electrons when the Fe atoms exist as interstitial or substitutional defects in the Si lattice. See, D. Macdonald and L. J. Geerligs, *Appl. Phys. Lett.*, 2004, 85, 4061-4063, which is incorporated by reference in its entirety. Although further characterization is required, it is possible that iron behaves similarly in perovskite systems.

Investigation of MA(Pb:Co)I$_3$ Compositions.

In order to shed light on the mechanisms responsible for the performance improvements observed in many of the mixed-metal perovskite compositions, additional characterization techniques were performed on the mixed-metal embodiment that demonstrated the best performance on average, MA(31Pb:1Co)I$_3$. In particular, the spatial distribution of Co atoms was gathered throughout the perovskite and how their presence influences material energetics. Since transition metals share common chemical properties, it is likely that the behavior of Co in the mixed-metal perovskite materials is representative of several other extrinsic metal species.

Figure 6A:
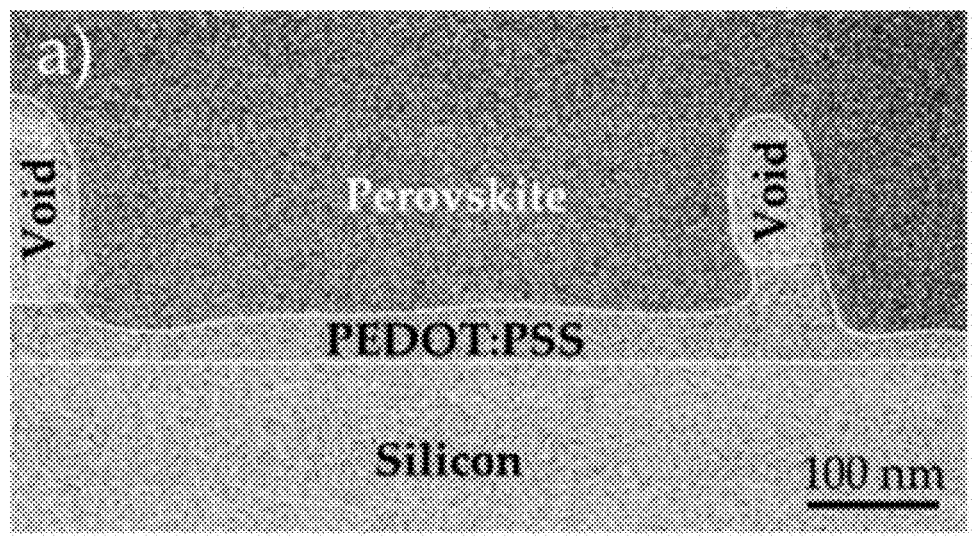
FIG. 6A shows STEM image of TEM cross-section milled from MA(31Pb:1Co)I$_3$ film with a focused ion beam. Individual elemental maps of I (FIG. 6B), Pb (FIG. 6C), and Co (FIG. 6D) indicate that the elements are distributed throughout the film thickness.
Figure 6B:
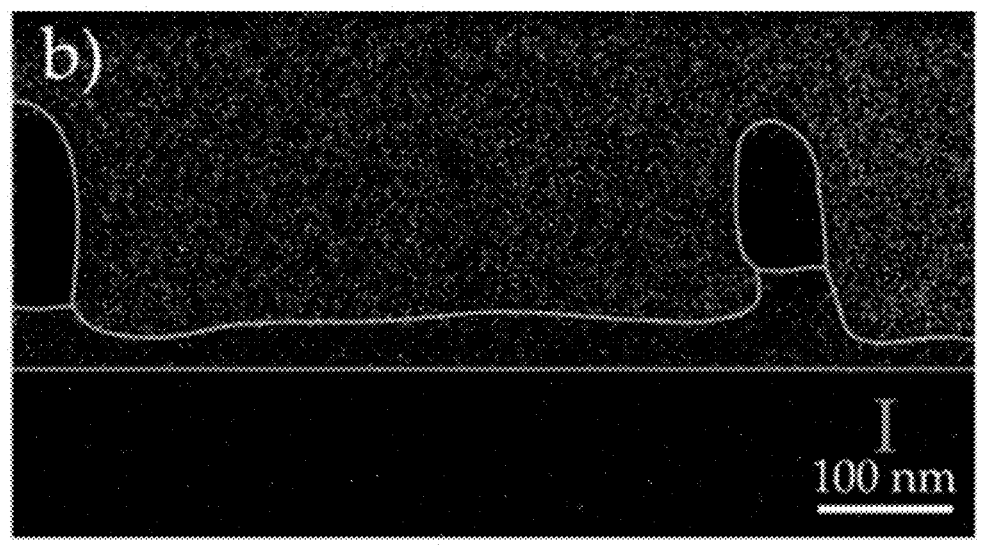
FIG. 6E shows high-resolution TEM image of the mixed-metal perovskite cross-section.
Figure 6C:
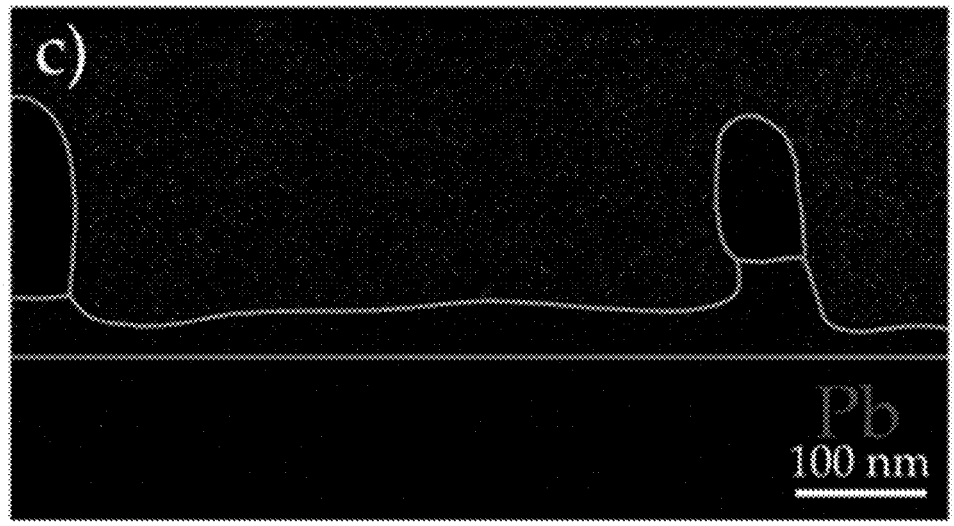
Figure 6D:
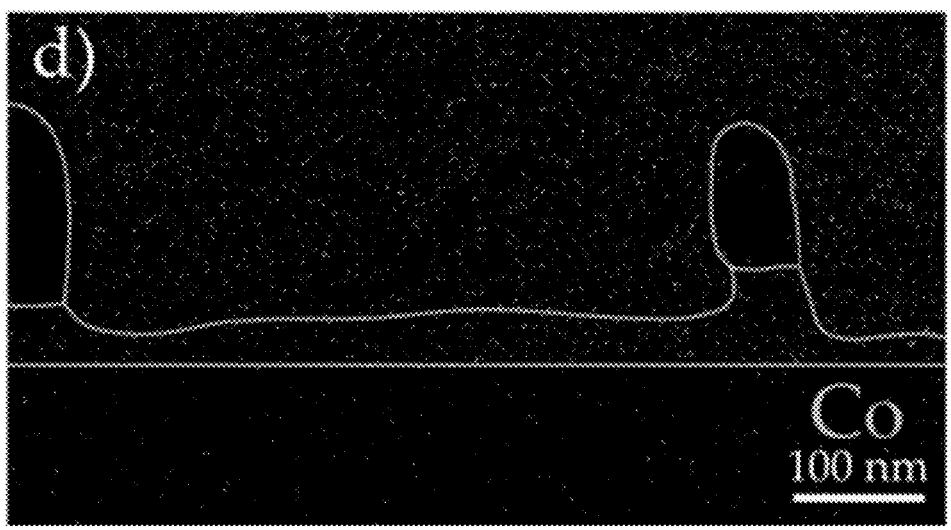
Figure 6E:
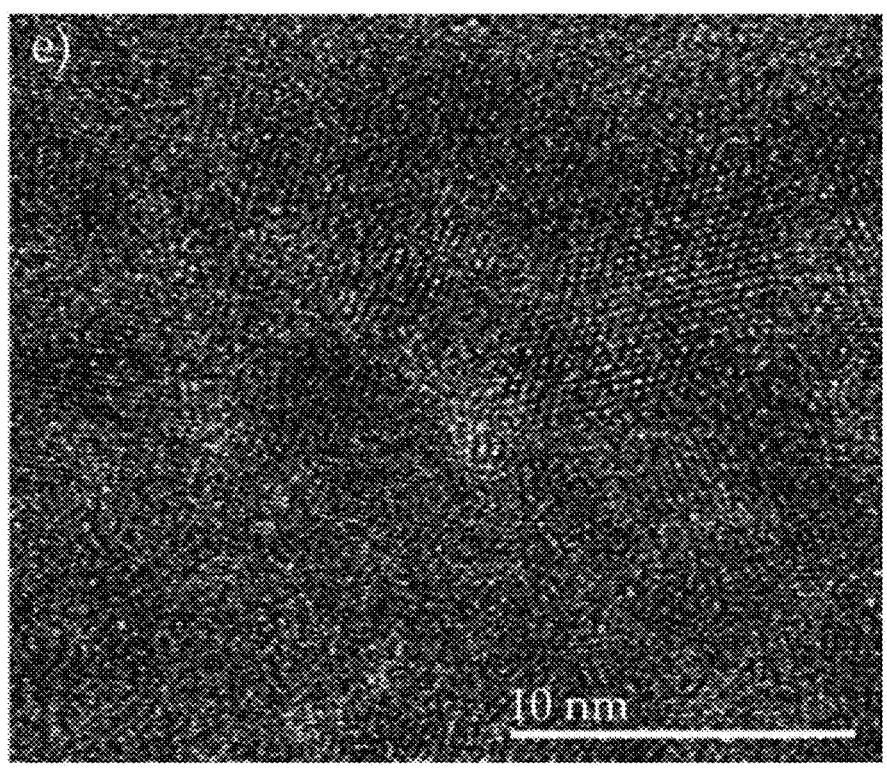
Figure 12:
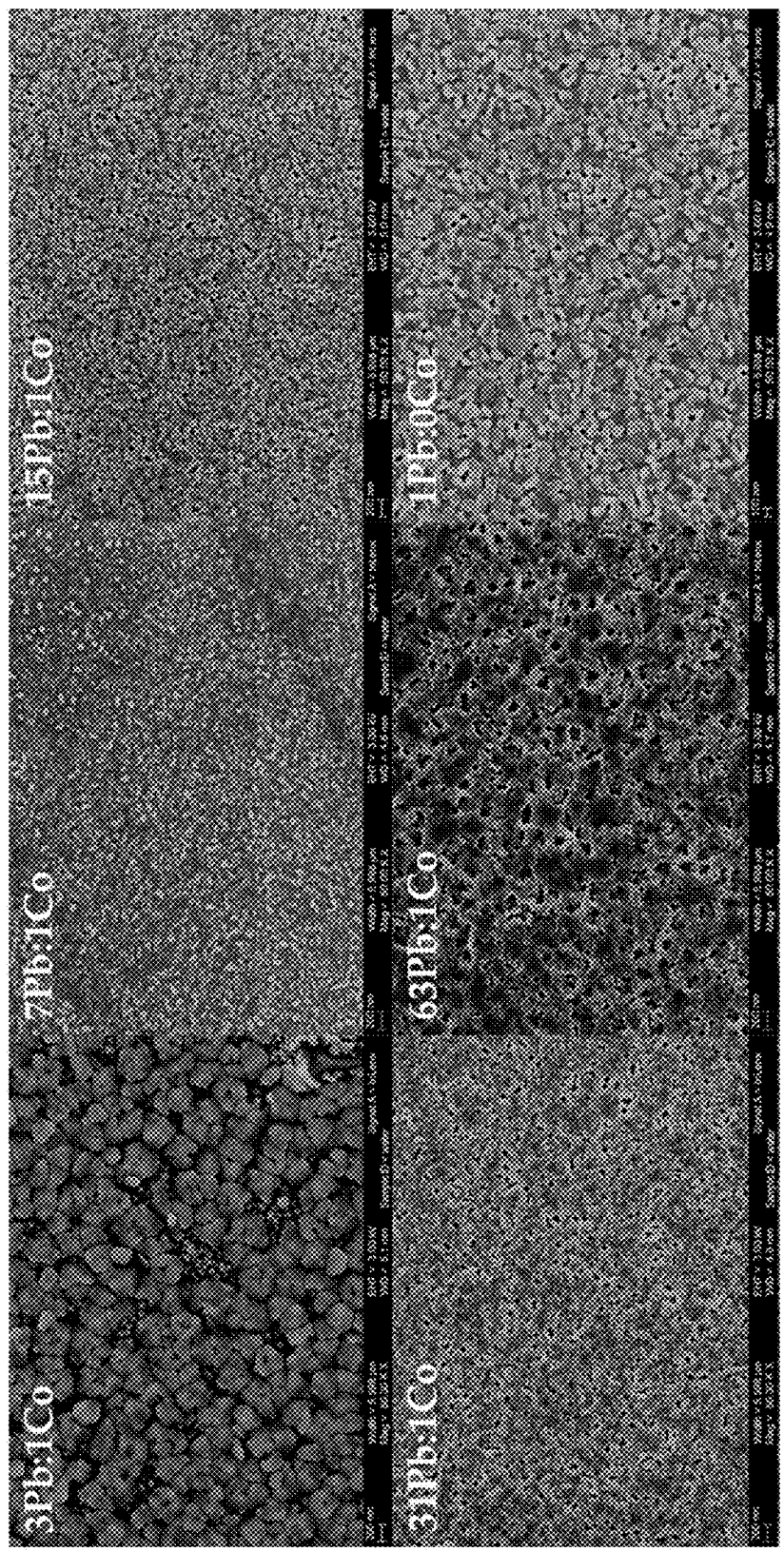
FIG. 12 shows scanning electron micrographs of MA(Pb:Co)I$_3$ perovskite films with different metal replacement fractions.
Figure 13:
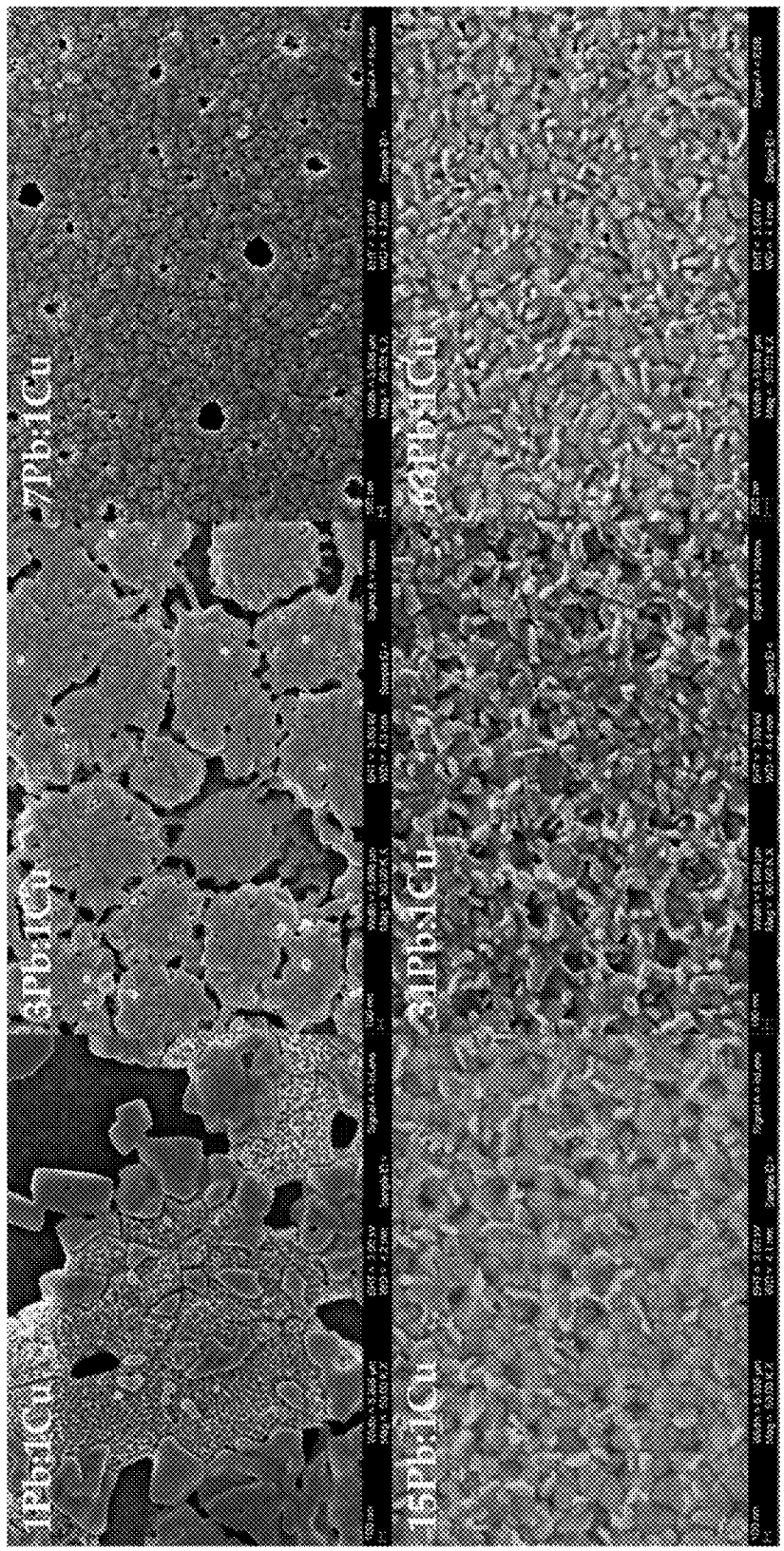
FIG. 13 shows scanning electron micrographs of MA(Pb:Cu)I$_3$ perovskite films with different metal replacement fractions.
Figure 14:
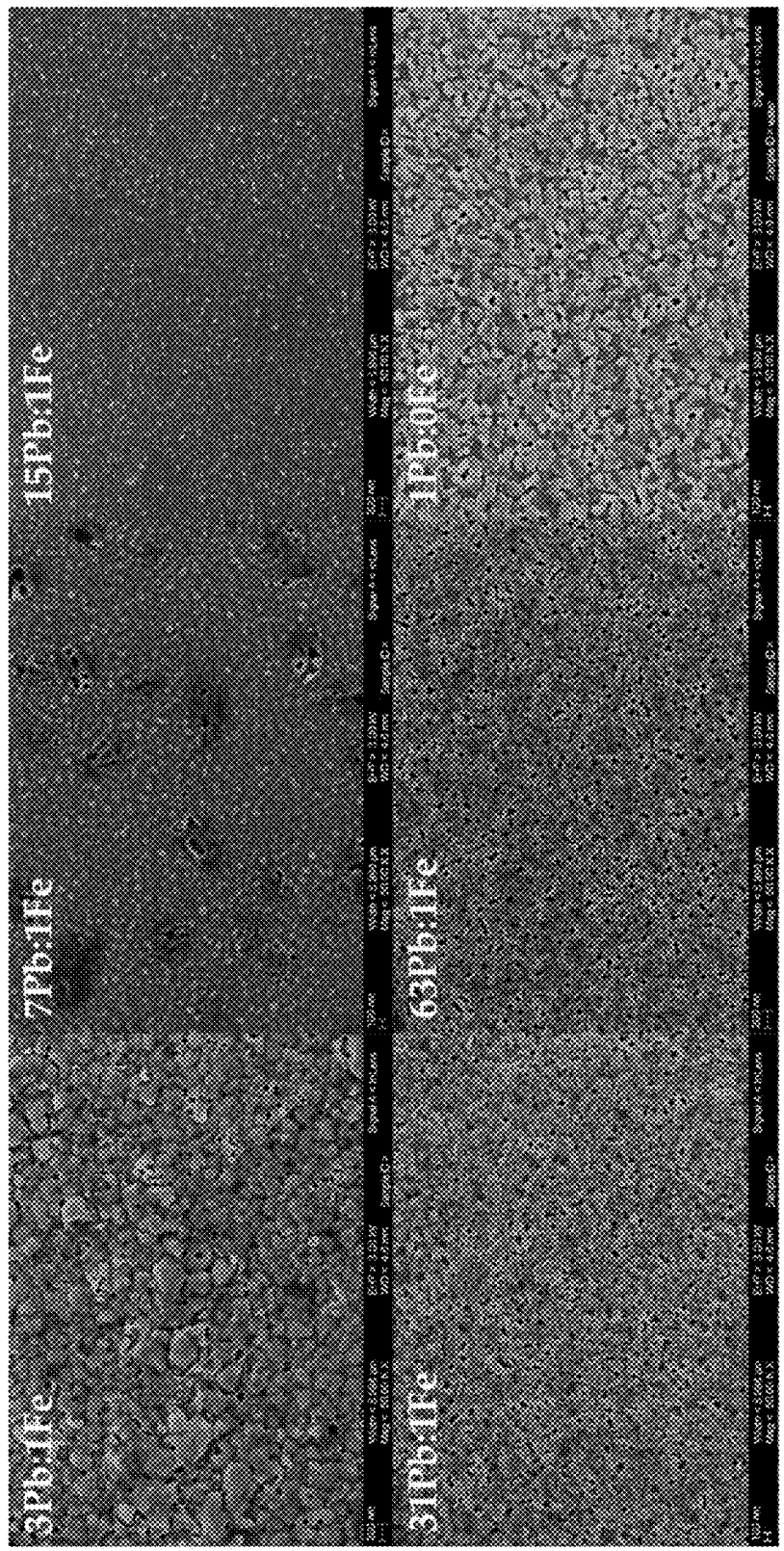
FIG. 14 shows scanning electron micrographs of MA(Pb:Fe)I$_3$ perovskite films with different metal replacement fractions.
Figure 15:
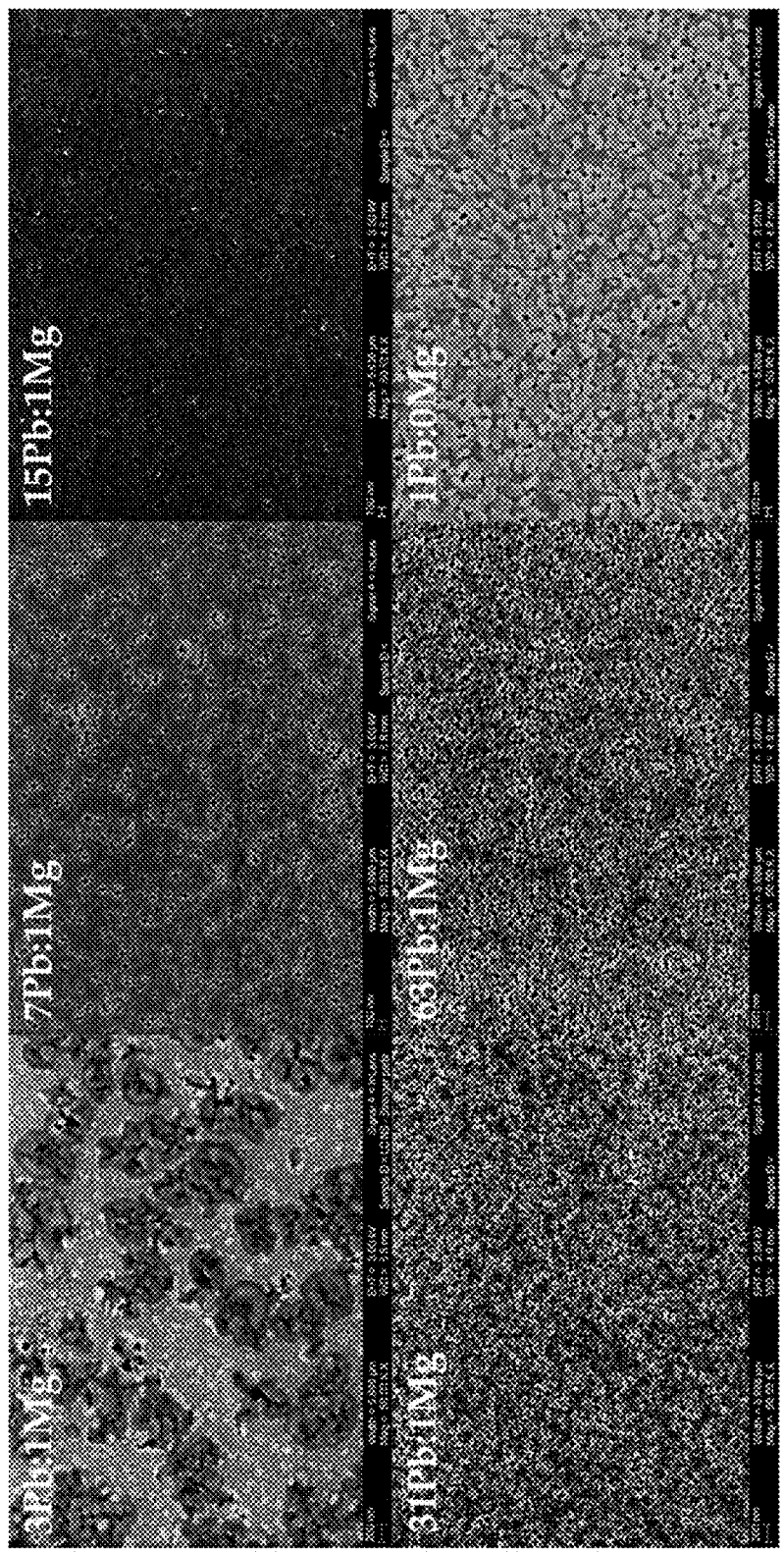
FIG. 15 shows scanning electron micrographs of MA(Pb:Mg)I$_3$ perovskite films with different metal replacement fractions.
Figure 16:
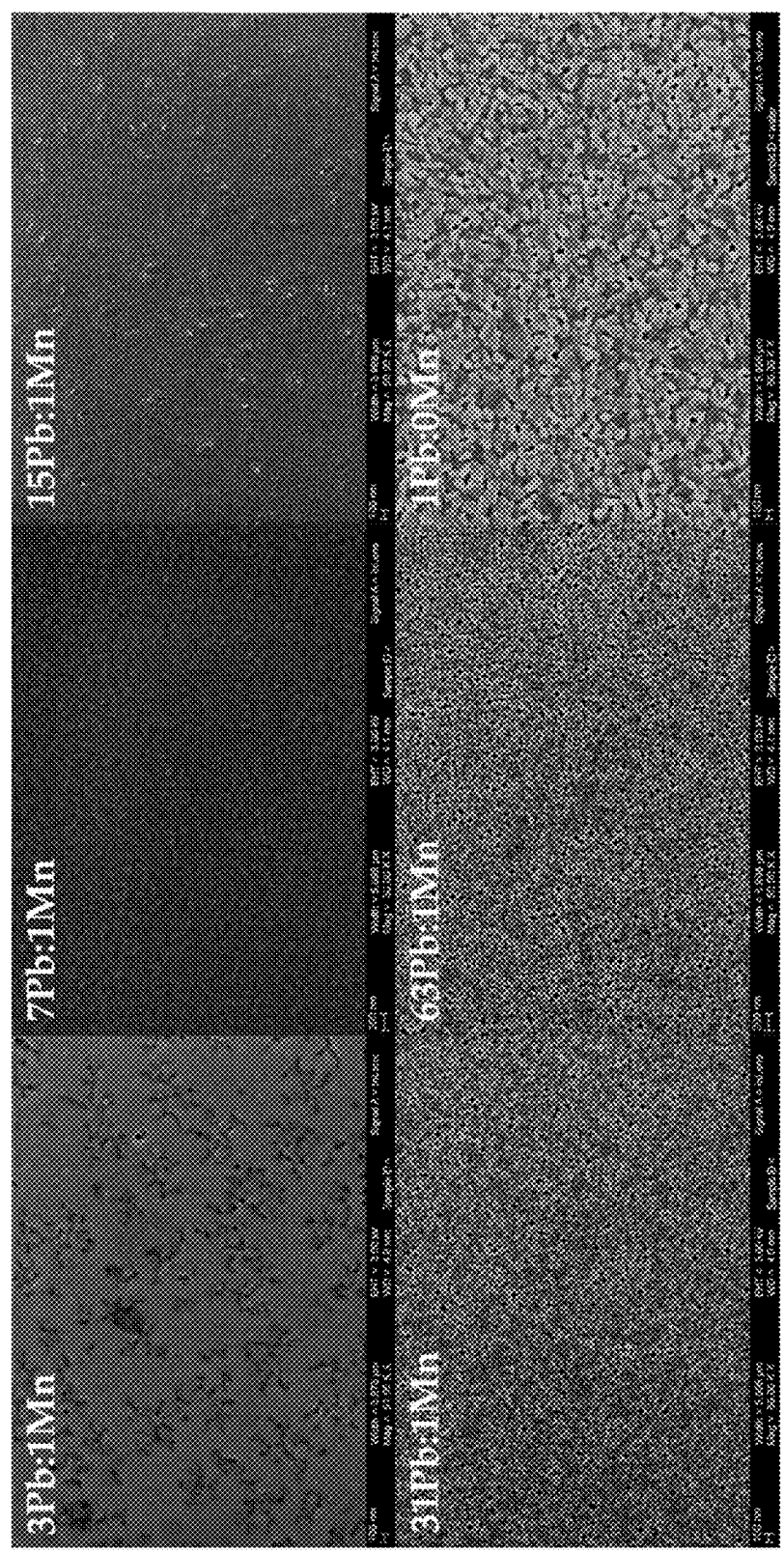
FIG. 16 shows scanning electron micrographs of MA(Pb:Mn)I$_3$ perovskite films with different metal replacement fractions.
Figure 17:
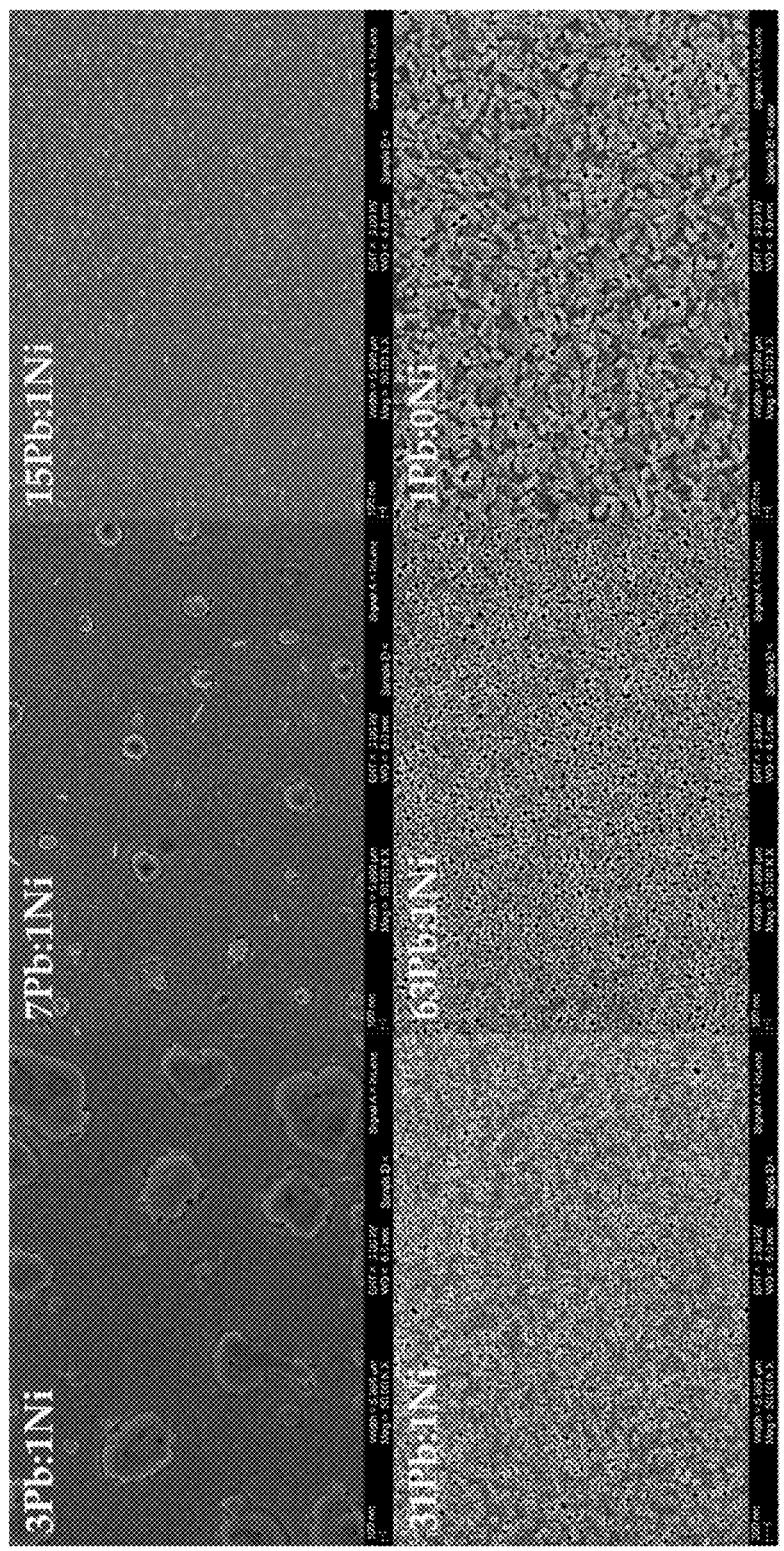
FIG. 17 shows scanning electron micrographs of MA(Pb:Ni)I$_3$ perovskite films with different metal replacement fractions.
Figure 18:
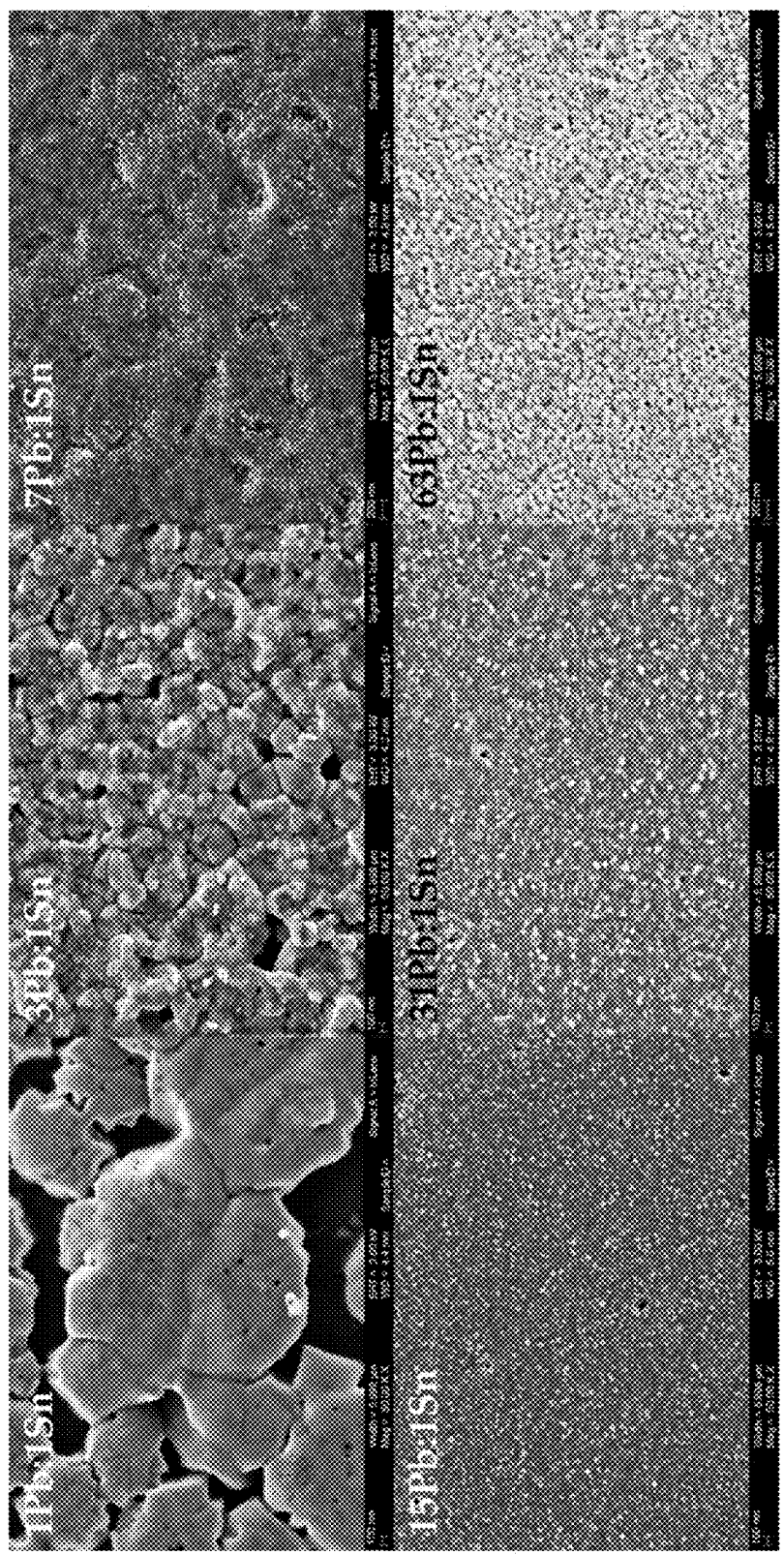
FIG. 18 shows scanning electron micrographs of MA(Pb:Sn)I$_3$ perovskite films with different metal replacement fractions.

To obtain the spatial distribution of the elements throughout the MA(31Pb:1Co)I$_3$ film, a TEM cross-section was milled from the film with a focused ion beam and examined with energy-dispersive x-ray spectroscopy (EDX). FIG. 6A presents a scanning transmission electron micrograph of the cross-section with an overlaid composite EDX map, which clearly identifies the silicon substrate, PEDOT:PSS layer, and perovskite film by color. Each layer is identified from the composite elemental maps performed with EDX in STEM mode, which provides the false color. Individual EDX maps of I, Pb, and Co throughout the film cross-section are shown in FIGS. 6B-6D, respectively. Although SEM images presented in FIG. 12 show the films contain grains around 100 nm in size, the high-resolution TEM image presented in FIG. 6E suggests that individual grains are generally composed of small crystalline regions on the order of 10 nm in size. It is evidenced by regional differences in the orientation of lattice fringes. It is clear from FIGS. 6B and 6C that Pb and I are evenly distributed throughout the perovskite layer and FIG. 6D clearly shows that the Co atoms are also dispersed throughout the film thickness. Quantitative analysis of the EDX elemental maps over the perovskite cross-section estimate the Pb:Co molar ratio as (96.4):(3.6), which is remarkably close to the expected ratio of (96.9):(3.1). Based on this observation and the set of bulk material measurements made on the MA(31Pb:1Co)I$_3$ composition, it is possible that either the Co atoms are incorporated into the perovskite lattice but have an unobservable influence on the bandgap and crystal structure measurements, or alternatively that the Co atoms are largely excluded from the MAPbI$_3$ crystal lattice and are relegated to the grain boundaries of the small crystallites presented in FIG. 6E that comprise the film. The absence of additional peaks in the XRD spectra (FIG. 5B and Table 9) suggest the Co atoms are not present in a second crystalline phase, such as CoI$_2$ or Co(OAc)$_2$. Either the Co exists at the grain boundaries as amorphous material where their presence is not detectable through XRD or the Co is substituting the Pb atoms at the B-site of the perovskite lattice but that the concentration of Co is too low to observably shift the XRD peak positions (as is the probable case for the Pb:Sn perovskite mixtures).

Figure 7:
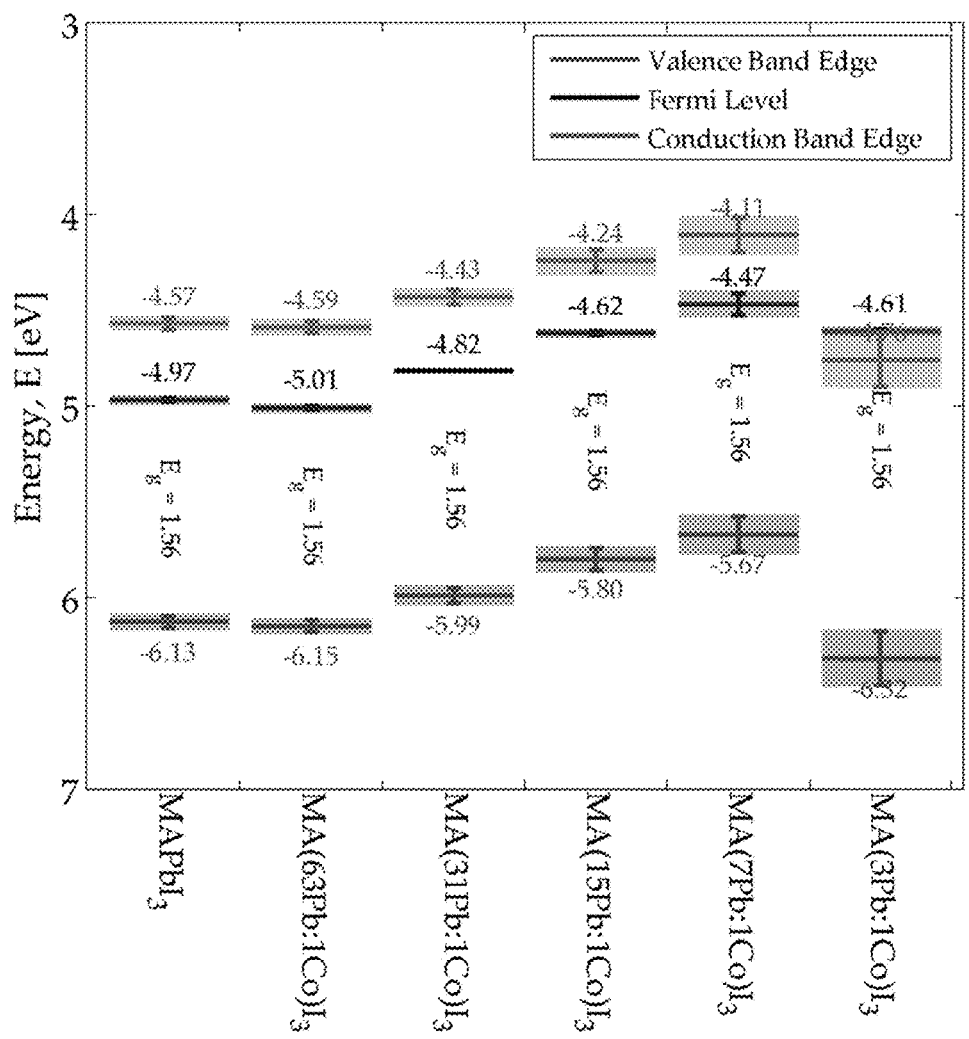
FIG. 7 shows energy levels of the MA(Pb:Co)I$_3$ materials relative to the vacuum level.

Ultraviolet photoelectron spectroscopy (UPS) measurements were performed on the set of MA(Pb:Co)I$_3$ perovskite compositions to consider how Co substitution influences the energetics of the perovskite material. The measurements (FIG. 40) directly establish both the Fermi and valence band edge (VBE) energies for each composition while the conduction band edge (CBE) energy is determined by subtracting the band gap, measured as 1.56 eV from the EQE edges (FIG. 5B) for each Pb:Co composition, from the VBE energy. The flat band energies relative to vacuum for each material are plotted in FIG. 7. The Fermi and valence band edge (VBE) energies were determined directly from ultraviolet photoelectron spectroscopy and the conduction band edge (CBE) energies were inferred using the band gap values determined from the edge of the external quantum efficiency (EQE) spectra. The UPS measurements indicate that replacing some of the Pb content with Co does influence the band edge energies even though the band gap of the perovskite film does not vary with the molar Pb:Co ratio. As the Co content is increased from 1Pb:0Co to 7Pb:1Co, the energy levels relative to the vacuum level generally shift to shallower energies. Therefore, introducing Co into the perovskite film provides a means to directly tailor the energetics of the perovskite in a manner that is decoupled from the band gap, which is a feature that has not previously been reported with perovskite systems. The UPS measurements reveal that the Fermi and VBE energies not only shift with Co introduction, but that the open-circuit voltage increases in-step with shifts toward lower work functions as the Co content is increased. Since UPS only probes the first few nanometers of the film surface, it is concluded that the presence of Co atoms at the surface of the perovskite film shifts the energetics of the material into a more favorable configuration with PEDOT:PSS (FIG. 41), thereby improving the open-circuit voltage of the corresponding devices. The bending of the perovskite band edges at the interface results from the mismatch in Fermi energies between the perovskite and PEDOT:PSS. A detailed discussion on how the energetic shifts impact the device physics and photovoltaic performance can be found in FIGS. 42A-42B.

Lastly, time-resolved photoluminescence spectroscopy (FIG. 33A) reveals an inverse correlation between photoluminescence lifetime and photovoltaic performance for the Pb:Co compositions, where the highest performing embodiments demonstrate the shortest PL lifetimes. This is unexpected since shorter lifetimes generally correspond to shorter carrier diffusion lengths (see S. D. Stranks, G. E. Eperon, G. Grancini, C. Menelaou, M. J. P. Alcocer, T. Leijtens, L. M. Herz, A. Petrozza and H. J. Snaith, *Science*, 2013, 342, 341-344, which is incorporated by reference in its entirety) and reduced photocurrent generation. Since the PL samples were deposited on glass without either PCBM or PEDOT:PSS quenching layers, the observed emission reduction is likely occurring in the bulk material rather than at the interfaces. Thus, Co appears to have a detrimental effect on the material bulk in addition to the beneficial role the UPS measurements suggests it has on the film surface. Proposed Improvement Mechanism for MA(Pb:Co)I$_3$ Compositions.

Figure 8:
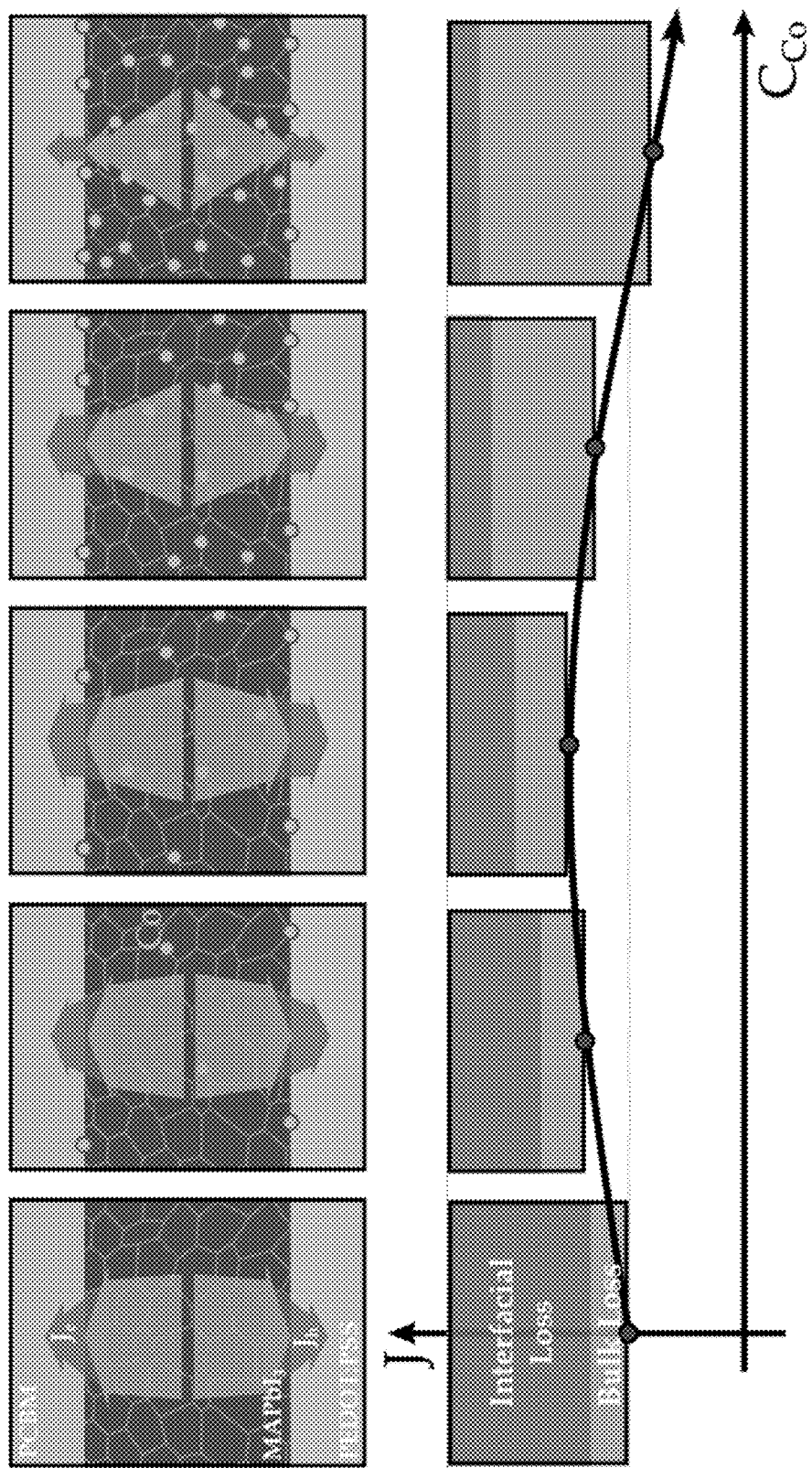
FIG. 8 shows the observed trend in photocurrent, J, for MA(Pb:Co)I$_3$ systems as a function of cobalt concentration, $C_{Co}$.

Without being limited to any particular mechanism, one explanation of the observed effect follows. Based on the aggregate of the collected data, it was proposed that the Co atoms are pushed to the grain boundaries of MAPbI$_3$ crystallites, which results in some Co atoms residing at the interfaces between the perovskite and the charge transport layers, while the remainder largely exists at the boundaries between crystallites within the film bulk. Those ions at the interface not only shift the energy levels of the perovskite films into a more favorable energetic alignment with PEDOT:PSS, but also improve current collection by passivating interfacial trap sites. Meanwhile, the Co atoms present at the crystallite boundaries in the film interior act as centers for non-radiative recombination and siphon away photocurrent, which is consistent with the PL lifetime observations. Hence, introducing Co into the perovskite film produces two effects whose competition governs photocurrent collection, a beneficial one that improves charge transfer across the interface to the selective contacts and a detrimental one that reduces charge transport efficiency through the film bulk. This proposed concept is illustrated in FIG. 8, where adding Co reduces the current loss that occurs across the interfaces between the perovskite and PEDOT:PSS or PCBM, while it simultaneously exacerbates the current loss that occurs within the bulk. This can be explained by the competition between a mechanism of beneficial trap passivation by Co atoms (violet circles) at the perovskite interface with PEDOT:PSS or PCBM and one of detrimental non-radiative recombination at Co atoms between MAPbI$_3$ crystallites in the film bulk. As $C_{Co}$ is increased, more photocurrent is lost in the bulk (orange arrows) whereas less photocurrent is lost at the interface (blue arrows). This competition is able to explain why the photocurrent initially increases with small amounts of Co but then rapidly drops with further increases in Co content. When a small amount of Co is initially introduced into the perovskite film, the increase in collection efficiency across the interface outweighs the decrease in transport efficiency in the bulk and the collected current is higher than in the baseline MAPbI$_3$ system. The interface becomes marginally more efficient as more Co is added to passivate the remaining interfacial trap sites, but the bulk becomes increasingly less efficient at transporting charges to the interfaces for collection as more Co atoms are available to intercept and quench charges during migration. Eventually enough Co atoms are present in the bulk to counteract the benefit arising from Co atoms at the interfaces, and any further increase in Co content only serves to reduce the photocurrent output by increasing the number of recombination centers in the film bulk.

According to this picture, the detrimental influence of Co only impacts the bulk because the crystalline domains of the perovskite are so small (~10 nm in size). Should the crystallite size be increased such that highly-ordered monolithic crystals are packed to form the perovskite film, then charge carriers would not cross any grain boundaries to reach the electron and hole transport layers. Some of the Co would then exist at the interfaces with the electron and hole transport layers and the remainder would sit laterally between grains where they would hardly impede the charge collection process. Hence, devices fabricated from mixed Pb:Co perovskite films with large grains may experience the benefits of Co passivation at the interfaces but largely avoid the Co recombination centers in the bulk.

An experimental screening was performed to evaluate how replacing up to 25% of the Pb content in MAPbI$_3$ perovskite films with nine different alternative, less-toxic metal species influences both material properties and photovoltaic performance. Through this systematic approach, synthesizing mixed-metal compositions was demonstrated from acetate precursors provides new avenues to modify film morphology and shift the energy levels of the perovskite film. Furthermore, the photovoltaic performance of MAPbI$_3$ generally tolerates replacing up to $\frac{1}{16}^{th}$ of the lead content with most of the considered extrinsic metal species. Notable efficiency improvements have been demonstrated upon replacing a modest portion of Pb content in the perovskite precursor solution with Co, Cu, Mg, Mn, Ni, Sr, and Zn, whereas Fe is always detrimental to photovoltaic performance. This data suggests that only Sn is able to appreciably modify the perovskite band gap and produce devices with efficiencies exceeding 9% with a 3Pb:1B' molar ratio. Unlike Sn, each of the alkaline earth and transition metal species demonstrates a content limit beyond which the photocurrent decreases precipitously. To explain this trend, a mechanism consistent with the data is proposed wherein the extrinsic alkaline earth or transition metal atoms are largely excluded from perovskite lattice and reside at the grain boundaries between perovskite crystallites. The atoms at the perovskite interfaces with the selective contacts have a passivating effect on traps that improves charge transfer efficiency across the interface, whereas those in the bulk act as recombination centers that reduce charge transport efficiency through the film interior. At low secondary metal fractions, the beneficial impact of the alternative atoms at the interface outweighs carrier quenching in the bulk, enhancing the photocurrent by passivating interfacial traps and enhancing the photovoltage by shifting the band edges to a more favorable energetic configuration with PEDOT:PSS. However, at larger secondary metal fractions, non-radiative recombination at grain boundaries in the bulk dominates and the photocurrent output by the device is dramatically decreased. Although significant performance improvements were observed in many mixed-metal systems, the findings suggest that high-performing mixed-metal MA(Pb:13')I$_3$ devices that replace more than 25% of the Pb content might be challenging to produce with secondary species outside the Group IV metals. However, it is possible that perovskites with these attributes might be achievable by replacing the methylammonium ion with more thermally stable cations, such as formamidium or cesium (see, G. E. Eperon, S. D. Stranks, C. Menelaou, M. B. Johnston, L. M. Herz and H. J. Snaith, *Energy Environ. Sci.*, 2014, 7, 982, R. J. Sutton, G. E. Eperon, L. Miranda, E. S. Parrott, B. A. Kamino, J. B. Patel, M. T. Hörantner, M. B. Johnston, A. A. Haghighirad, D. T. Moore and H. J. Snaith, *Adv. Energy Mater.*, 2016, 1502458, and G. E. Eperon, G. M. Paterno, R. J. Sutton, A. Zampetti, A. A. Haghighirad, F. Cacialli and H. J. Snaith, *J Mater Chem A*, 2015, 3, 19688-19695. each of which is incorporated by reference in its entirety), which could potentially withstand higher temperature heat treatments capable of driving the secondary species into a stable solid solution. While further experimentation is required to evaluate whether mixed-metal compositions would improve the performance of solar cells utilizing different A-site cations, device architectures, or perovskite synthesis techniques, this study presents evidence that introducing alternative metal species can have beneficial impacts on device performance and offers new opportunities to tune the morphological and electronic properties of perovskite films.

Impact of DIO Treatment of PEDOT:PSS on Photovoltaic Performance.

Figure 9:
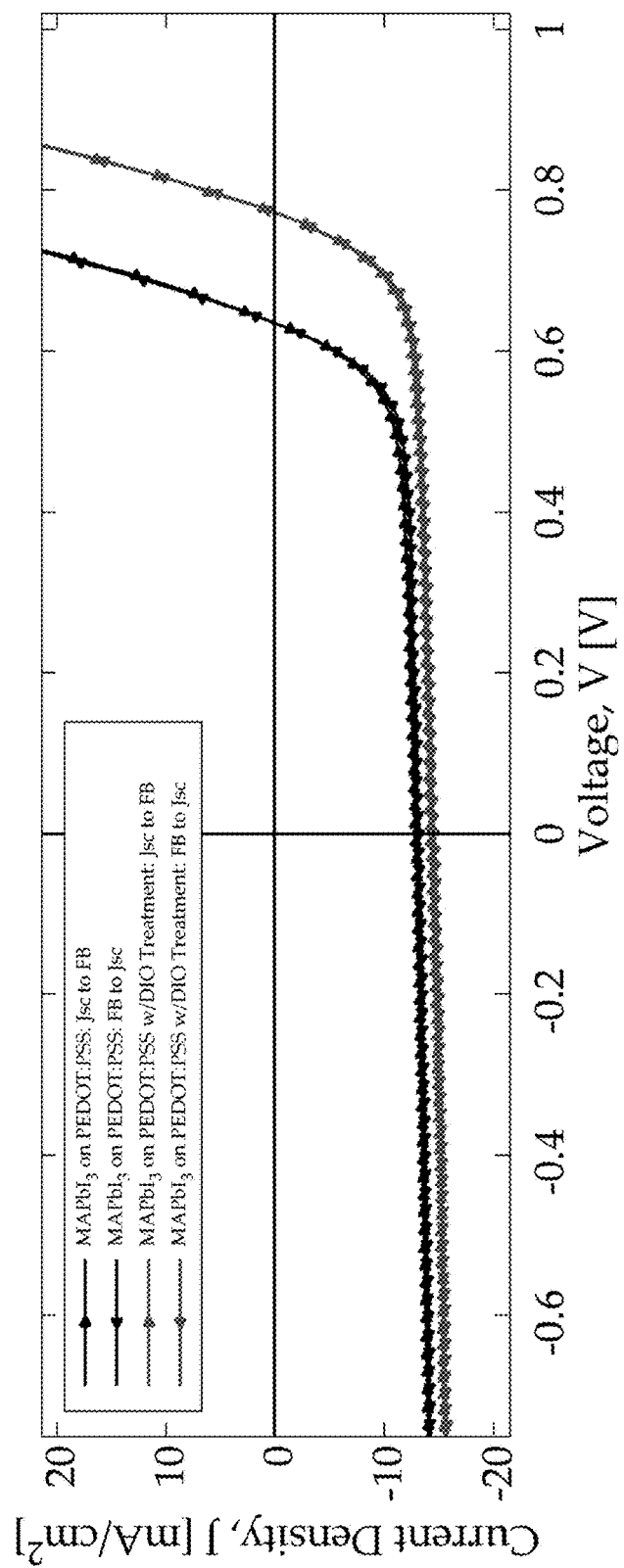
FIG. 9 shows the impact of DIO treatment of PEDOT:PSS on photovoltaic performance.

Solar cells from the same batch of devices show that treating the PEDOT:PSS layer with DIO prior to spin-coating the MAPbI$_3$ layer improves the short-circuit current and open-circuit voltage of the device compared to devices fabricated without the DIO treatment (FIG. 9). As is shown in the representative JV characteristics of FIG. 9 and the average performance metrics of Table 2, treating the PEDOT:PSS with a dilute solution of 1,8-diiodooctane (DIO) in chlorobenzene (CB) prior to spin-coating the perovskite solution improves the short-circuit current and open-circuit voltage of the solar cell.

TABLE 2

The average performance metrics for a batches of devices synthesized with or without DIO treatment of the PEDOT:PSS layer prior to perovskite deposition. Average values and standard deviation are calculated from a set of 44 individual solar cells.

| Treatment | $J_{sc}$ [mA/cm$^2$] | $V_{oc}$ [mV] | FF [%] | PCE [%] |
|---|---|---|---|---|
| MAPbI$_3$ on PEDOT:PSS | 13.27 ± 0.86 | 0.63 ± 0.05 | 63.68 ± 9.88 | 5.39 ± 1.13 |
| MAPbI$_3$ on PEDOT:PSS w/DIO Treatment | 16.02 ± 1.62 | 0.67 ± 0.07 | 67.53 ± 2.54 | 7.27 ± 1.18 |

Mixed-Metal Perovskite Film Thicknesses.

The film thickness of typical perovskite films for each mixed-metal composition is presented in Table 3. Mixed-metal films with low secondary metal fractions have film thicknesses comparable to that of MAPbI$_3$. However, often the film thicknesses and roughness increase substantially for 3Pb:1B' and 1Pb:1B' compositions due to the formation of morphologies with large and isolated grains, as shown in the scanning electron micrographs (SEM) of FIGS. 12-20.

TABLE 3

Typical film thicknesses for each mixed-metal composition as measured with a profilometer.

| | Film Thickness, $t_{film}$ [nm] | | | | | |
|---|---|---|---|---|---|---|
| Material | 63Pb:1B' | 31Pb:1B' | 15Pb:1B' | 7Pb:1B' | 3Pb:1B' | 1Pb:1B' |
| Pb Only | | | 290.0 | | | |
| Pb:Co | 302.2 | 309.4 | 314.8 | 315.9 | 403.9 | — |
| Pb:Cu | 320.8 | 314.5 | 302.7 | 312.0 | 337.8 | 443.0 |
| Pb:Fe | 298.9 | 319.4 | 302.5 | 301.2 | 327.3 | — |
| Pb:Mg | 288.0 | 296.3 | 319.1 | 305.2 | 406.8 | — |
| Pb:Mn | 307.0 | 279.5 | 323.2 | 310.4 | 412.1 | — |
| Pb:Ni | 307.5 | 305.2 | 311.7 | 327.1 | 409.9 | — |
| Pb:Sn | 296.1 | 323.1 | 328.5 | 331.9 | 383.3 | 369.7 |
| Pb:Sr | 302.0 | 296.5 | 347.9 | 320.5 | 375.8 | — |
| Pb:Zn | 292.5 | 290.9 | 299.4 | 313.4 | 319.8 | — |
| Pb:DMF | 287.0 | 289.0 | 256.9 | 242.3 | 185.1 | 100.1 |

Tabulated Performance Metrics for Mixed-Metal Perovskite Solar Cells.

The champion and average photovoltaic performance metrics for each mixed-metal composition from a set of at least 36 individual solar cells produced from at least two different device batches are reported in Tables 4 and 5, respectively.

TABLE 4

The best measured performance metrics for each mixed-metal perovskite composition. $J_{sc}$, $V_{oc}$, and FF do not necessarily correspond to the device with the champion PCE.

| Material | 63Pb:1B' | 31Pb:1B' | 15Pb:1B' | 7Pb:1B' | 3Pb:1B' |
|---|---|---|---|---|---|
| Best Short-Circuit Current Density, $J_{sc}$ [mA/cm$^2$] | | | | | |
| Pb Only | | | 18.97 | | |
| Pb:Co | 19.82 | 19.06 | 17.00 | 14.35 | 9.57 |
| Pb:Cu | 18.19 | 16.26 | 14.57 | 15.24 | 19.10 |
| Pb:Fe | 4.94 | 4.97 | 4.29 | 0.04 | 0.91 |
| Pb:Mg | 15.76 | 16.39 | 14.91 | 4.06 | 1.86 |
| Pb:Mn | 17.25 | 17.31 | 15.01 | 6.18 | 1.39 |
| Pb:Ni | 18.40 | 15.31 | 13.24 | 0.33 | 0.13 |
| Pb:Sn | 11.62 | 14.14 | 12.22 | 15.69 | 20.40 |
| Pb:Sr | 19.17 | 17.71 | 12.89 | 1.96 | 0.38 |
| Pb:Zn | 19.71 | 18.18 | 16.61 | 16.99 | 13.19 |
| Best Open-Circuit Voltage, $V_{oc}$ [V] | | | | | |
| Pb Only | | | 0.82 | | |
| Pb:Co | 0.85 | 0.87 | 0.89 | 0.94 | 0.84 |
| Pb:Cu | 0.93 | 0.94 | 0.87 | 0.80 | 0.86 |
| Pb:Fe | 0.68 | 0.73 | 0.84 | 0.57 | 0.77 |
| Pb:Mg | 0.92 | 0.91 | 0.73 | 0.96 | 0.94 |
| Pb:Mn | 0.91 | 0.88 | 0.74 | 0.96 | 1.01 |
| Pb:Ni | 0.91 | 0.85 | 0.85 | 0.4 | 0.52 |
| Pb:Sn | 0.46 | 0.71 | 0.50 | 0.68 | 0.73 |
| Pb:Sr | 0.88 | 0.84 | 0.84 | 1.02 | 1.11 |
| Pb:Zn | 0.89 | 0.88 | 0.65 | 0.82 | 0.70 |
| Best Fill Factor, FF [%] | | | | | |
| Pb Only | | | 72.14 | | |
| Pb:Co | 74.10 | 76.11 | 71.04 | 68.82 | 54.34 |
| Pb:Cu | 66.55 | 61.29 | 61.01 | 62.88 | 66.16 |
| Pb:Fe | 64.67 | 63.03 | 66.59 | 26.21 | 36.90 |
| Pb:Mg | 75.10 | 72.61 | 70.36 | 68.95 | 48.63 |
| Pb:Mn | 70.65 | 67.50 | 70.19 | 73.58 | 59.52 |
| Pb:Ni | 76.62 | 71.94 | 59.38 | 56.51 | 54.77 |
| Pb:Sn | 63.25 | 57.44 | 51.14 | 60.36 | 70.94 |
| Pb:Sr | 75.37 | 71.69 | 70.90 | 66.82 | 65.90 |
| Pb:Zn | 73.19 | 73.02 | 72.98 | 73.78 | 73.03 |
| Best Power Conversion Efficiency, PCE [%] | | | | | |
| Pb Only | | | 10.27 | | |
| Pb:Co | 11.37 | 11.11 | 10.21 | 8.66 | 4.14 |
| Pb:Cu | 10.14 | 8.37 | 6.57 | 5.46 | 8.29 |
| Pb:Fe | 1.78 | 1.75 | 2.29 | 0.01 | 0.22 |
| Pb:Mg | 9.37 | 9.71 | 7.11 | 1.74 | 0.76 |
| Pb:Mn | 10.38 | 10.02 | 7.17 | 4.30 | 0.68 |
| Pb:Ni | 9.95 | 8.53 | 6.01 | 0.06 | 0.04 |
| Pb:Sn | 2.32 | 5.30 | 2.38 | 4.89 | 9.25 |
| Pb:Sr | 10.81 | 9.29 | 5.58 | 1.16 | 0.21 |
| Pb:Zn | 10.62 | 10.41 | 7.69 | 9.88 | 6.04 |

TABLE 5

The compiled average performance metrics of planar mixed-metals for each composition. Error corresponds to the standard deviation.

| Material | 63Pb:1B' | 31Pb:1B' | 15Pb:1B' | 7Pb:1B' | 3Pb:1B' |
|---|---|---|---|---|---|
| Mean Short-Circuit Current Density, $J_{sc}$ [mA/cm$^2$] | | | | | |
| Pb Only  |               |               | 16.02 ± 1.62  |               |               |
| Pb:Co    | 18.15 ± 0.71  | 16.89 ± 0.86  | 15.54 ± 1.12  | 12.25 ± 0.96  | 5.00 ± 1.20   |
| Pb:Cu    | 16.18 ± 0.96  | 13.91 ± 1.46  | 12.81 ± 0.99  | 12.28 ± 1.84  | 13.07 ± 2.72  |
| Pb:Fe    | 3.79 ± 0.64   | 2.95 ± 1.61   | 3.88 ± 0.19   | 0.02 ± 0.01   | 0.28 ± 0.34   |
| Pb:Mg    | 14.94 ± 0.67  | 13.36 ± 1.73  | 11.64 ± 2.22  | 1.78 ± 1.47   | 0.60 ± 0.84   |
| Pb:Mn    | 14.68 ± 1.07  | 14.78 ± 1.20  | 13.33 ± 0.81  | 2.11 ± 1.87   | 0.75 ± 0.48   |
| Pb:Ni    | 14.82 ± 1.90  | 12.90 ± 0.99  | 9.63 ± 1.90   | 0.14 ± 0.10   | 0.06 ± 0.04   |
| Pb:Sn    | 8.33 ± 2.22   | 11.59 ± 2.29  | 8.80 ± 2.47   | 13.16 ± 2.20  | 15.92 ± 2.49  |
| Pb:Sr    | 17.16 ± 1.12  | 15.03 ± 2.06  | 10.60 ± 2.13  | 1.62 ± 0.14   | 0.25 ± 0.08   |
| Pb:Zn    | 17.66 ± 1.06  | 16.60 ± 0.80  | 15.94 ± 0.44  | 15.86 ± 0.69  | 5.35 ± 3.44   |
| Mean Open-Circuit Voltage, $V_{oc}$ [V] | | | | | |
| Pb Only  |               |               | 0.67 ± 0.07   |               |               |
| Pb:Co    | 0.78 ± 0.04   | 0.82 ± 0.03   | 0.87 ± 0.01   | 0.92 ± 0.02   | 0.72 ± 0.06   |
| Pb:Cu    | 0.91 ± 0.01   | 0.92 ± 0.01   | 0.76 ± 0.13   | 0.58 ± 0.15   | 0.62 ± 0.13   |
| Pb:Fe    | 0.67 ± 0.01   | 0.68 ± 0.03   | 0.82 ± 0.01   | 0.47 ± 0.08   | 0.65 ± 0.19   |
| Pb:Mg    | 0.84 ± 0.04   | 0.76 ± 0.08   | 0.65 ± 0.05   | 0.91 ± 0.15   | 0.67 ± 0.21   |
| Pb:Mn    | 0.79 ± 0.07   | 0.79 ± 0.05   | 0.70 ± 0.02   | 0.91 ± 0.07   | 0.91 ± 0.09   |
| Pb:Ni    | 0.84 ± 0.04   | 0.84 ± 0.00   | 0.80 ± 0.03   | 0.32 ± 0.00   | 0.32 ± 0.12   |
| Pb:Sn    | 0.38 ± 0.04   | 0.43 ± 0.15   | 0.33 ± 0.06   | 0.49 ± 0.06   | 0.69 ± 0.02   |
| Pb:Sr    | 0.78 ± 0.06   | 0.75 ± 0.05   | 0.65 ± 0.07   | 0.95 ± 0.04   | 1.03 ± 0.04   |
| Pb:Zn    | 0.78 ± 0.07   | 0.75 ± 0.07   | 0.63 ± 0.02   | 0.78 ± 0.04   | 0.66 ± 0.02   |
| Mean Fill Factor, FF [%] | | | | | |
| Pb Only  |               |               | 67.53 ± 2.54  |               |               |
| Pb:Co    | 63.33 ± 11.91 | 71.43 ± 2.04  | 66.99 ± 2.91  | 64.19 ± 5.42  | 47.61 ± 9.65  |
| Pb:Cu    | 62.49 ± 2.61  | 53.72 ± 3.17  | 52.03 ± 5.95  | 55.51 ± 4.55  | 47.70 ± 3.99  |
| Pb:Fe    | 60.25 ± 3.43  | 53.47 ± 4.94  | 62.44 ± 2.70  | 21.39 ± 1.75  | 23.06 ± 6.10  |
| Pb:Mg    | 66.41 ± 5.78  | 69.20 ± 2.14  | 67.12 ± 1.43  | 52.63 ± 10.61 | 40.80 ± 5.11  |
| Pb:Mn    | 67.24 ± 2.45  | 64.35 ± 1.56  | 67.04 ± 1.59  | 63.32 ± 8.40  | 47.58 ± 9.12  |
| Pb:Ni    | 67.83 ± 6.01  | 64.52 ± 6.03  | 55.04 ± 3.33  | 49.46 ± 4.97  | 46.45 ± 6.01  |
| Pb:Sn    | 53.39 ± 4.89  | 50.29 ± 5.06  | 44.63 ± 3.81  | 44.81 ± 5.29  | 57.87 ± 12.05 |
| Pb:Sr    | 69.60 ± 2.99  | 69.97 ± 0.83  | 68.12 ± 4.27  | 60.05 ± 4.48  | 53.38 ± 10.95 |
| Pb:Zn    | 70.73 ± 1.62  | 71.49 ± 0.82  | 69.32 ± 2.56  | 70.94 ± 1.93  | 67.95 ± 5.75  |
| Mean Power Conversion Efficiency, PCE [%] | | | | | |
| Pb Only  |               |               | 7.27 ± 1.18   |               |               |
| Pb:Co    | 9.03 ± 1.91   | 9.88 ± 0.69   | 9.06 ± 0.61   | 7.23 ± 0.82   | 1.73 ± 0.61   |
| Pb:Cu    | 9.18 ± 0.60   | 6.89 ± 0.93   | 5.12 ± 1.28   | 3.87 ± 0.82   | 4.00 ± 1.81   |
| Pb:Fe    | 1.51 ± 0.17   | 1.08 ± 0.60   | 1.98 ± 0.17   | 0.00 ± 0.00   | 0.06 ± 0.08   |
| Pb:Mg    | 8.35 ± 0.56   | 7.09 ± 1.45   | 5.15 ± 1.25   | 0.77 ± 0.54   | 0.24 ± 0.34   |
| Pb:Mn    | 7.87 ± 1.19   | 7.57 ± 1.18   | 6.26 ± 0.49   | 1.33 ± 1.28   | 0.37 ± 0.25   |
| Pb:Ni    | 8.40 ± 0.78   | 6.98 ± 0.84   | 4.28 ± 0.97   | 0.02 ± 0.02   | 0.01 ± 0.01   |
| Pb:Sn    | 1.63 ± 0.32   | 2.61 ± 1.34   | 1.38 ± 0.58   | 2.99 ± 0.91   | 6.51 ± 2.10   |
| Pb:Sr    | 9.26 ± 0.74   | 7.91 ± 1.00   | 4.66 ± 0.82   | 0.92 ± 0.10   | 0.13 ± 0.04   |
| Pb:Zn    | 9.69 ± 0.51   | 8.92 ± 0.79   | 7.02 ± 0.50   | 8.83 ± 0.94   | 2.43 ± 1.65   |

Perovskite Control Devices.

Two sets of control devices were fabricated to investigate how sensitive the device performance is to two other variables in the fabrication conditions: the concentration of the perovskite solution and the molar ratio of MAI:Pb(OAc)$_2$. These conditions are labelled as Pb:DMF and Pb:MAI mixtures in the same manner used for the mixed-metal compositions. These controls are intended to evaluate whether two possible events happen during the fabrication process of the mixed-metal perovskite compositions:

1. Pb:DMF is intended to evaluate how a device would perform if the B'(OAc)$_2$ and its corresponding MAI molecules do not become incorporated in the film. Although it is unlikely, one could imagine that the B'(OAc)$_2$ and any excess MAI might evaporate out of the film, should that compound be sufficiently volatile. Hence, the remaining film would be pure MAPbI$_3$ but would be thinned since a lower amount of Pb salt was included in the original perovskite solution. This situation is simulated by diluting the initial 0.8 M Pb(OAc)$_2$ and 2.4 M MAI solution with the appropriate amount of DMF.

2. Pb:MAI is intended to evaluate how a device would perform in the event that MAI is unsuccessful at detaching the acetate ions from the B'$^{2+}$ ions. In this situation, the molar ratio between MAI and Pb(OAc)$_2$ would become higher than 3:1. By intentionally changing this ratio, the impact of a stoichiometric mismatch between MAPbI$_3$ precursors on device performance was evaluated.

For each of these conditions several devices were fabricated and tested in the same manner as the devices with mixed-metal compositions. However, instead of using a solution of 2.4 M MAI and 0.8M B'(OAc)$_2$ in DMF to replace part of the lead content, neat DMF was used for the Pb:DMF cases and 2.4 M MAI in DMF was used for the Pb:MAI cases. The photovoltaic performance statistics, champion JV curves, and the EQE spectra for both of these control sets are shown in FIGS. 10A-10D. Likewise, the average and champion performance metrics for both of these controls are tabulated in Tables 6 and 7, respectively.

For each set of controls, the usual MAPbI$_3$ device performed better on average than any of the control conditions. This demonstrates that both the 3:1 MAI:Pb(OAc)$_2$ molar ratio and the concentration of the perovskite solution have been properly optimized to maximize photovoltaic power conversion efficiency for the pure Pb baseline devices. As expected, the Pb:DMF devices supply lower currents as the perovskite solution becomes increasingly dilute since thinner perovskite films, as shown in Table 3, are formed on the substrate. Thinner films also produce slightly higher fill factors since charge carriers generated in the bulk of the film have a shorter distance to travel to the electrodes and have less grain boundaries to pass through, which results in lower series resistances.

The Pb:MAI cases are more interesting because they display similar trends to those observed in the mixed-metal compositions: the voltage generally increases with higher levels of replacement until the 3Pb:1MAI condition, while the current sees a precipitous drop after 7Pb:1MAI. The main difference between this set and the mixed-metal compositions is that the average performance does not improve above the baseline efficiency. However, the 15Pb:1MAI case did once produce an 11% efficient solar cell, which outperforms the champion baseline MAPbI$_3$ device. This finding does suggest that the performance of the solar cell is very sensitive to the stoichiometric ratio of the MAI to acetate precursor materials, which is often difficult to precisely control since both the acetate salts and MAI materials are hygroscopic and the actual water content in the salts when massed is not known. Subsequent attempts failed to reproduce this 11% performance in four separate device batches.

Figure 10A:
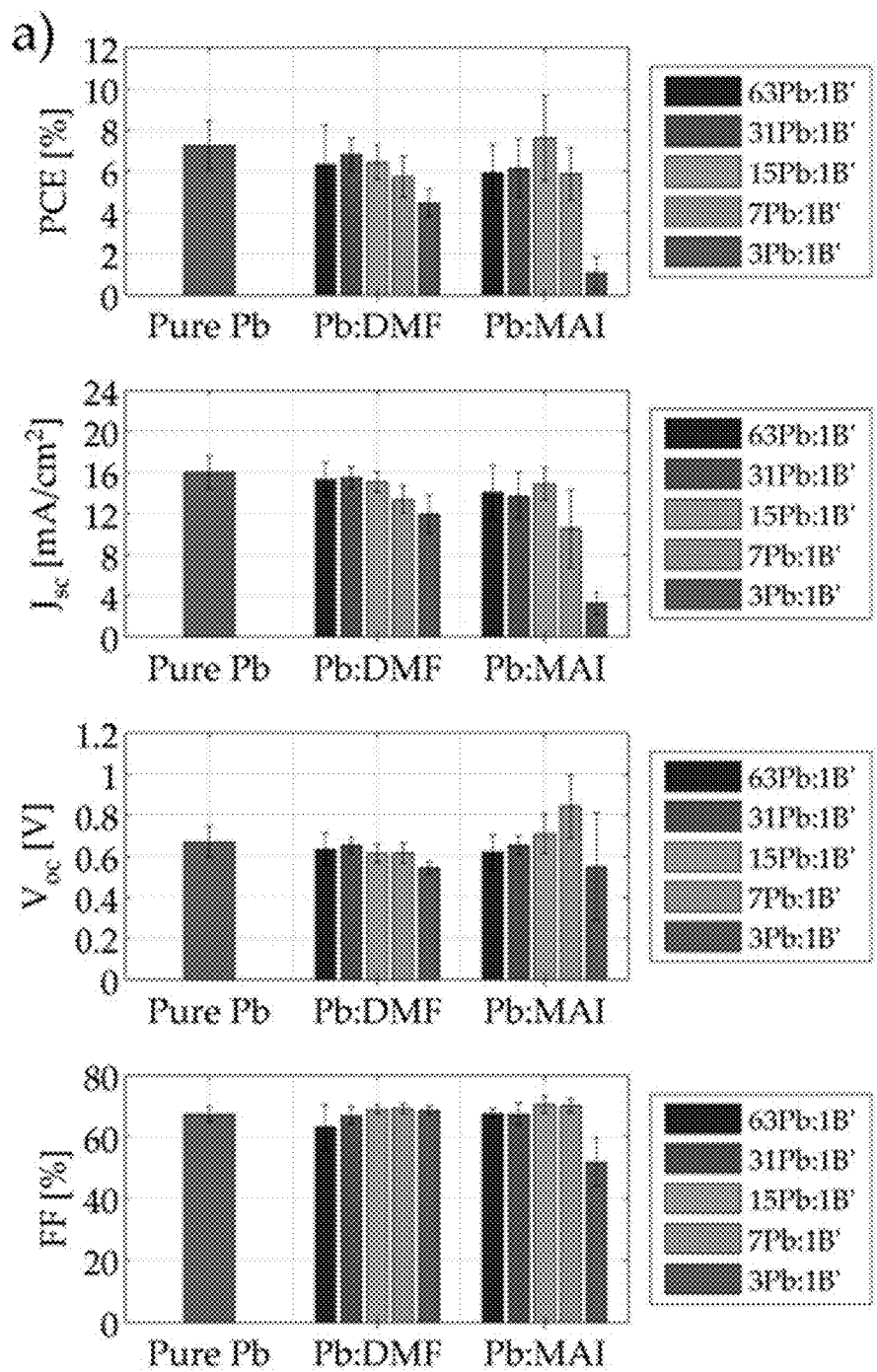
FIGS. 10A-10D show the photovoltaic performance of control device where the MAPbI$_3$ material is diluted with DMF (Pb:DMF) or has a stoichiometric mismatch between the MAI and Pb(OAc)$_2$ precursor materials (Pb:MAI).
Figure 10B:
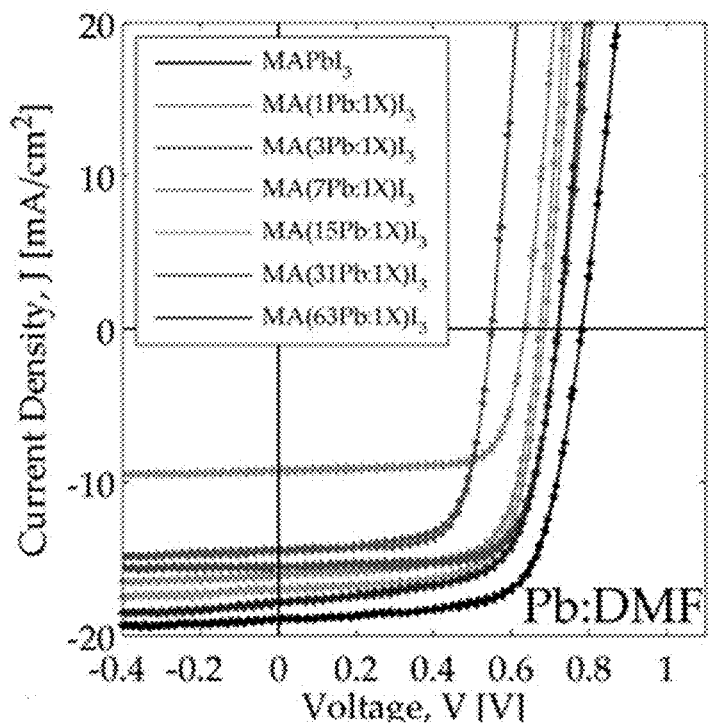
Figure 10C:
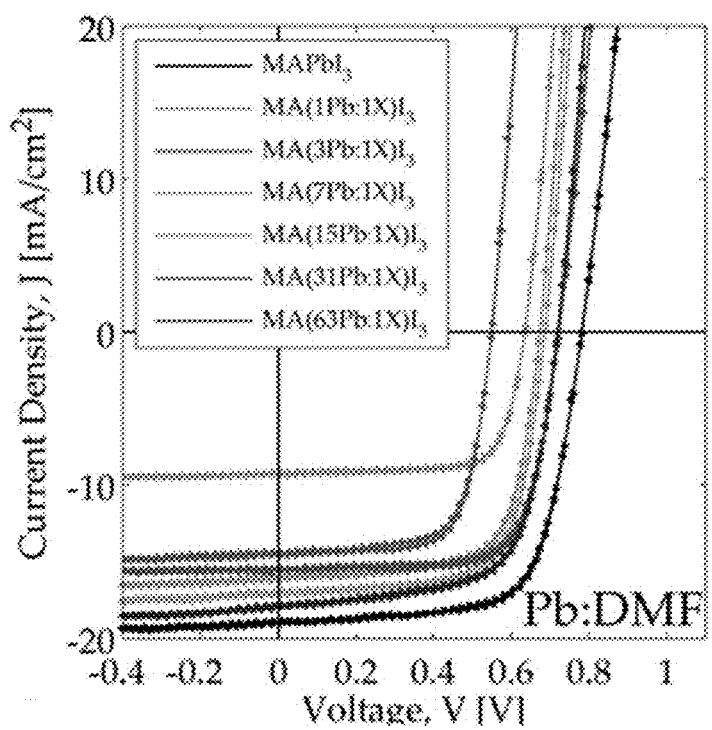
Figure 10D:
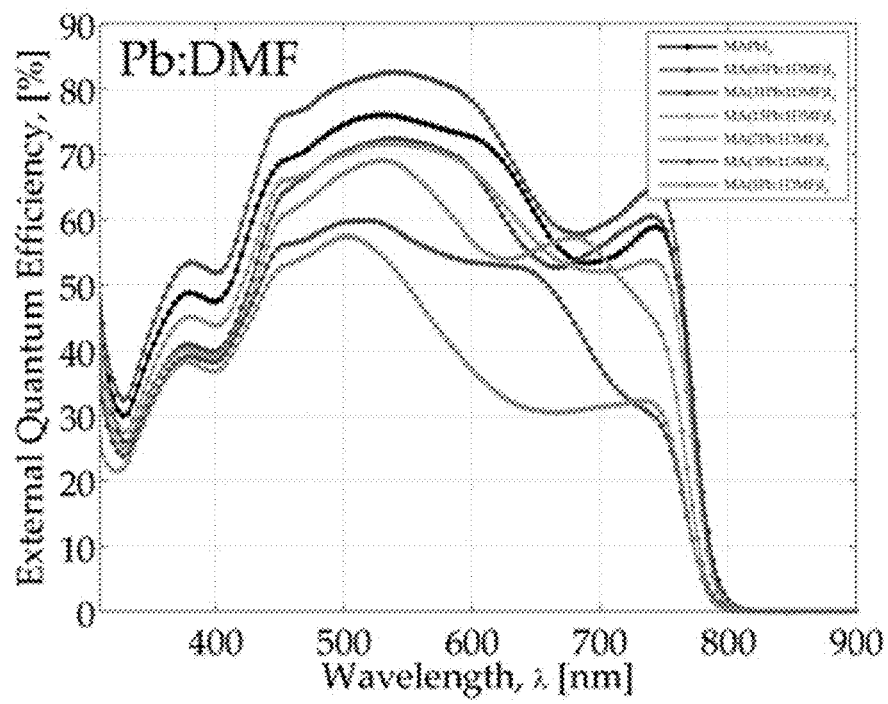
Figure 10E:
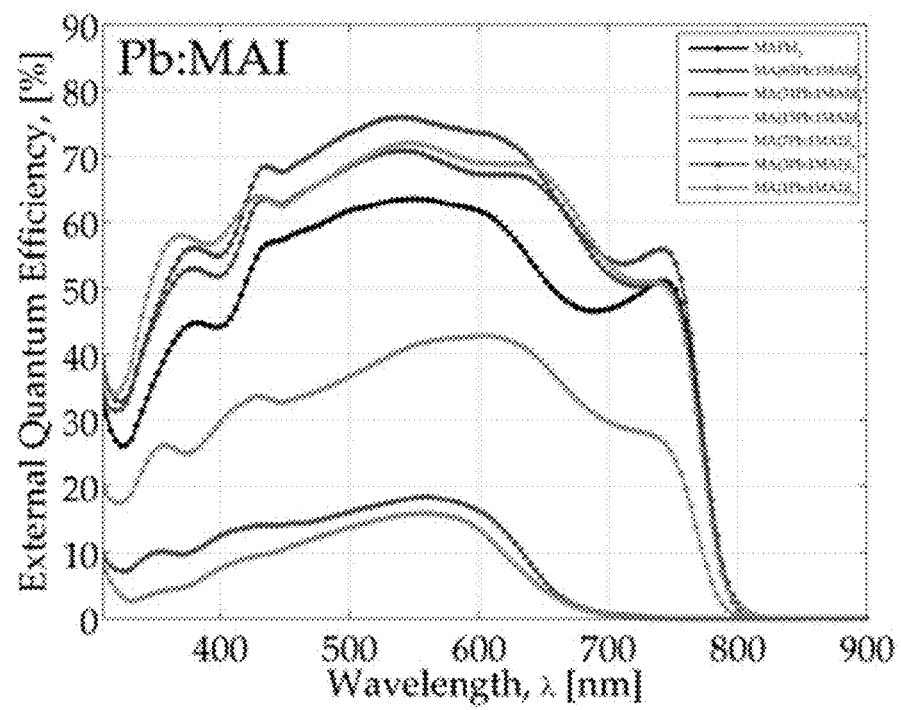
Figure 11:
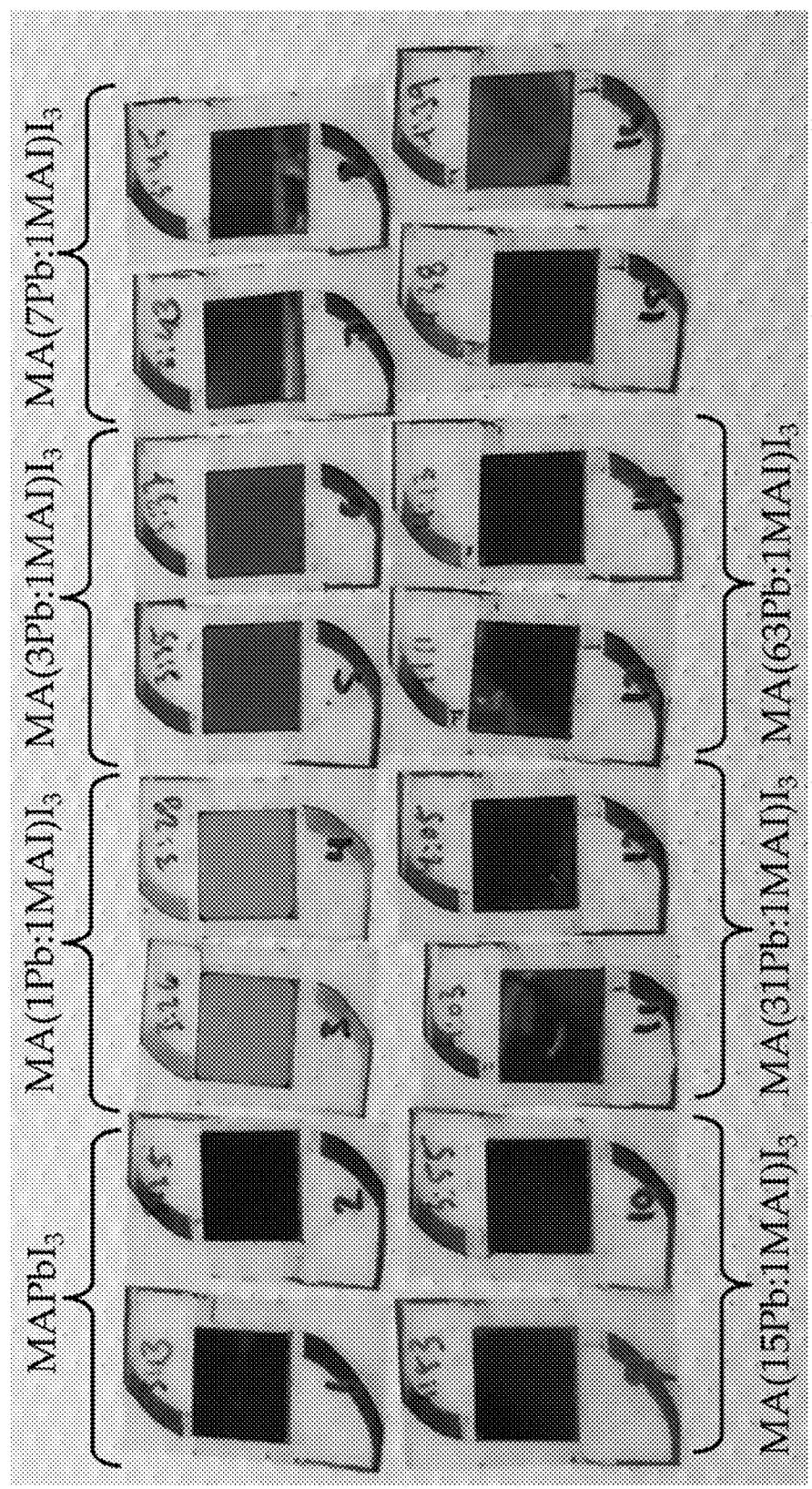
FIG. 11 shows the color of the pure Pb perovskite film changes when a significant excess of MAI is added to the precursor solution used to synthesize the active layers of the solar cell.

The other interesting feature of the Pb:MAI control batches is that the color of the film changed from the usual dark brown colour to red for 3Pb:1MAI and yellow for 1Pb:1MAI samples as is seen in FIG. 11. This result is consistent with the EQE trends shown in FIG. 10E where the MA(1Pb:1MAI)I$_3$ and MA(3Pb:1MAI)I$_3$ compositions produce substantially less current with low energy photons. Although absorbance is not significant between 650 and 800 nm, there is a long absorbance tail in this region, which suggests that it might still be the MAPbI$_3$ material but have a number of trap states in the band gap that are detrimental to performance. Alternatively, the excess of MAI might also induce an increased amount of disorder that prevents the material from fully crystallizing. In contrast, FIG. 8D shows that the Pb:DMF control series maintained the same EQE edge near 800 nm but the efficiency at low photon energies was reduced for thinner samples. This can be explained simply by the fact that thinner films are not able to fully capture these photons and some red and infrared light passes through the films without being absorbed.

TABLE 6

The compiled average performance metrics for each solar cell control composition. Error corresponds to the standard deviation.

| Material | 63Pb:1B' | 31Pb:1B' | 15Pb:1B' | 7Pb:1B' | 3Pb:1B' |
|---|---|---|---|---|---|
| Mean Short-Circuit Current Density, $J_{sc}$ [mA/cm$^2$] | | | | | |
| Pb Only | | | 16.02 ± 1.62 | | |
| Pb:DMF | 15.31 ± 1.64 | 15.50 ± 1.04 | 15.10 ± 0.98 | 13.37 ± 1.38 | 11.95 ± 1.87 |
| Pb:MAI | 14.06 ± 2.69 | 13.72 ± 2.31 | 14.92 ± 1.56 | 10.53 ± 3.80 | 3.24 ± 1.11 |
| Mean Open-Circuit Voltage, $V_{oc}$ [V] | | | | | |
| Pb Only | | | 0.67 ± 0.07 | | |
| Pb:DMF | 0.63 ± 0.08 | 0.65 ± 0.04 | 0.62 ± 0.04 | 0.62 ± 0.05 | 0.54 ± 0.03 |
| Pb:MAI | 0.62 ± 0.08 | 0.65 ± 0.04 | 0.71 ± 0.10 | 0.84 ± 0.15 | 0.55 ± 0.26 |
| Mean Fill Factor, FF [%] | | | | | |
| Pb Only | | | 67.53 ± 2.54 | | |
| Pb:DMF | 63.17 ± 7.32 | 67.02 ± 2.99 | 69.11 ± 1.42 | 69.31 ± 1.48 | 68.76 ± 1.41 |
| Pb:MAI | 67.72 ± 1.62 | 67.51 ± 3.68 | 70.68 ± 2.79 | 70.35 ± 2.17 | 51.87 ± 7.90 |
| Mean Power Conversion Efficiency, PCE [%] | | | | | |
| Pb Only | | | 7.27 ± 1.18 | | |
| Pb:DMF | 6.33 ± 1.90 | 6.82 ± 0.81 | 6.45 ± 0.84 | 5.74 ± 1.01 | 4.46 ± 0.67 |
| Pb:MAI | 5.93 ± 1.35 | 6.14 ± 1.43 | 7.63 ± 2.07 | 5.87 ± 1.27 | 1.05 ± 0.80 |

TABLE 7

The best measured performance metrics for each solar cell control composition. $J_{sc}$, $V_{oc}$, and FF do not necessarily correspond to the device with the champion PCE.

| Material | 63Pb:1B' | 31Pb:1B' | 15Pb:1B' | 7Pb:1B' | 3Pb:1B' |
|---|---|---|---|---|---|
| Best Short-Circuit Current Density, $J_{sc}$ [mA/cm$^2$] | | | | | |
| Pb Only | | | 18.97 | | |
| Pb:DMF | 18.24 | 17.45 | 17.21 | 16.03 | 14.49 |
| Pb:MAI | 18.58 | 16.77 | 17.53 | 17.17 | 4.93 |
| Best Open-Circuit Voltage, $V_{oc}$ [V] | | | | | |
| Pb Only | | | 0.82 | | |
| Pb:DMF | 0.72 | 0.72 | 0.69 | 0.67 | 0.59 |
| Pb:MAI | 0.81 | 0.70 | 0.85 | 0.96 | 0.97 |
| Best Fill Factor, FF [%] | | | | | |
| Pb Only | | | 72.14 | | |
| Pb:DMF | 71.45 | 72.41 | 71.85 | 71.59 | 70.94 |
| Pb:MAI | 70.3 | 71.58 | 75.17 | 73.47 | 62.75 |
| Best Power Conversion Efficiency, PCE [%] | | | | | |
| Pb Only | | | 10.27 | | |
| Pb:DMF | 8.62 | 8.12 | 8.20 | 7.62 | 5.61 |
| Pb:MAI | 7.76 | 7.98 | 11.00 | 8.23 | 2.90 |

Scanning Electron Micrographs of Film Morphologies

The film morphology of each of the XRD samples was investigated by imaging the top surface of the film with scanning electron microscopy (SEM). Images with a 50,000× magnification are shown for the mixed-metal material sets in FIGS. 12-20.

The morphology of the baseline MAPbI$_3$ perovskite sample, labeled as the 1Pb:0Co sample in the bottom-right panel of FIG. 12, reveals that the perovskite films on PEDOT:PSS consists of randomly oriented plate-like grains that are roughly 100 nm in size. The acetate precursor tends to produce perovskite films with smaller grains than those synthesized using chloride precursors, due in part to the quicker crystallization times of the acetate based films. See, W. Zhang, M. Saliba, D. T. Moore, S. K. Pathak, M. T. Hörantner, T. Stergiopoulos, S. D. Stranks, G. E. Eperon, J. A. Alexander-Webber, A. Abate, A. Sadhanala, S. Yao, Y. Chen, R. H. Friend, L. A. Estroff, U. Wiesner and H. J. Snaith, *Nat. Commun.*, 2015, 6, 6142, which is incorporated by reference in its entirety. It is also apparent from the micrographs that these films do contain some pinholes.

The general trend across all compositions is that the morphology remains similarly small-grained with increasing B' content until a molar ratio of 7Pb:1B'. At this point the films transition to often dramatically different morphologies as more Pb content is further replaced. The cases of 3Pb:1Co, 3Pb:1Cu, 3Pb:Sn, and 7Pb:1Zn (FIGS. 12, 13, 18 and 20) are instances where the grains are substantially larger than samples with lower B' content. The films for both 1Pb:1Cu and 3Pb:1Mg (FIGS. 13 and 15) clearly show two different material phases, one consisting of large grains with a finer material filling in the space between them.

Figure 19:
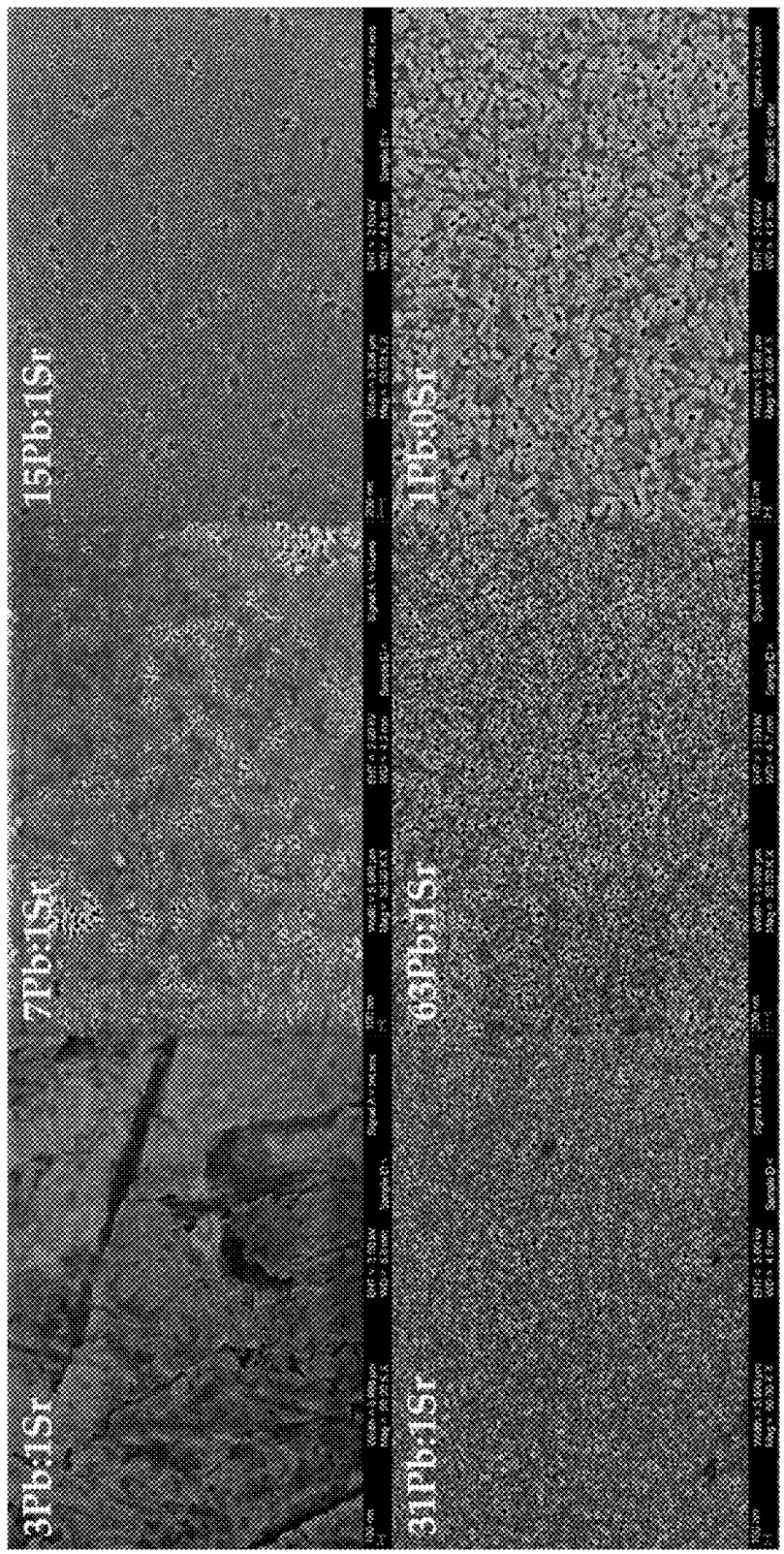
FIG. 19 shows scanning electron micrographs of MA(Pb:Sr)I$_3$ perovskite films with different metal replacement fractions.
Figure 20:
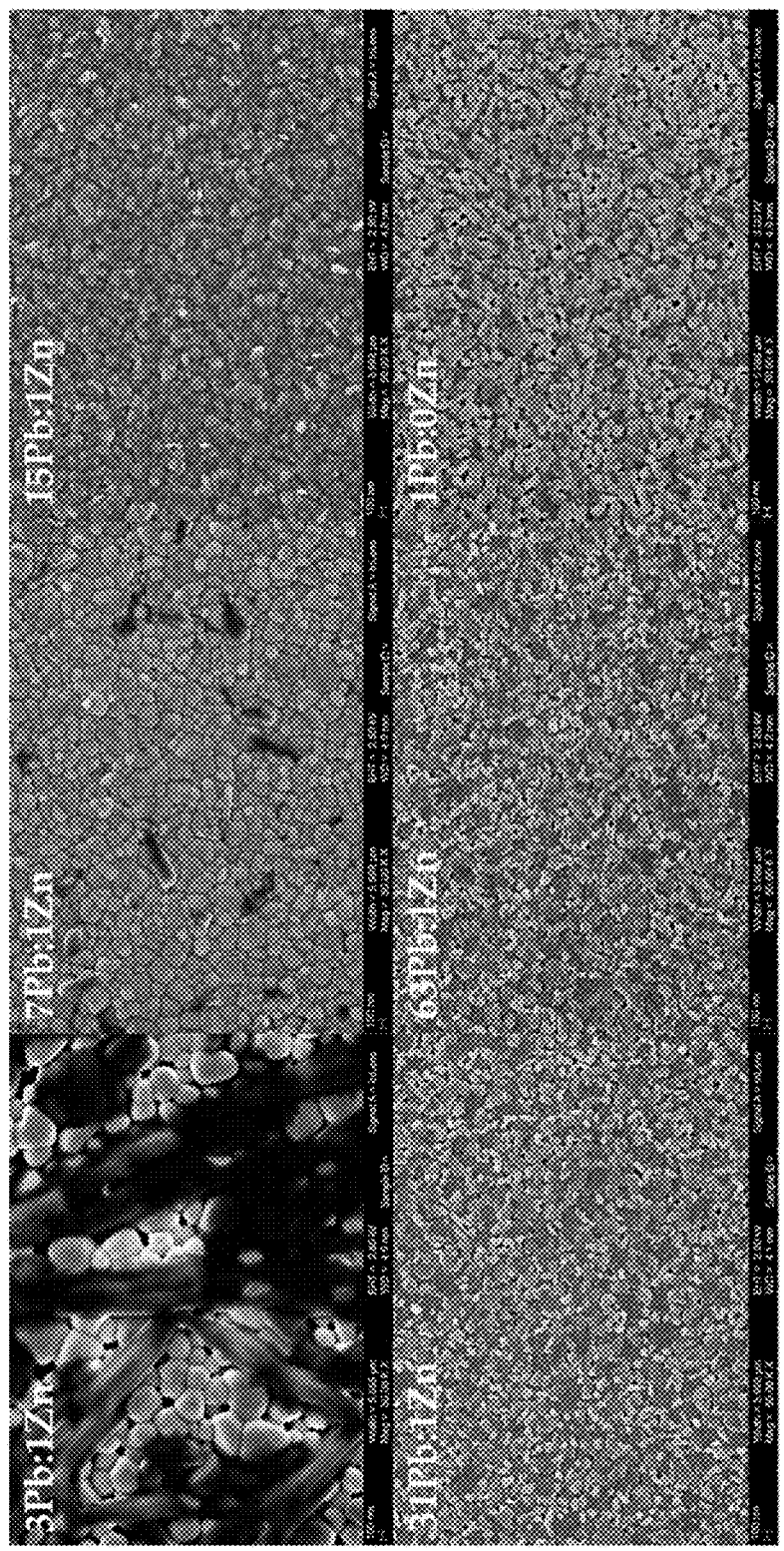
FIG. 20 shows scanning electron micrographs of MA(Pb:Zn)I$_3$ perovskite films with different metal replacement fractions.
Figure 21:
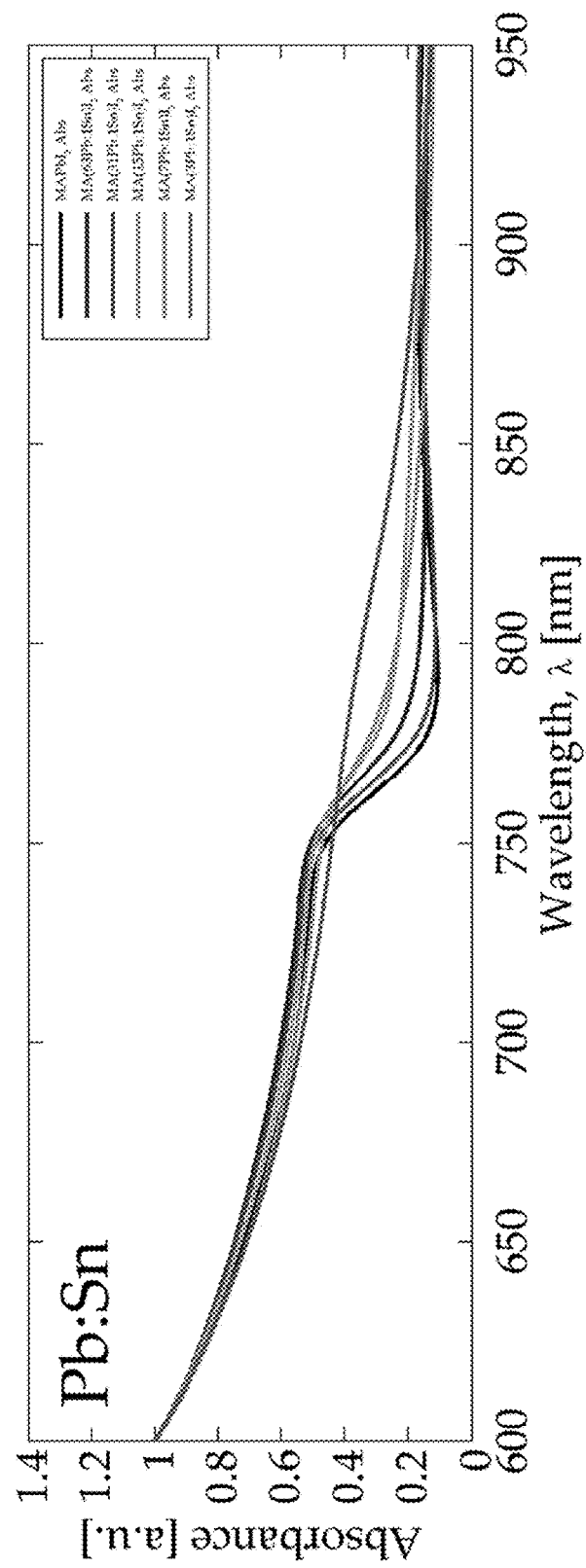
FIG. 21 shows the normalized absorbance spectra of mixed-metal Pb:Sn perovskite films compositions.
Figure 22C:
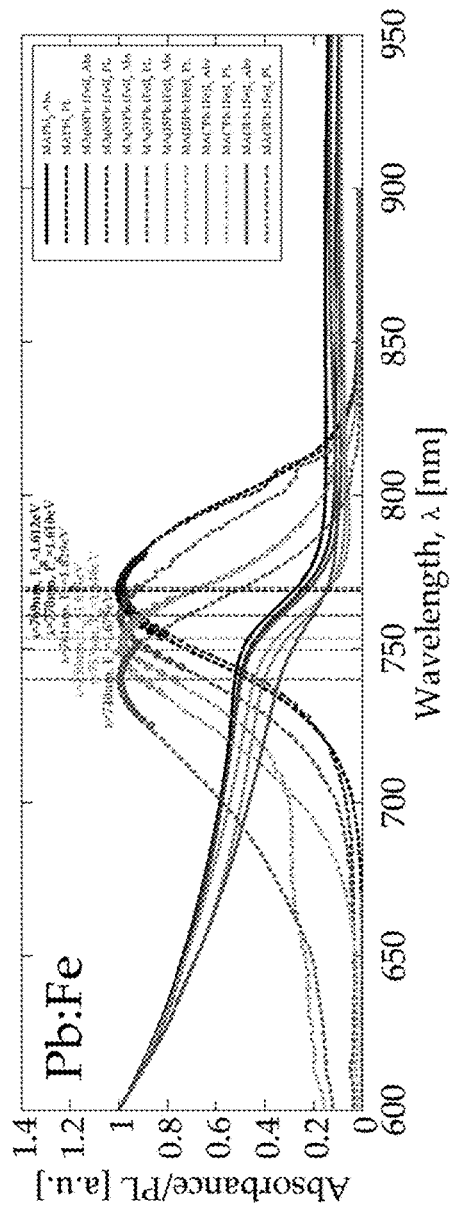
Figure 22D:
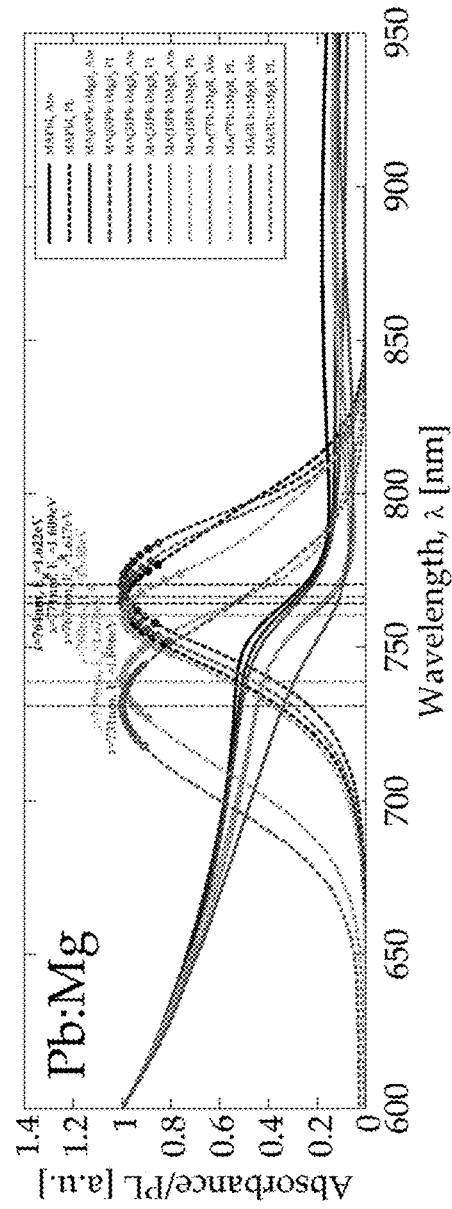
Figure 23A:
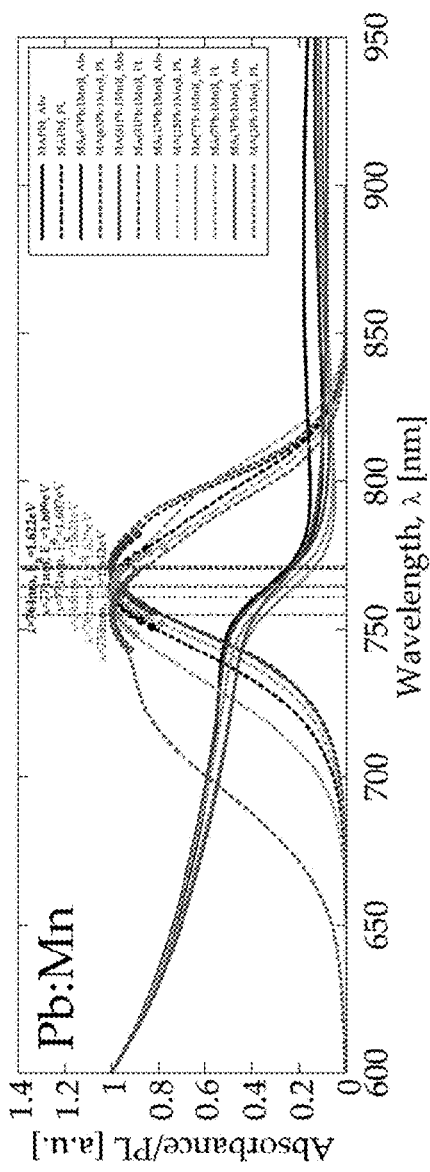
FIGS. 23A-23D show the normalized absorbance (solid lines) and photoluminescence emission (dotted lines) spectra of mixed-metal perovskite films compositions sets: Pb:Mn (FIG. 23A), Pb:Ni (FIG. 23B), Pb:Sr (FIG. 23C), and Pb:Zn (FIG. 23D).
Figure 23B:
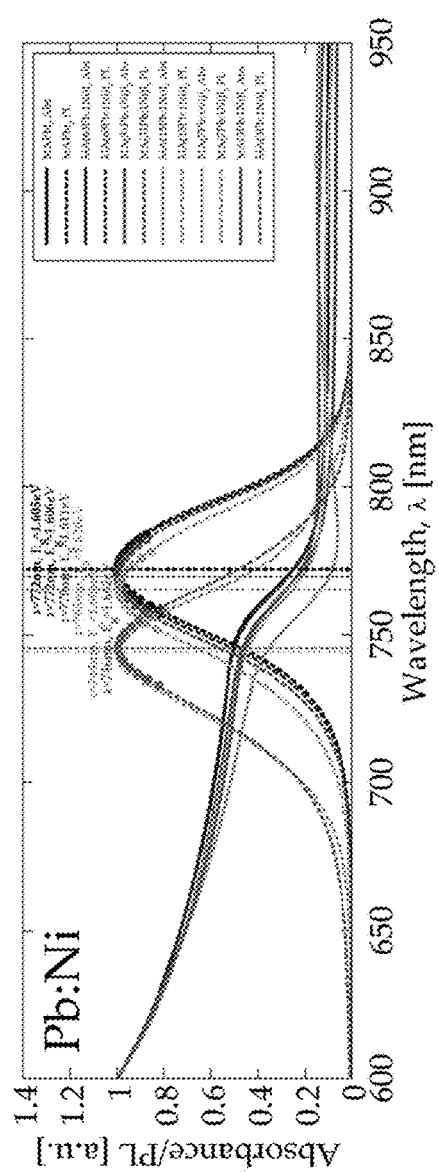
Figures 23C, 23D:
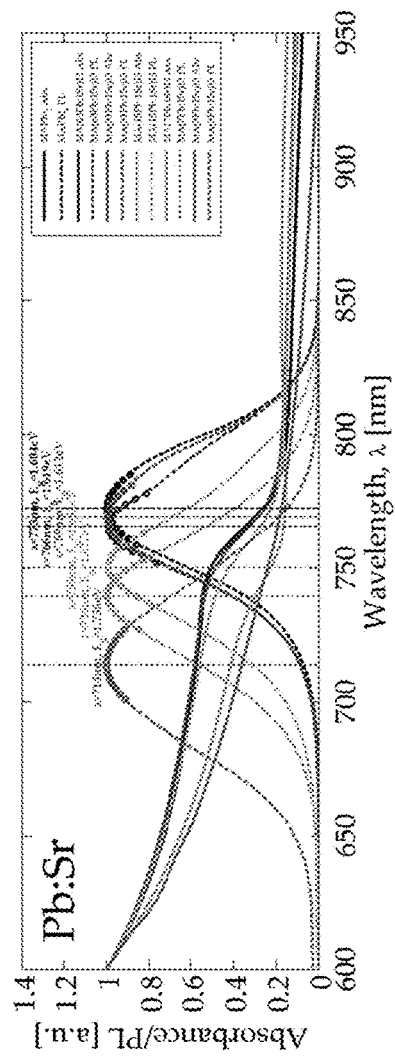

The second noticeable trend is that grain sizes are slightly smaller than MAPbI$_3$ and the pinhole density is similar at low levels of Pb replacement, which is particular evident in blends with Co (FIG. 12), Fe (FIG. 14), Mg (FIG. 15), Mn (FIG. 16), and Sr (FIG. 19). The exceptions to this trend are Cu (FIG. 13) and Zn (FIG. 20), whose morphologies show that the grain size of the MAPbI$_3$ film is preserved at low replacement levels and that the film seems to have less pinholes with more tightly packed grains comprising the film. Furthermore, the frequency of platelet-like grains seems to reduce with increasing Cu content until the 7Pb:1Cu and 7Pb:1Zn films, where they disappear altogether. In the case of Pb:Zn, at 7Pb:1Zn a second population of dark grains arise that more frequently appear in the 3Pb:1Zn samples (FIG. 20).

Normalized Absorbance and Photoluminescence Spectra.

In order to investigate the optical properties of each mixed-metal perovskite material, films were built directly on plasma-treated glass substrates without PEDOT:PSS in order to avoid photoluminescence quenching from occurring at the interface between the perovskite and PEDOT:PSS. In order to protect the films from ambient conditions during measurement, they were coated with a layer of poly(methyl methacrylate) (PMMA), which is hydrophobic and prevents moisture from accessing the perovskite.

The band gap of each material was determined from the position of the photoluminescence emission peak measured with a fluorimeter. The trends in PL peak shifts can be confirmed by corresponding shifts in the absorbance edge of the material. Hence, the normalized absorbance and PL emission spectra for each mixed-metal composition are presented together in FIGS. 22A-22D and 23A-23D. In each case, the PL emission peak was locally fit to a parabola in order to compensate for any noise in the spectrum and identify the position of the emission peak. The PL emission peak positions and the shift from the MAPbI$_3$ control films synthesized for each material set are tabulated in Table 8. Only the absorbance spectra are reported for Pb:Sn blends in FIG. 21 because several of the films in this composition set were not emissive enough to generate clean PL spectra.

TABLE 8

Optical band gap as determined from the location of the photoluminescence emission peak of mixed-metal perovskite films and the shift from peak position of pure MAPbI$_3$ control sample taken with each material set.

| Material | PL Peak Position | | Peak Shift from MAPbI$_3$ | |
| --- | --- | --- | --- | --- |
| | $\lambda_{PL}$ [nm] | $E_{PL}$ [eV] | $\Delta\lambda_{PL}$ [nm] | $\Delta E_{PL}$ [eV] |
| MAPbI$_3$ | 774 | 1.602 | — | — |
| MA(63Pb:1Co)I$_3$ | 773 | 1.604 | −1 | 0.002 |
| MA(31Pb:1Co)I$_3$ | 771 | 1.608 | −3 | 0.006 |
| MA(15Pb:1Co)I$_3$ | 770 | 1.610 | −4 | 0.008 |
| MA(7Pb:1Co)I$_3$ | 758 | 1.636 | −16 | 0.034 |
| MA(3Pb:1Co)I$_3$ | 765 | 1.620 | −9 | 0.018 |
| MAPbI$_3$ | 770 | 1.610 | — | — |
| MA(63Pb:1Cu)I$_3$ | 765 | 1.621 | −5 | 0.011 |
| MA(31Pb:1Cu)I$_3$ | 765 | 1.620 | −5 | 0.010 |
| MA(15Pb:1Cu)I$_3$ | 771 | 1.608 | 1 | −0.002 |
| MA(7Pb:1Cu)I$_3$ | 766 | 1.618 | −4 | 0.008 |
| MA(3Pb:1Cu)I$_3$ | 769 | 1.612 | −1 | 0.002 |
| MAPbI$_3$ | 769 | 1.612 | — | — |
| MA(63Pb:1Fe)I$_3$ | 770 | 1.610 | 1 | −0.002 |
| MA(31Pb:1Fe)I$_3$ | 761 | 1.629 | −8 | 0.017 |
| MA(15Pb:1Fe)I$_3$ | 750 | 1.654 | −19 | 0.042 |
| MA(7Pb:1Fe)I$_3$ | 753 | 1.646 | −16 | 0.034 |
| MA(3Pb:1Fe)I$_3$ | 740 | 1.675 | −29 | 0.063 |
| MAPbI$_3$ | 764 | 1.622 | — | — |
| MA(63Pb:1Mg)I$_3$ | 771 | 1.609 | 7 | −0.013 |
| MA(31Pb:1Mg)I$_3$ | 767 | 1.617 | 3 | −0.005 |
| MA(15Pb:1Mg)I$_3$ | 760 | 1.630 | −4 | 0.008 |
| MA(7Pb:1Mg)I$_3$ | 739 | 1.678 | −25 | 0.056 |
| MA(3Pb:1Mg)I$_3$ | 731 | 1.696 | −33 | 0.074 |
| MAPbI$_3$ | 764 | 1.622 | — | — |
| MA(63Pb:1Mn)I$_3$ | 771 | 1.609 | 7 | −0.013 |
| MA(31Pb:1Mn)I$_3$ | 771 | 1.607 | 7 | −0.015 |
| MA(15Pb:1Mn)I$_3$ | 765 | 1.621 | 1 | −0.001 |
| MA(7Pb:1Mn)I$_3$ | 761 | 1.629 | −3 | 0.007 |
| MA(3Pb:1Mn)I$_3$ | 755 | 1.642 | −9 | 0.020 |
| MAPbI$_3$ | 772 | 1.605 | — | — |
| MA(63Pb:1Ni)I$_3$ | 772 | 1.606 | 0 | 0.001 |
| MA(31Pb:1Ni)I$_3$ | 770 | 1.611 | −2 | 0.006 |
| MA(15Pb:1Ni)I$_3$ | 765 | 1.620 | −7 | 0.015 |
| MA(7Pb:1Ni)I$_3$ | 744 | 1.666 | −28 | 0.061 |
| MA(3Pb:1Ni)I$_3$ | 746 | 1.662 | −26 | 0.057 |
| MAPbI$_3$ | 773 | 1.604 | — | — |
| MA(63Pb:1Sr)I$_3$ | 766 | 1.619 | −7 | 0.015 |
| MA(31Pb:1Sr)I$_3$ | 769 | 1.612 | −4 | 0.008 |
| MA(15Pb:1Sr)I$_3$ | 750 | 1.652 | −23 | 0.048 |
| MA(7Pb:1Sr)I$_3$ | 739 | 1.677 | −34 | 0.073 |
| MA(3Pb:1Sr)I$_3$ | 714 | 1.736 | −59 | 0.132 |
| MAPbI$_3$ | 769 | 1.612 | — | — |
| MA(63Pb:1Zn)I$_3$ | 767 | 1.617 | −2 | 0.005 |
| MA(31Pb:1Zn)I$_3$ | 767 | 1.616 | −2 | 0.004 |
| MA(15Pb:1Zn)I$_3$ | 773 | 1.603 | 4 | −0.009 |
| MA(7Pb:1Zn)I$_3$ | 769 | 1.613 | 0 | 0.001 |
| MA(3Pb:1Zn)I$_3$ | 773 | 1.604 | 4 | −0.008 |

X-Ray Diffraction Spectra.

FIGS. 24-32 show x-ray diffraction spectra for various mixed-metal perovskite films compositions. Positions of four XRD peaks for each of the mixed-metal compositions as shown in Table 9.

TABLE 9

Figure 24:
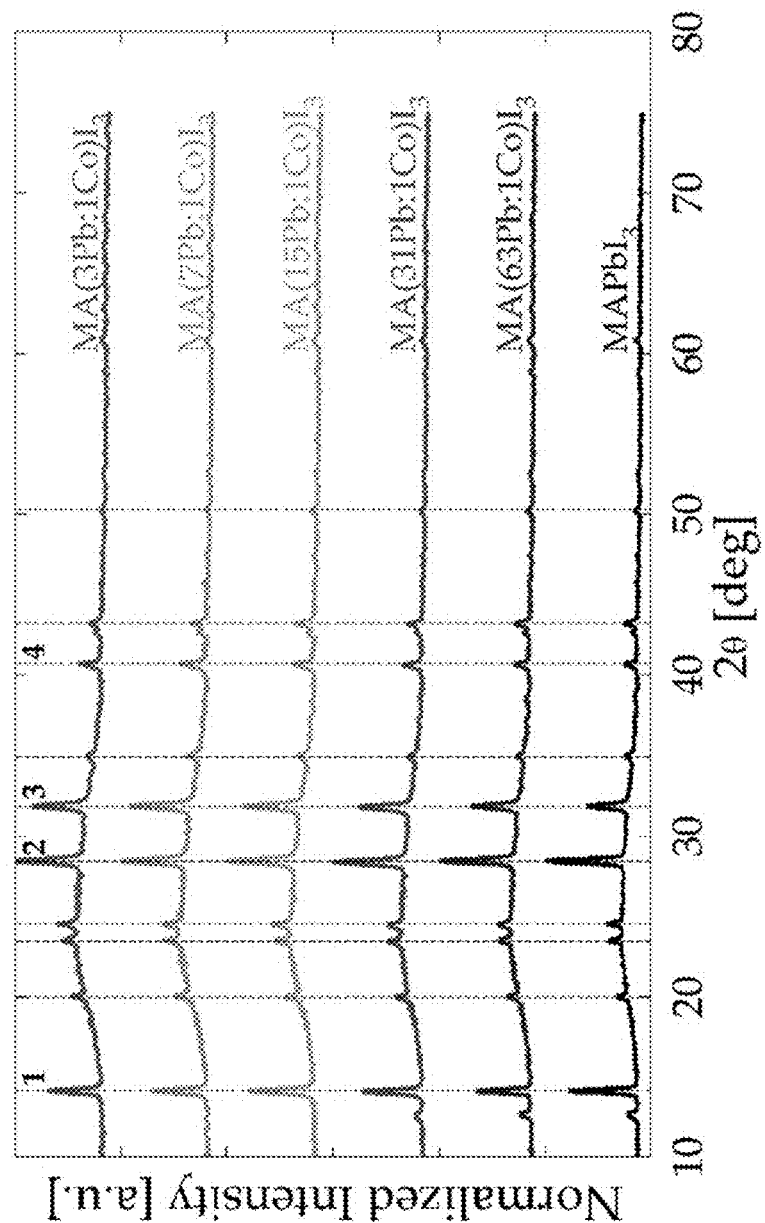
FIG. 24 shows the x-ray diffraction spectra of Pb:Co mixed-metal perovskite films compositions
Figure 25:
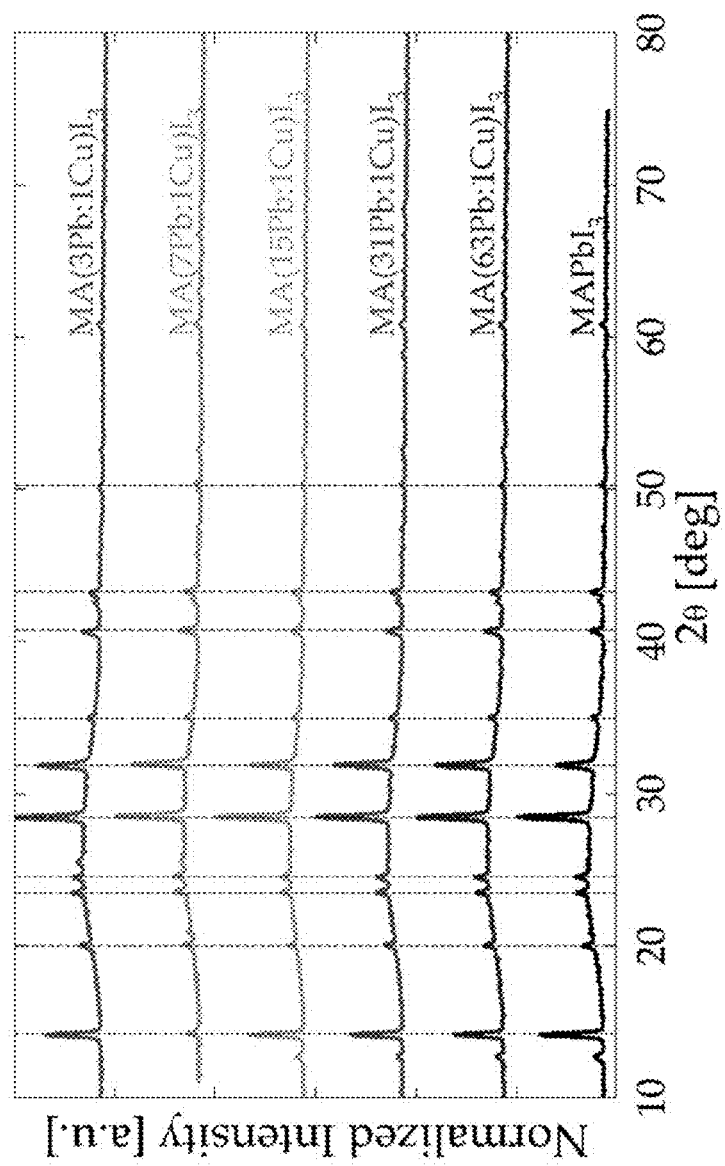
FIG. 25 shows the x-ray diffraction spectra of Pb:Cu mixed-metal perovskite films compositions
Figure 26:
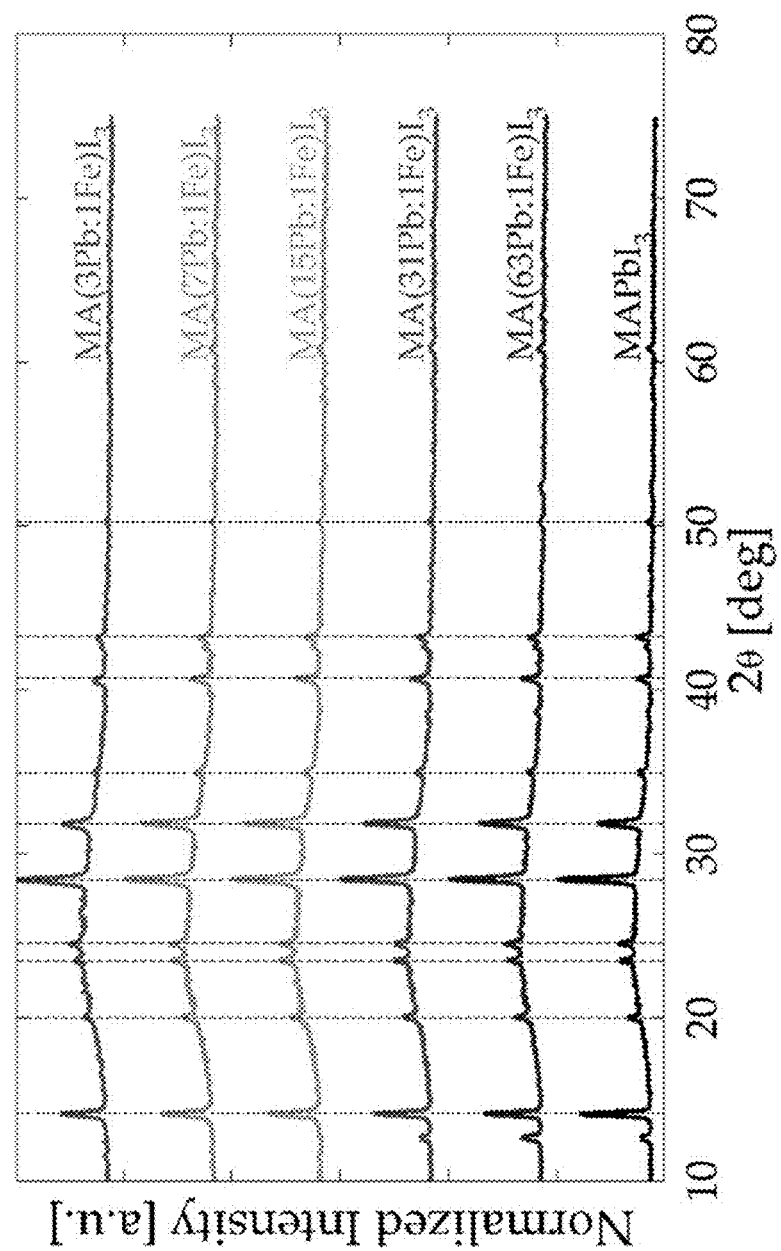
FIG. 26 shows the x-ray diffraction spectra of Pb:Fe mixed-metal perovskite films compositions
Figure 27:
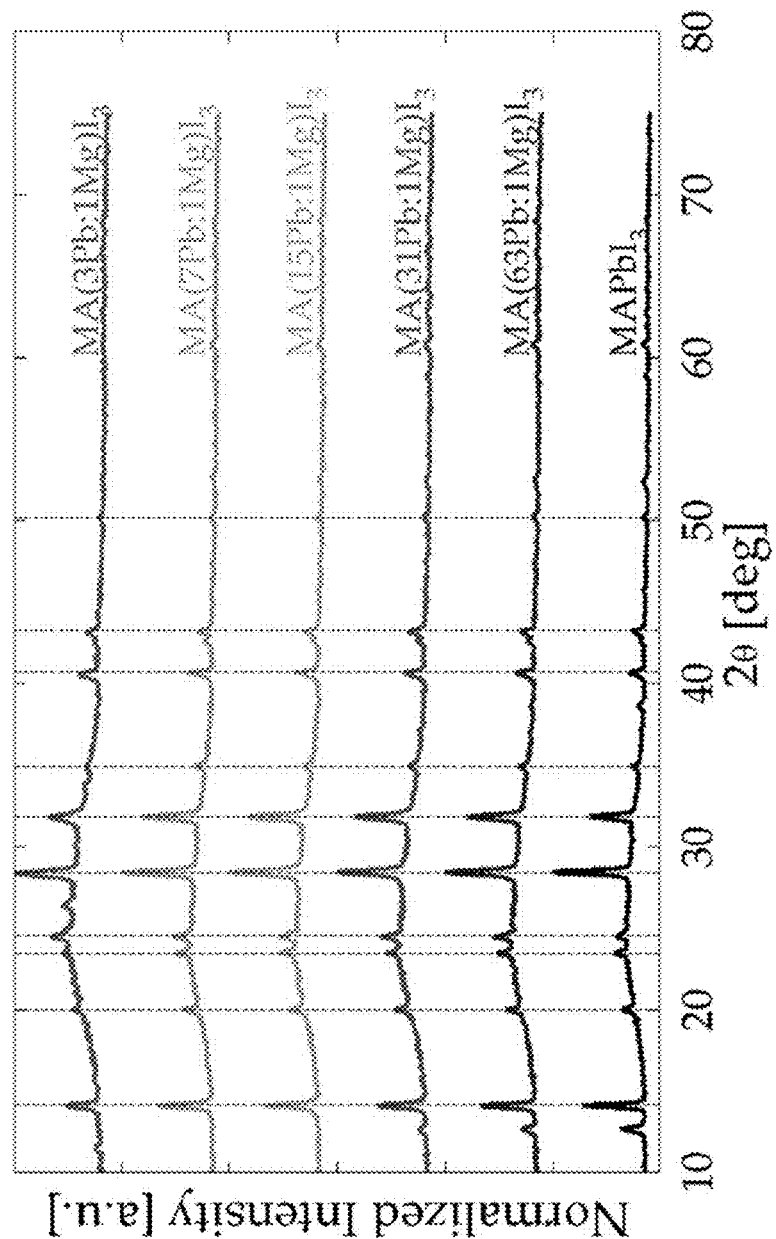
FIG. 27 shows the x-ray diffraction spectra of Pb:Mg mixed-metal perovskite films compositions
Figure 28:
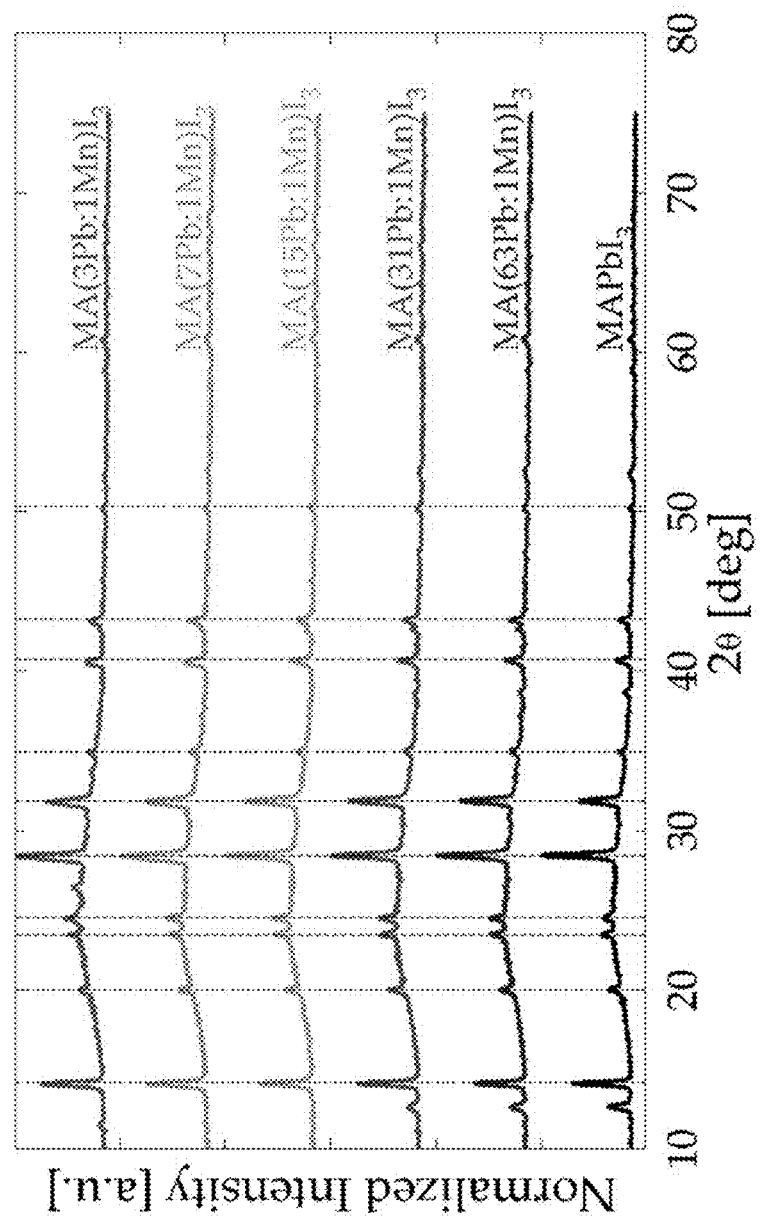
FIG. 28 shows the x-ray diffraction spectra of Pb:Mn mixed-metal perovskite films compositions
Figure 29:
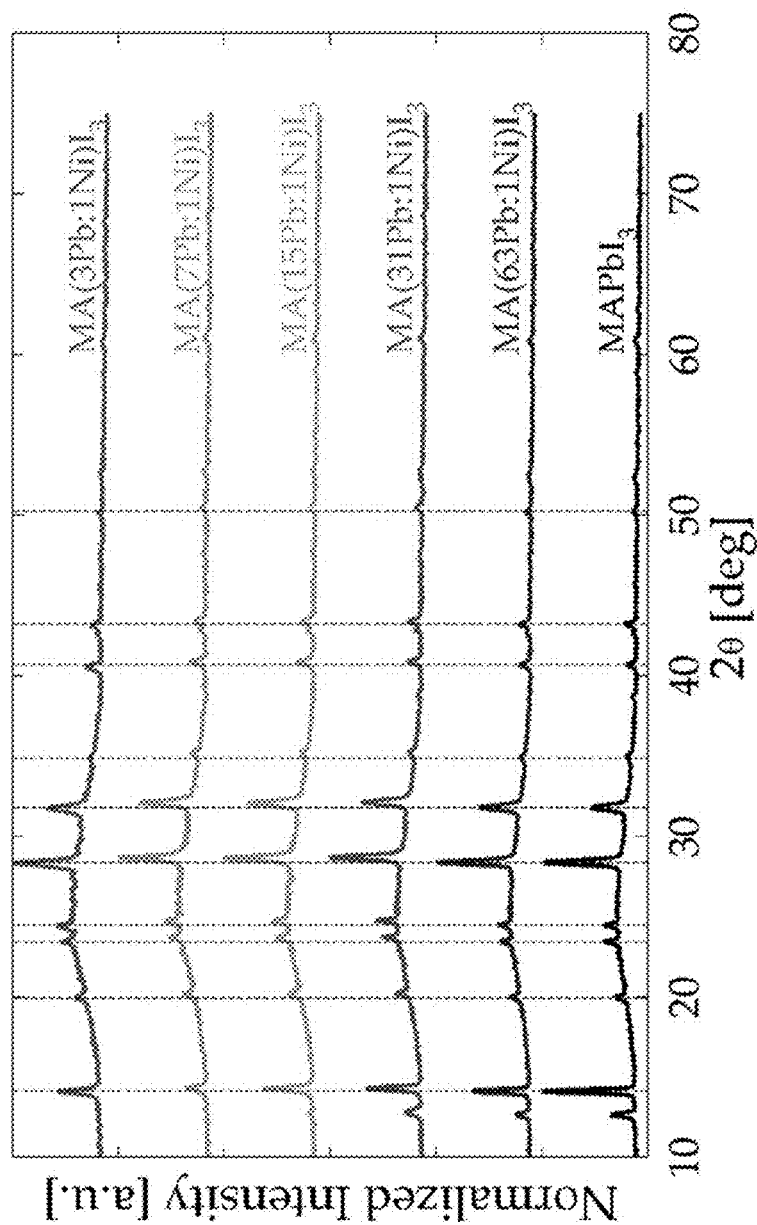
FIG. 29 shows the x-ray diffraction spectra of Pb:Ni mixed-metal perovskite films compositions
Figure 30:
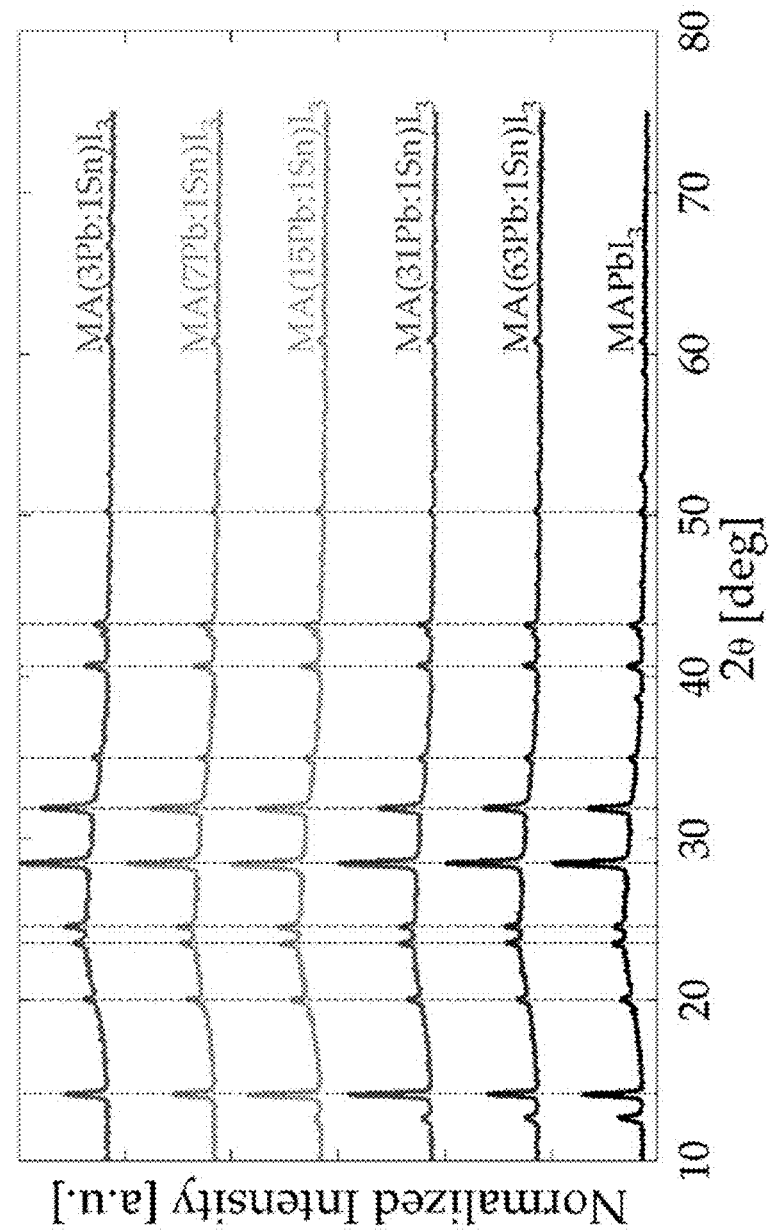
FIG. 30 shows the x-ray diffraction spectra of Pb:Sn mixed-metal perovskite films compositions
Figure 31:
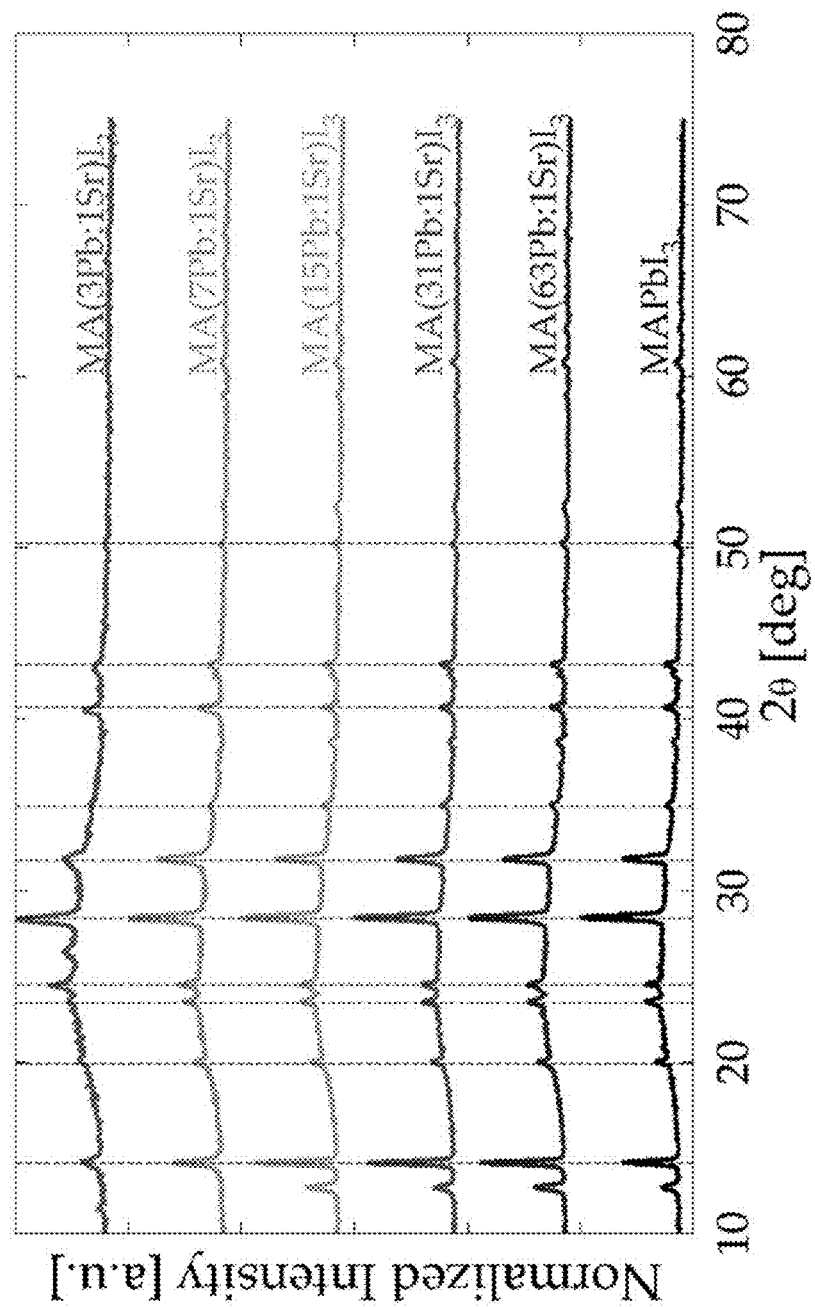
FIG. 31 shows the x-ray diffraction spectra of Pb:Sr mixed-metal perovskite films compositions
Figure 32:
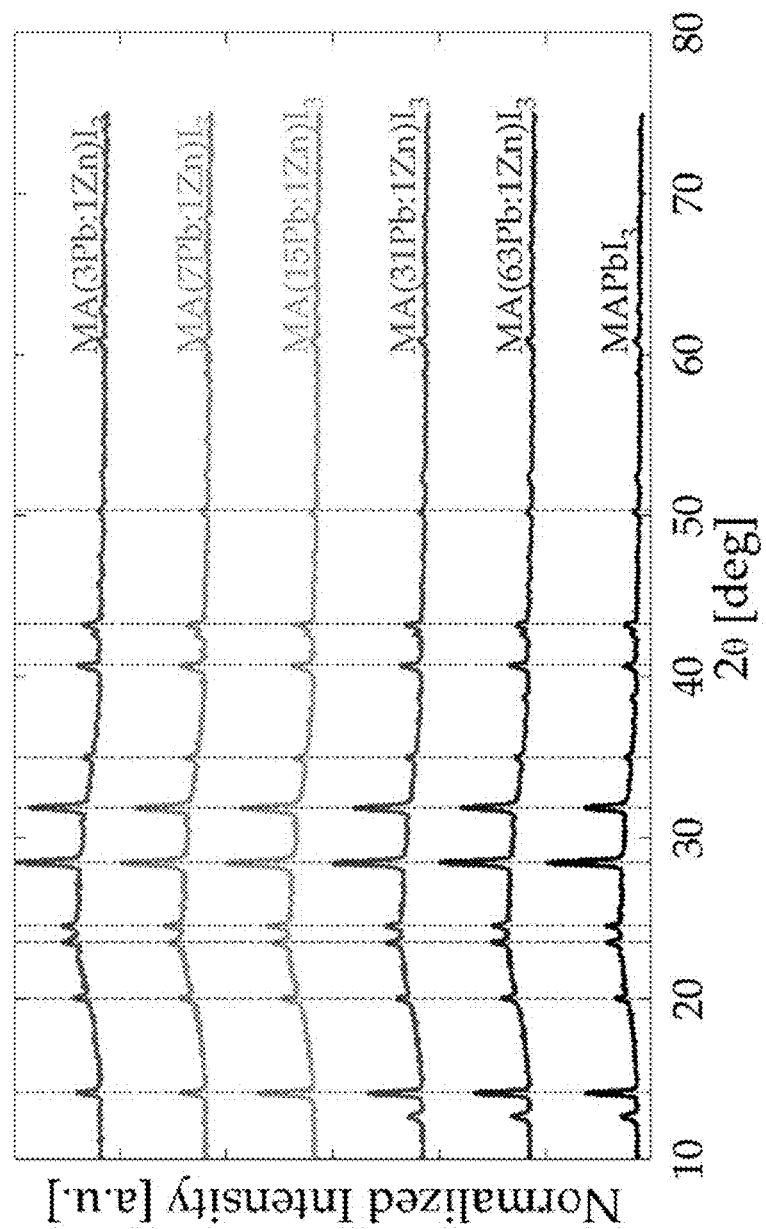
FIG. 32 shows the x-ray diffraction spectra of Pb:Zn mixed-metal perovskite films compositions
Figure 33B:
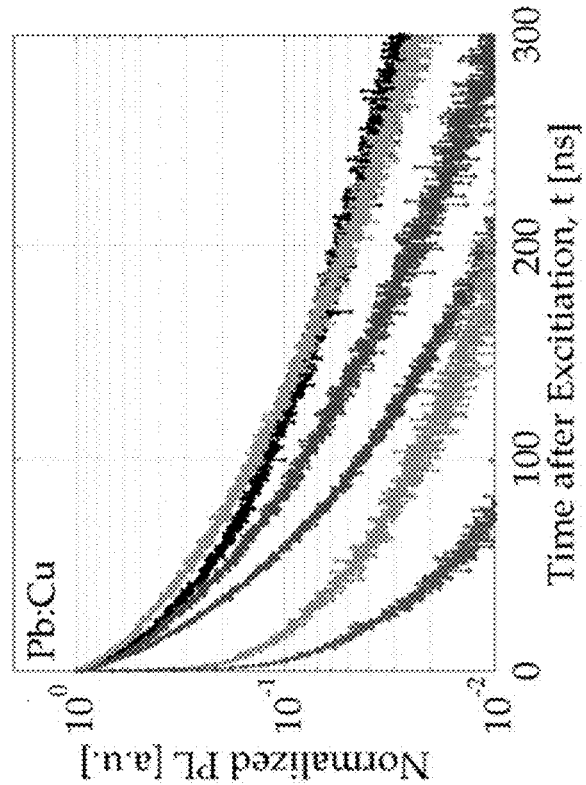
FIGS. 33A-33H show time-resolved photoluminescence decay profiles for emissive mixed-metal perovskite films: Pb:Co (FIG. 33A), Pb:Cu (FIG. 33B), Pb:Mg (FIG. 33C), Pb:Mn (FIG. 33D), Pb:Ni (FIG. 33E), Pb:Sr (FIG. 33F), Pb:Zn (FIG. 33G), Pure Pb (FIG. 33H) built on PEDOT:PSS that has been treated with DIO or chlorobenzene.
Figure 33A:
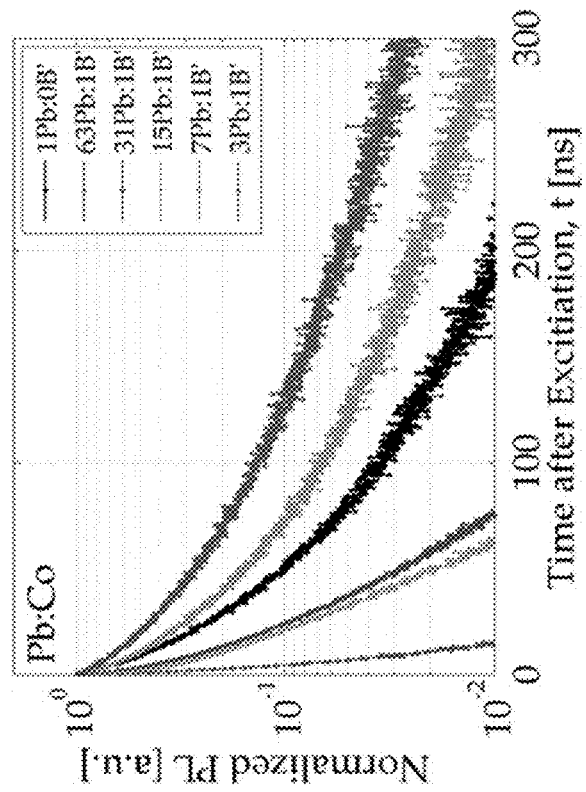
Figure 33D:
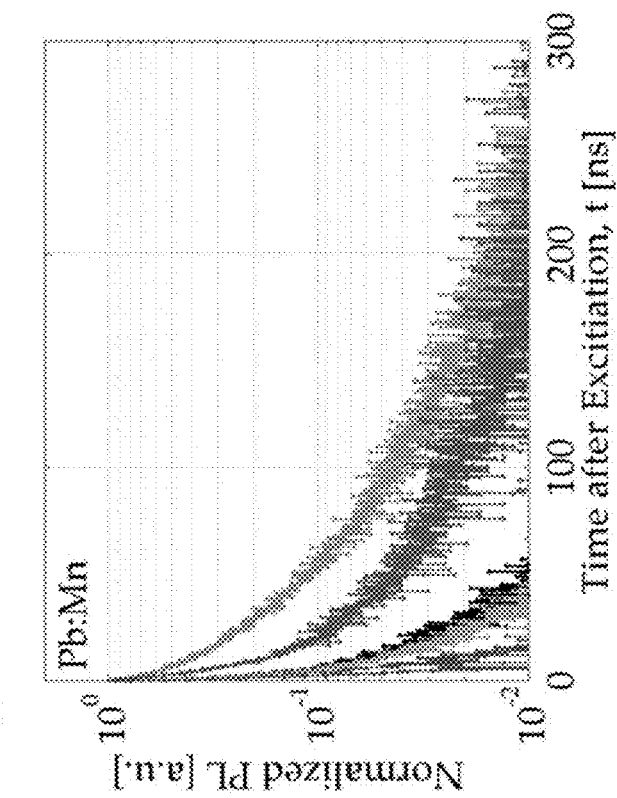
Figure 33C:
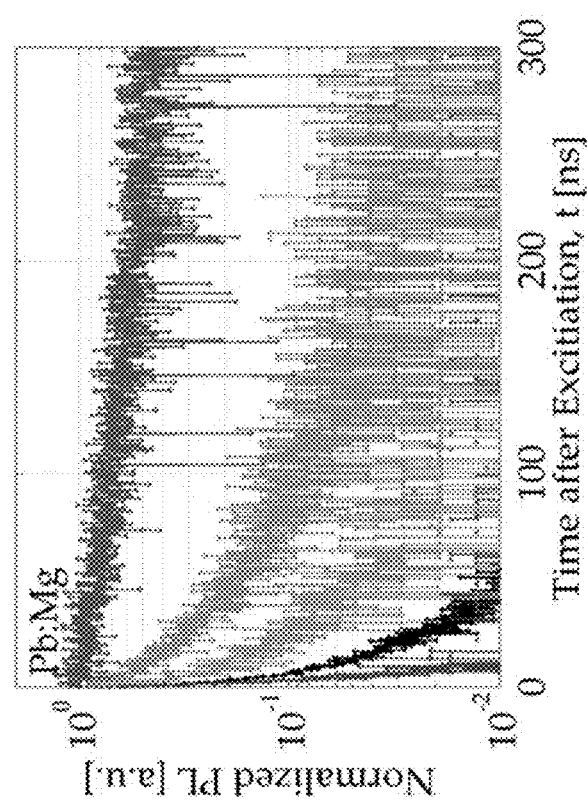
Figure 33F:
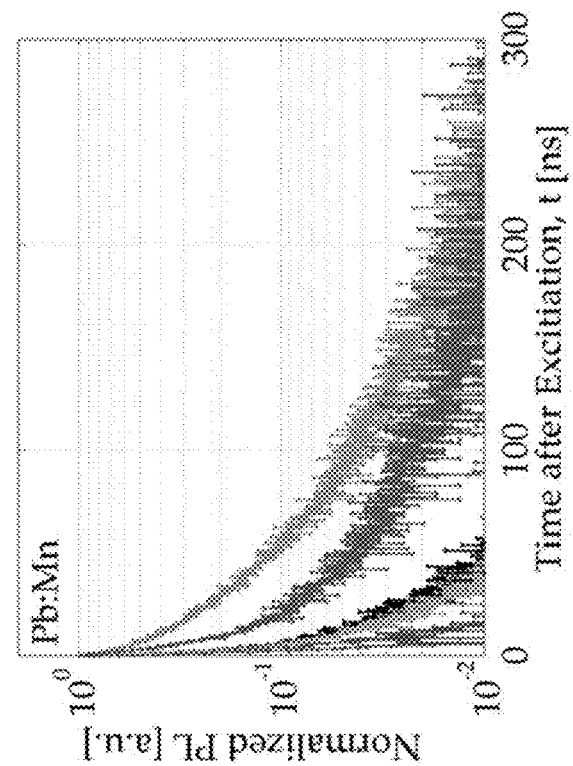
Figure 33E:
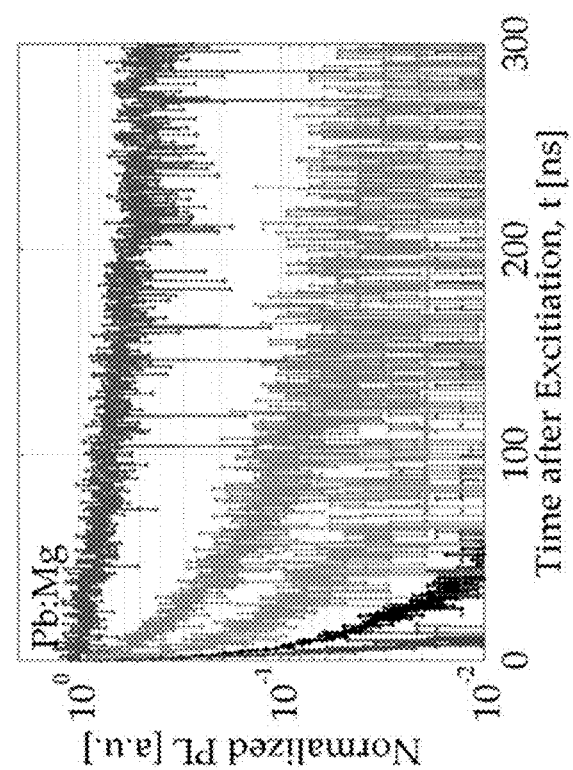
Figure 33H:
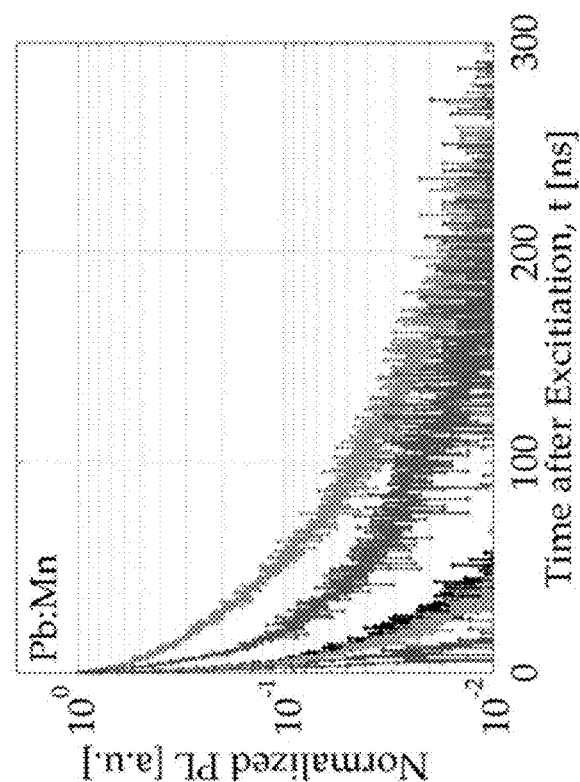
Figure 33G:
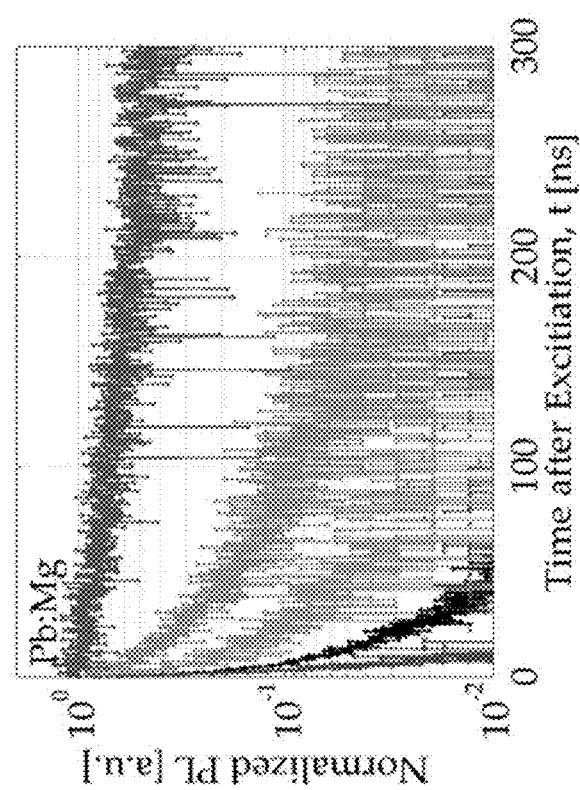

Positions of four XRD peaks as labelled in FIG. 24 for each of the mixed-metal compositions.

| | Main Peak Locations, 2θ [°] | | | |
| --- | --- | --- | --- | --- |
| Material | Peak 1 | Peak 2 | Peak 3 | Peak 4 |
| MAPbI$_3$ | 14.12 | 28.42 | 31.88 | 40.66 |
| MA(63Pb:1Co)I$_3$ | 14.10 | 28.44 | 31.84 | 40.64 |

TABLE 9-continued

Positions of four XRD peaks as labelled in FIG. 24 for each of the mixed-metal compositions.

| | Main Peak Locations, 2θ [°] | | | |
|---|---|---|---|---|
| Material | Peak 1 | Peak 2 | Peak 3 | Peak 4 |
| MA(31Pb:1Co)I$_3$ | 14.10 | 28.36 | 31.78 | 40.62 |
| MA(15Pb:1Co)I$_3$ | 14.12 | 28.40 | 31.88 | 40.66 |
| MA(7Pb:1Co)I$_3$ | 14.12 | 28.42 | 31.86 | 40.70 |
| MA(3Pb:1Co)I$_3$ | 14.12 | 28.38 | 31.84 | 40.68 |
| MAPbI$_3$ | 14.12 | 28.42 | 31.88 | 40.66 |
| MA(63Pb:1Cu)I$_3$ | 14.13 | 28.43 | 31.85 | 40.69 |
| MA(31Pb:1Cu)I$_3$ | 14.12 | 28.44 | 31.88 | 40.70 |
| MA(15Pb:1Cu)I$_3$ | 14.12 | 28.44 | 31.88 | 40.68 |
| MA(7Pb:1Cu)I$_3$ | 14.24 | 28.48 | 31.94 | 40.72 |
| MA(3Pb:1Cu)I$_3$ | 14.11 | 28.41 | 31.85 | 40.59 |
| MAPbI$_3$ | 14.12 | 28.42 | 31.88 | 40.66 |
| MA(63Pb:1Fe)I$_3$ | 14.14 | 28.44 | 31.88 | 40.70 |
| MA(31Pb:1Fe)I$_3$ | 14.14 | 28.46 | 31.86 | 40.64 |
| MA(15Pb:1Fe)I$_3$ | 14.16 | 28.44 | 31.88 | 40.70 |
| MA(7Pb:1Fe)I$_3$ | 14.12 | 28.46 | 31.90 | 40.66 |
| MA(3Pb:1Fe)I$_3$ | 14.14 | 28.42 | 31.80 | 40.66 |
| MAPbI$_3$ | 14.14 | 28.42 | 31.88 | 40.68 |
| MA(63Pb:1Mg)I$_3$ | 14.12 | 28.42 | 31.84 | 40.64 |
| MA(31Pb:1Mg)I$_3$ | 14.14 | 28.42 | 31.88 | 40.68 |
| MA(15Pb:1Mg)I$_3$ | 14.12 | 28.44 | 31.86 | 40.70 |
| MA(7Pb:1Mg)I$_3$ | 14.12 | 28.40 | 31.82 | 40.64 |
| MA(3Pb:1Mg)I$_3$ | 14.10 | 28.36 | 31.84 | 40.58 |
| MAPbI$_3$ | 14.14 | 28.42 | 31.88 | 40.68 |
| MA(63Pb:1Mn)I$_3$ | 14.12 | 28.44 | 31.86 | 40.72 |
| MA(31Pb:1Mn)I$_3$ | 14.14 | 28.40 | 31.84 | 40.66 |
| MA(15Pb:1Mn)I$_3$ | 14.12 | 28.42 | 31.84 | 40.64 |
| MA(7Pb:1Mn)I$_3$ | 14.12 | 28.40 | 31.80 | 40.58 |
| MA(3Pb:1Mn)I$_3$ | 14.12 | 28.36 | 31.80 | 40.48 |
| MAPbI$_3$ | 14.14 | 28.36 | 31.82 | 40.68 |
| MA(63Pb:1Ni)I$_3$ | 14.18 | 28.38 | 31.82 | 40.66 |
| MA(31Pb:1Ni)I$_3$ | 14.28 | 28.66 | 32.16 | 40.88 |
| MA(15Pb:1Ni)I$_3$ | 14.28 | 28.62 | 32.12 | 40.88 |
| MA(7Pb:1Ni)I$_3$ | 14.34 | 28.68 | 32.08 | 40.86 |
| MA(3Pb:1Ni)I$_3$ | 14.12 | 28.32 | 31.73 | 40.54 |
| MAPbI$_3$ | 14.14 | 28.42 | 31.88 | 40.68 |
| MA(63Pb:1Sn)I$_3$ | 14.16 | 28.44 | 31.90 | 40.68 |
| MA(31Pb:1Sn)I$_3$ | 14.12 | 28.42 | 31.84 | 40.72 |
| MA(15Pb:1Sn)I$_3$ | 14.10 | 28.40 | 31.86 | 40.66 |
| MA(7Pb:1Sn)I$_3$ | 14.10 | 28.44 | 31.84 | 40.66 |
| MA(3Pb:1Sn)I$_3$ | 14.16 | 28.42 | 31.90 | 40.64 |
| MAPbI$_3$ | 14.14 | 28.42 | 31.88 | 40.66 |
| MA(63Pb:1Sr)I$_3$ | 14.14 | 28.40 | 31.84 | 40.66 |
| MA(31Pb:1Sr)I$_3$ | 14.14 | 28.44 | 31.84 | 40.66 |
| MA(15Pb:1Sr)I$_3$ | 14.14 | 28.40 | 31.84 | 40.66 |
| MA(7Pb:1Sr)I$_3$ | 14.12 | 28.38 | 31.88 | 40.66 |
| MA(3Pb:1Sr)I$_3$ | 14.22 | 28.32 | 31.88 | 40.56 |
| MAPbI$_3$ | 14.14 | 28.42 | 31.88 | 40.66 |
| MA(63Pb:1Zn)I$_3$ | 14.14 | 28.44 | 31.88 | 40.70 |
| MA(31Pb:1Zn)I$_3$ | 14.16 | 28.40 | 31.84 | 40.70 |
| MA(15Pb:1Zn)I$_3$ | 14.14 | 28.44 | 31.84 | 40.66 |
| MA(7Pb:1Zn)I$_3$ | 14.14 | 28.42 | 31.90 | 40.72 |
| MA(3Pb:1Zn)I$_3$ | 14.18 | 28.44 | 31.86 | 40.68 |

Photoluminescence Lifetimes.

Since the films must be emissive, the Pb:Fe and Pb:Sn composition sets were excluded from study since sufficient signal could not be detected. The normalized decay profiles for each composition are plotted in FIGS. 33A-33H and the lifetime extracted from each profile is reported in Table 10. Note that the MAPbI$_3$ curve in each plot corresponds to the control device that was fabricated in the same device set as the presented mixed-metal devices.

In this situation, the decay profiles largely do not follow the typical profiles observed in other perovskite films, which are generally either mono-exponential or bimolecular decays. This suggests that there are additional non-radiative decay pathways present that are not accounted for in traditional recombination kinetics models. In the absence of sufficient physical models to describe this trap-assisted recombination regime, it is difficult to accurately extract additional information from the decay profiles, hence the lifetimes defined here are simply taken to be the exponential decay time.

TABLE 10

Photoluminescence decay times for emissive perovskite films for each mixed-metal composition.

| | PL Lifetimes, τ$_{PL}$ [ns] | | | | | |
|---|---|---|---|---|---|---|
| Material | 1Pb:0B | 63Pb:1B | 31Pb:1B' | 15Pb:1B' | 7Pb:1B' | 3Pb:1B' |
| Pb:Co | 13.60 | 5.98 | 1.52 | 3.97 | 18.20 | 33.10 |
| Pb:Cu | 26.22 | 23.20 | 16.80 | 36.37 | 1.19 | 0.67 |
| Pb:Fe | Not Emissive Enough to Measure | | | | | |
| Pb:Mg | 1.37 | 0.93 | 1.15 | 3.90 | 19.89 | 334.67 |
| Pb:Mn | 1.50 | 1.40 | 0.87 | 1.35 | 12.11 | 4.63 |
| Pb:Ni | 4.50 | 10.37 | 1.37 | 0.78 | 48.10 | 17.20 |
| Pb:Sn | Not Emissive Enough to Measure | | | | | |
| Pb:Sr | 32.30 | 30.84 | 17.03 | 2.79 | 331.70 | 137.60 |
| Pb:Zn | 3.67 | 5.02 | 7.44 | 8.78 | 13.89 | 3.40 |

Impact of Light-Soaking on Performance of MA(Pb:Sn)I$_3$ Blends.

Out of all the mixed-metal material sets, only Pb:Sn demonstrated significant changes in the current-voltage characteristics beyond the standard five minutes of light soaking prior to the measurement. The compositions with low Sn content exhibited this behavior, whereas 3Pb:1Sn films did not. An example is shown in FIG. 34 for a MA(15Pb:1Sn)I$_3$ device that initially displayed both hysteresis and low open-circuit voltages, which were improved upon measurement after an additional five minutes of light-soaking.

External Quantum Efficiency.

External quantum efficiency (EQE) measurements were performed on multiple solar cells of each mixed-metal composition. The EQE spectra reported for each mixed-metal set in FIGS. 35A-35I were selected from the same device batch to ensure that changes between devices in a given series is a result of changing the metal the Pb:B' ratio rather than batch to batch variation. Note that the MAPbI$_3$ curve in each plot corresponds to the control device that was fabricated in the same device set as the presented mixed-metal devices. Hence, the measurements for the MAPbI$_3$ control devices will vary slightly between each set of blends.

The EQE spectra can also provide the band gap of the material by plotting it against photon energy and fitting a line to the absorption edge. The band gap, E$_g$ is taken as the x-intercept of the linear fit. The EQE spectra as a function of photon energy and the linear fit at the edges are shown in FIGS. 36A-36I and the corresponding band gaps are reported in Table 11.

TABLE 11

The optical band gap, E$_g$, determined from the EQE spectra as a function of photon energy (FIGS. 36A-36I) for the mixed-metal compositions. Note that the MAPbI$_3$ value listed was fabricated in the same device set as the mixed-metal values presented.

| Material | Optical Band Gap, E$_g$ [eV] | Material | Optical Band Gap, E$_g$ [eV] |
|---|---|---|---|
| MAPbI$_3$ | 1.559 | MAPbI$_3$ | 1.559 |
| MA(63Pb:1Co)I$_3$ | 1.559 | MA(63Pb:1Ni)I$_3$ | 1.564 |
| MA(31Pb:1Co)I$_3$ | 1.559 | MA(31Pb:1Ni)I$_3$ | 1.564 |
| MA(15Pb:1Co)I$_3$ | 1.559 | MA(15Pb:1Ni)I$_3$ | 1.564 |
| MA(7Pb:1Co)I$_3$ | 1.564 | MA(7Pb:1Ni)I$_3$ | 1.596 |

TABLE 11-continued

The optical band gap, $E_g$, determined from the EQE spectra as a function of photon energy (FIGS. 36A-36I) for the mixed-metal compositions. Note that the MAPbI$_3$ value listed was fabricated in the same device set as the mixed-metal values presented.

| Material | Optical Band Gap, $E_g$ [eV] | Material | Optical Band Gap, $E_g$ [eV] |
|---|---|---|---|
| MA(3Pb:1Co)I$_3$ | 1.559 | MA(3Pb:1Ni)I$_3$ | 1.591 |
| MAPbI$_3$ | 1.559 | MAPbI$_3$ | 1.563 |
| MA(63Pb:1Cu)I$_3$ | 1.559 | MA(63Pb:1Sn)I$_3$ | 1.560 |
| MA(31Pb:1Cu)I$_3$ | 1.559 | MA(31Pb:1Sn)I$_3$ | 1.563 |
| MA(15Pb:1Cu)I$_3$ | 1.559 | MA(15Pb:1Sn)I$_3$ | 1.560 |
| MA(7Pb:1Cu)I$_3$ | 1.559 | MA(7Pb:1Sn)I$_3$ | 1.406 |
| MA(3Pb:1Cu)I$_3$ | 1.559 | MA(3Pb:1Sn)I$_3$ | 1.312 |
| MA(1Pb:1Cu)I$_3$ | 1.559 | MA(1Pb:1Sn)I$_3$ | 1.240 |
| MAPbI$_3$ | 1.565 | MAPbI$_3$ | 1.564 |
| MA(63Pb:1Fe)I$_3$ | 1.565 | MA(63Pb:1Sr)I$_3$ | 1.563 |
| MA(31Pb:1Fe)I$_3$ | 1.562 | MA(31Pb:1Sr)I$_3$ | 1.563 |
| MA(15Pb:1Fe)I$_3$ | 1.565 | MA(15Pb:1Sr)I$_3$ | 1.563 |
| MA(7Pb:1Fe)I$_3$ | 1.578 | MA(7Pb:1Sr)I$_3$ | 1.572 |
| MA(3Pb:1Fe)I$_3$ | 1.569 | MA(3Pb:1Sr)I$_3$ | 1.653 |
| MAPbI$_3$ | 1.564 | MAPbI$_3$ | 1.564 |
| MA(63Pb:1Mg)I$_3$ | 1.564 | MA(63Pb:1Zn)I$_3$ | 1.564 |
| MA(31Pb:1Mg)I$_3$ | 1.564 | MA(31Pb:1Zn)I$_3$ | 1.564 |
| MA(15Pb:1Mg)I$_3$ | 1.564 | MA(15Pb:1Zn)I$_3$ | 1.564 |
| MA(7Pb:1Mg)I$_3$ | 1.569 | MA(7Pb:1Zn)I$_3$ | 1.559 |
| MA(3Pb:1Mg)I$_3$ | 1.574 | MA(3Pb:1Zn)I$_3$ | 1.564 |
| MAPbI$_3$ | 1.565 | MAPbI$_3$ | 1.562 |
| MA(63Pb:1Mn)I$_3$ | 1.562 | MA(63Pb:1MAI)I$_3$ | 1.562 |
| MA(31Pb:1Mn)I$_3$ | 1.562 | MA(31Pb:1MAI)I$_3$ | 1.562 |
| MA(15Pb:1Mn)I$_3$ | 1.562 | MA(15Pb:1MAI)I$_3$ | 1.567 |
| MA(7Pb:1Mn)I$_3$ | 1.562 | MA(7Pb:1MAI)I$_3$ | 1.571 |
| MA(3Pb:1Mn)I$_3$ | 1.556 | MA(3Pb:1MAI)I$_3$ | 1.835 |

Photoluminescence Spectra of Pb:Fe Mixtures.

FIGS. 37A-37B shows the photoluminescence emission spectra for MA(Pb:Fe)I$_3$ perovskite films show, which illustrates substantial emission quenching.

Performance of MA(Pb:Cu)I$_3$ Mixtures

The identification of Cu as a possible candidate for blending with Pb is a new finding and merits some attention. Although a champion value of 8.3% was obtained for MA(3Pb:1Cu)I$_3$ devices, only one batch of devices was able to attain this level of performance and these devices only achieved high performance during the first current-voltage characteristic measurement. As is shown in FIG. 38, when a second measurement was performed after another five minutes of light soaking, the JV curve became unstable as the measured photocurrent was often discontinuous during the bias voltage sweep.

Figure 38:
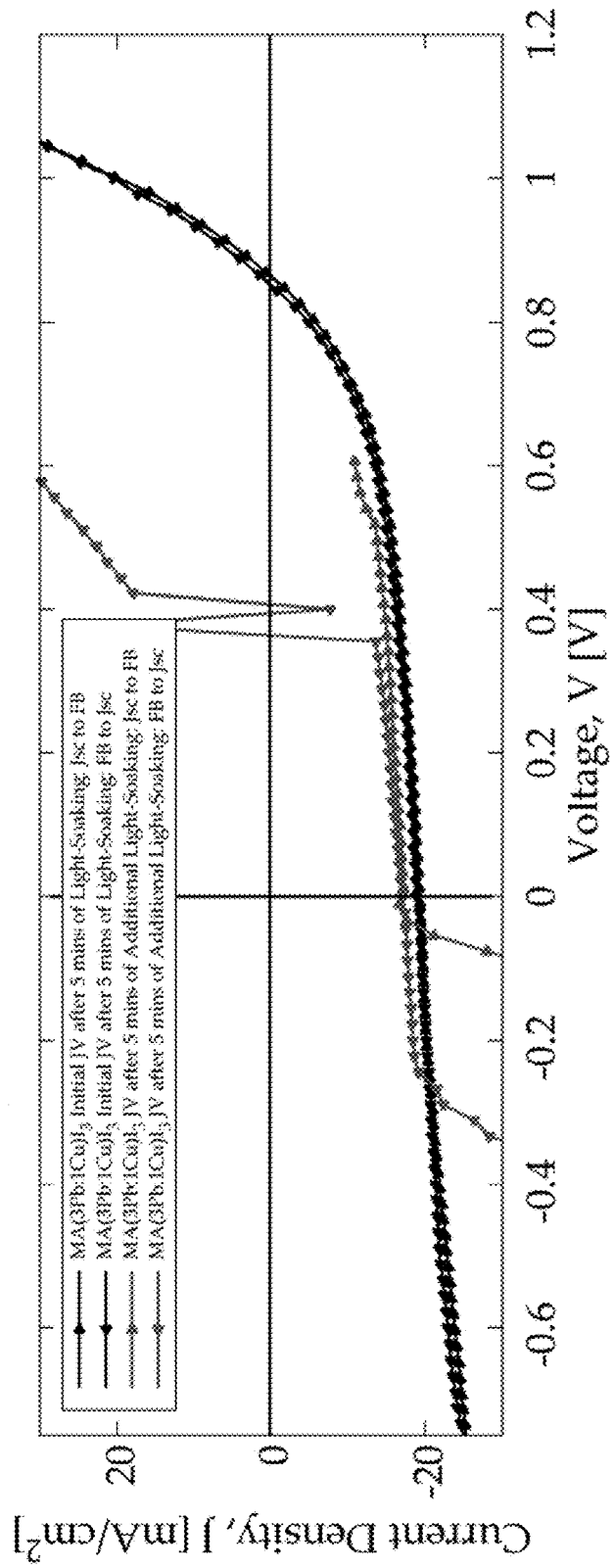
FIG. 38 shows the initial JV sweep of MA(3Pb:1Cu)I$_3$ yield high currents with little hysteresis.

To explore the possible origins of this strange behavior, the same solar cell presented in FIG. 38 was allowed to rest for several hours. Then a set of JV sweeps was performed after device was held at forward bias (1.4 V) in the open-circuit configuration for various periods of time. Doing so allows mobile ions and charges to migrate to a new configuration that might either promote performance or damage it. These tests revealed several interesting observations:

1. The 8.3% solar cell was able to recover from its erratic encore performance after several hours of resting and operate with well-behaved JV curves. However, the PCE was reduced from 8.3% to 4.3%.
2. As the devices are held at forward bias for longer periods of time, the hysteresis between the forward and reverse sweeps grows until the reverse sweep becomes erratic.

It is unclear exactly why substituting Pb with Cu produces this behavior, however it may be related to the fact that copper is the only ion out of those investigated that is more stable with a +1 rather than a +2 oxidation state in the presence of iodide anions. It is possible that sometimes the initial mixed-metal perovskite contains $Cu^{2+}$ ions in the perovskite, however during device operation, photogenerated electrons or mobile iodide ions might reduce the $Cu^{2+}$ species to $Cu^+$, which would locally disrupt the perovskite crystal and create a set of newly formed mobile ions that might account for the erratic JV behavior. The $Cu^+$ ions would then be unable to replace the B-site cation in the perovskite lattice and would form a second phase of CuI in the perovskite film, allowing the device to operate again. It has been reported that CuI is an efficient hole transport material for perovskite devices (see J. A. Christians, R. C. M. Fung and P. V. Kamat, J. Am. Chem. Soc., 2014, 136, 758-764, which is incorporated by reference in its entirety), and it is possible that it might initially benefit device performance by providing a pathway for hole-transport from the bulk of the lattice. However, CuI can also act as a shunt if it directly contacts the fullerene layer, which would explain why the shunt resistance is noticeably lower for the JV curves of the Pb:Cu blends in FIG. 2B of the main manuscript. A second material phase is clearly observable in the 1Pb:1Cu SEM image presented in FIG. 13. Furthermore, the XRD spectra for 3Pb:1Cu and 7Pb:1Cu films (FIG. 25) display an additional peak at 2θ=25.2°, which is consistent with the (111) planes of CuI. The JV curves for the Pb:Cu devices are also the only ones to demonstrate deviation from diode behaviour near reverse bias conditions.

Figure 39B:
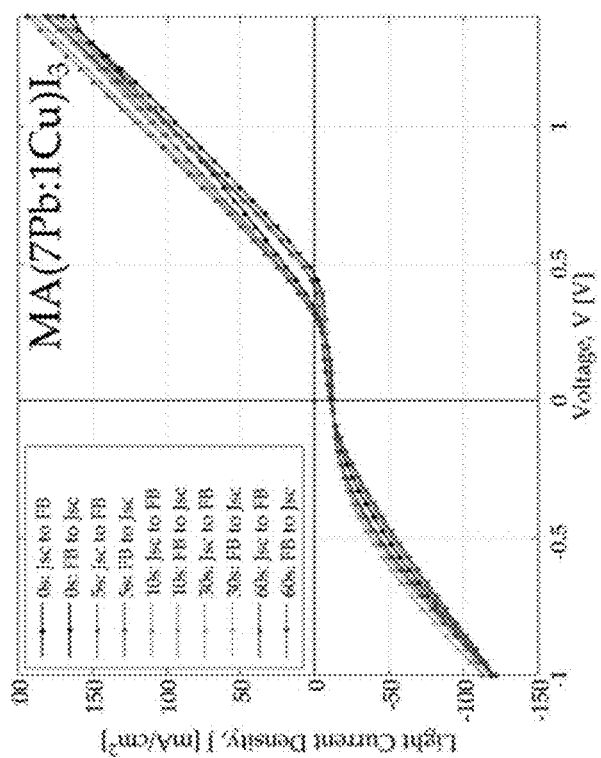
FIG. 39A-39F shows the effect of holding each composition of mixed-metal MA(Pb:Cu)I$_3$ solar cells at forward bias (1.4 V) between 0 and 60 seconds prior to JV curve measurement.
Figure 39A:
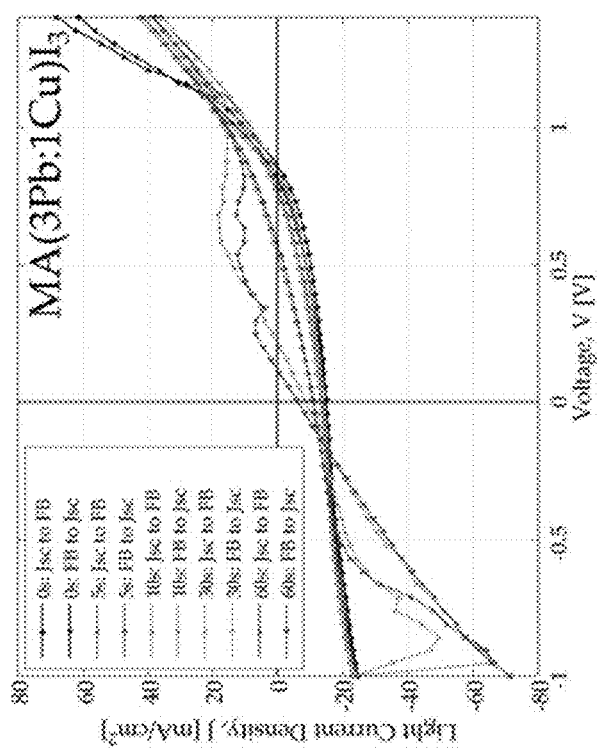
Figure 39D:
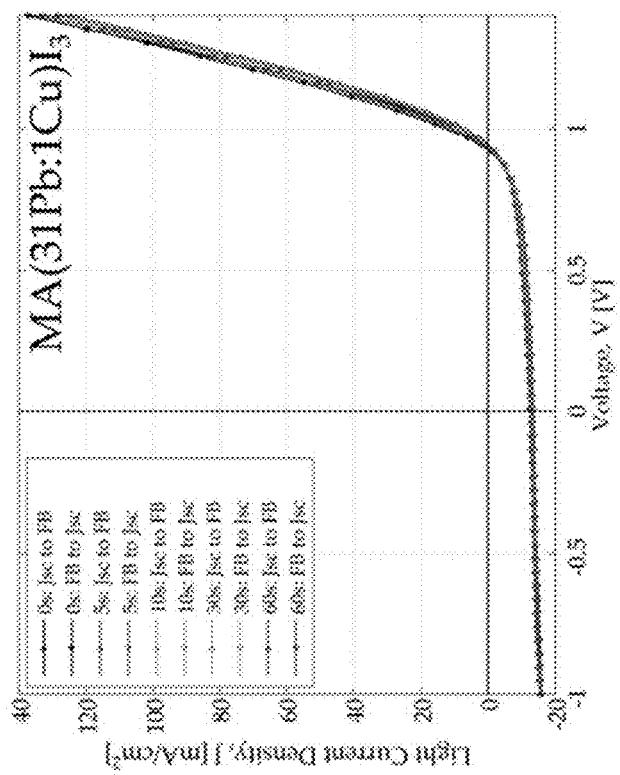
Figure 39C:
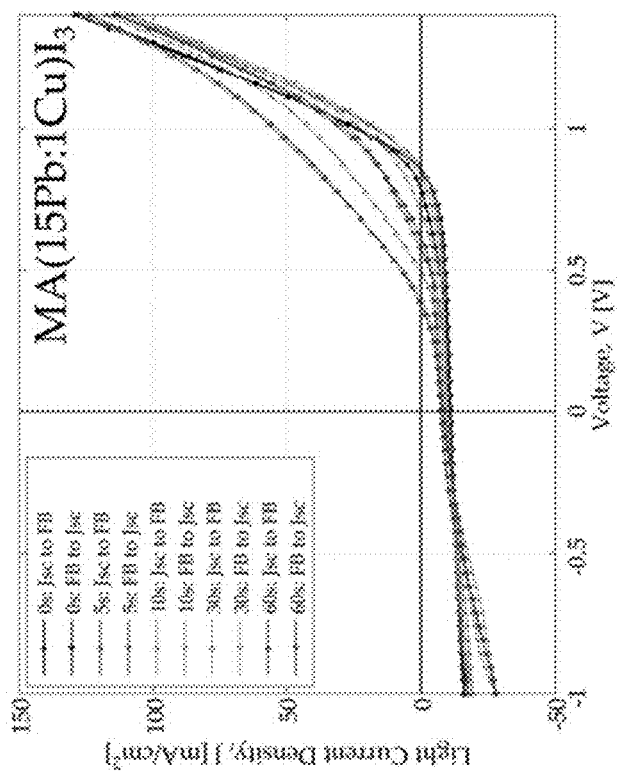
Figure 39F:
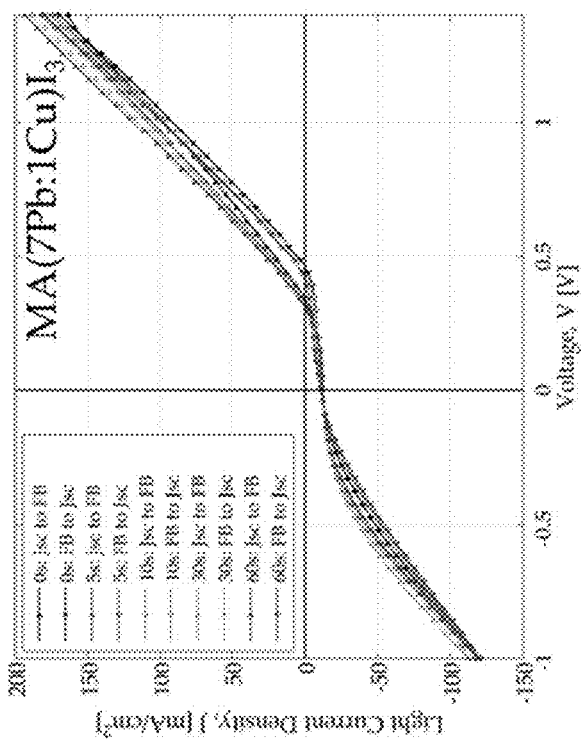
Figure 39E:
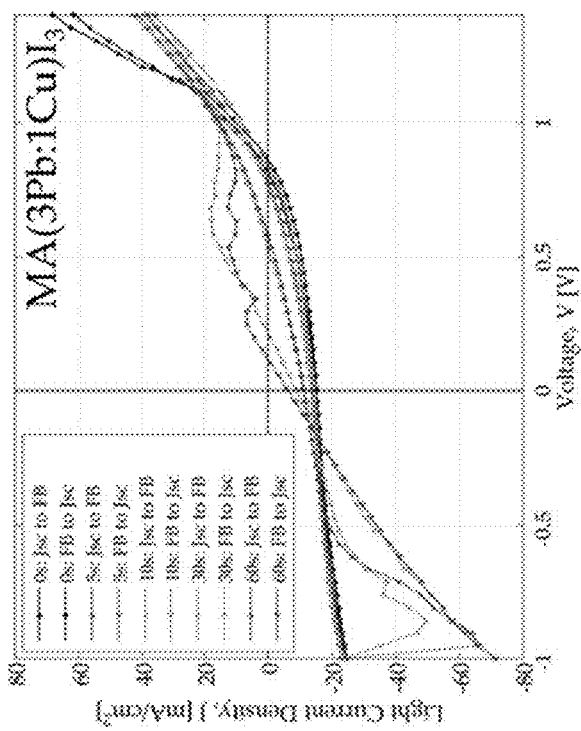

FIG. 39A-39F presents the results of the pre-biasing study where the MA(Pb:Cu)I$_3$ devices, including the exact device that achieved the 8.3% performance, were first held at forward bias ($V_{bias}$=1.4 V) for 0 to 60 seconds prior to measuring the JV curves. For short hold times, the MA(3Pb:1Cu)I$_3$ had minimal hysteresis. However, as the hold times lengthen, the hysteresis between forward and reverse scans increases until eventually the reverse scan completely destabilizes and the JV curve becomes erratic. The devices with lower Cu content demonstrate an increase in hysteresis with increasing hold times, but this instability is not observed. However, the MA(7Pb:1Cu)I$_3$ sweeps in FIG. 39B show substantial deviation from diode behavior near reverse bias. This behavior is also witnessed to a lesser degree in MA(15Pb:1Cu)I$_3$ (FIG. 39C). For devices with even lower Cu content, the JV curves become well-behaved and very little hysteresis or anomalous behavior is observed regardless of bias time.

When the behavior of a device changes substantially with initial biased hold times, some charge carriers or ions are responding to the applied electric field through the device and are migrating into a new configuration. Since this behavior is exacerbated with increasing Cu content, it is reasonable to conclude that the Cu content is indeed responsible for the behavior. It is possible that films with higher Cu content contain more mobile ions or charge carriers that are able to migrate in response to the electric field and create substantial hysteresis that generate unfavorable conditions for device performance.

Ultraviolet Photoelectron Spectroscopy

Data Processing of UPS Measurement.

Vacuum energies were determined from the intersection of a linear extrapolation of the secondary electron cut-off to zero, subtracted from the 21.22 eV photon energy. Valence band binding energies were determined from the intersection of a linear extrapolation of the primary electron cut-off to a linear extrapolation of the baseline. The absolute energy resolution is estimated to be ~0.15 eV. The ultraviolet photoelectron spectra for PEDOT:PSS, MAPbI$_3$, and the MA(Pb:Co)I$_3$ materials are shown in FIG. 40.

Energetics at Perovskite/PEDOT:PSS Interface.

Figure 40:
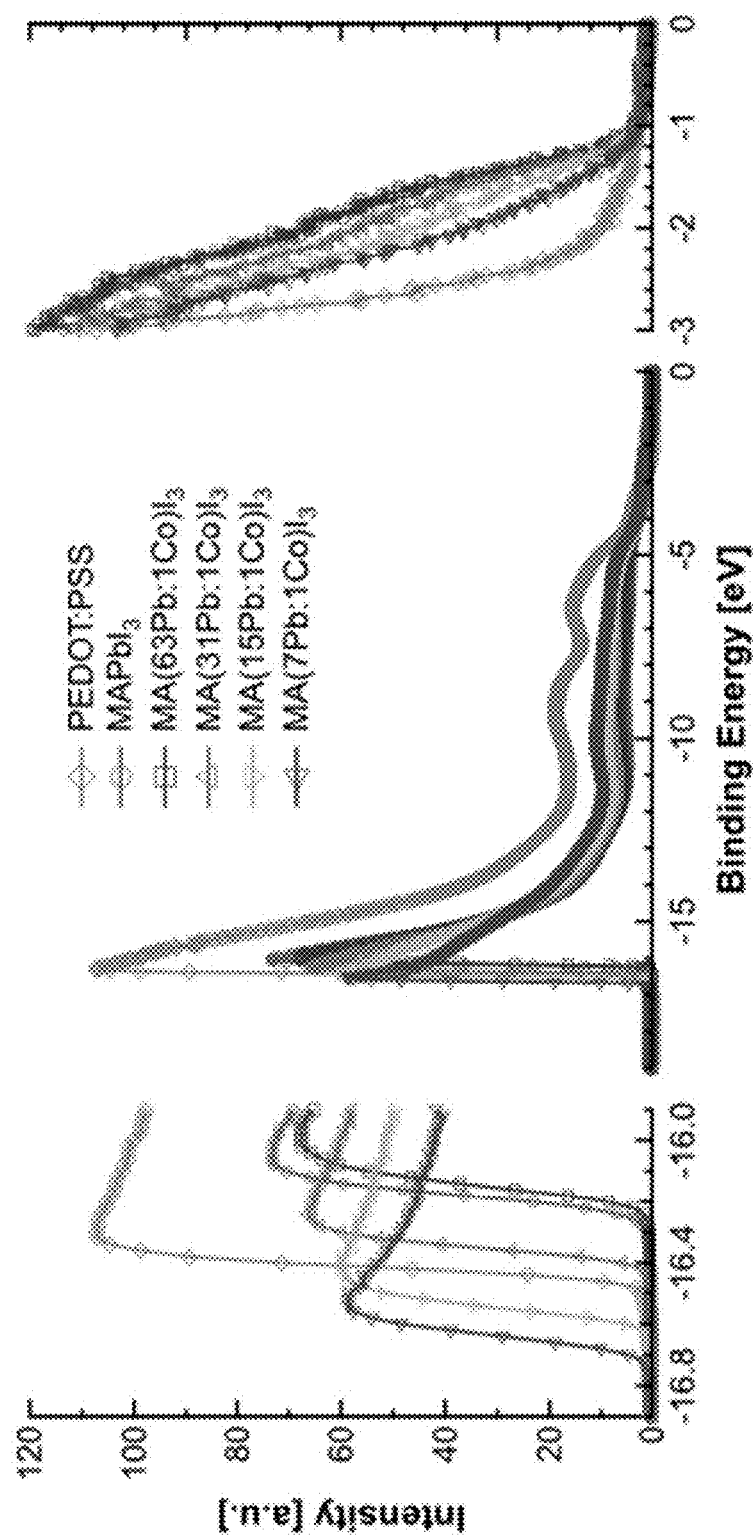
FIG. 40 shows secondary electron edge (left panel) and primary electron edge (right panel) of a representative ultraviolet photoelectron spectrum (middle panel) for PEDOT:PSS and MA(Pb:Co)I$_3$ mixed-metal perovskite films built on a DIO-treated PEDOT:PSS film on ITO.

As is evident from the left-hand panel of FIG. 40, the work function of MAPbI$_3$ is greater than the work function of PEDOT:PSS. As the Co content in the perovskite is increased, the work function becomes progressively shallower, eventually becoming shallower than the PEDOT:PSS for the 15Pb:1Co material. The position of the perovskite Fermi level relative to that of PEDOT:PSS determines the vacuum energy shift and built-in electric field in the region of the perovskite/PEDOT:PSS interface under equilibrium. Based on the energy levels determined from the UPS measurements, a band diagram was constructed for the perovskite/PEDOT:PSS junction for each Pb:Co composition (FIG. 41) in order to better understand how the mismatches in Fermi energy might influence device behavior.

Figure 41:
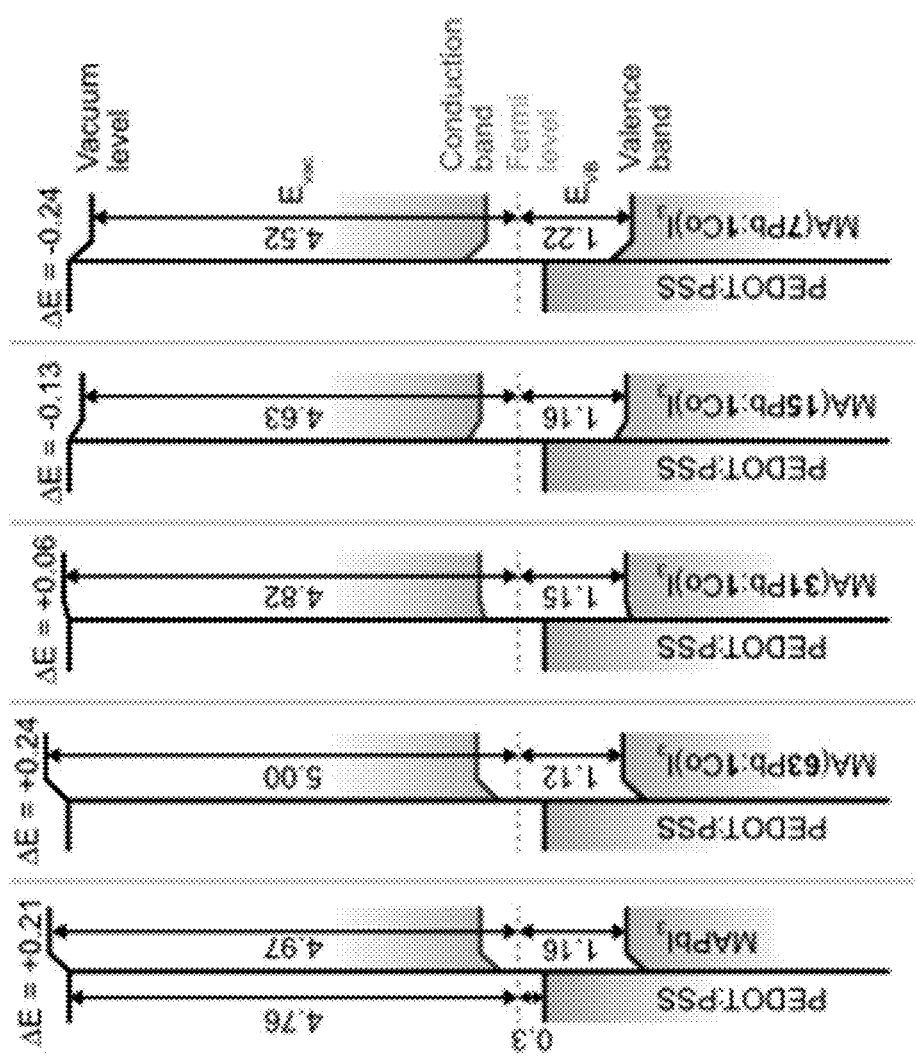
FIG. 41 shows the expected band-bending behaviour of the perovskite/PEDOT:PSS junction for MAPbI$_3$ and each mixed-metal MA(Pb:Co)I$_3$ perovskite.

As is shown in FIG. 41, there is an unfavorable vacuum energy offset (i.e. ΔE>0) at the interface between PEDOT: PSS and MAPbI$_3$, which is manifested either as a surface dipole or as band-bending. This vacuum energy offset indicates the presence of a built-in electric field across the interface that opposes the transfer of holes from the valence band edge of MAPbI$_3$ into PEDOT:PSS. As the Co content in the perovskite film is increased, the mixed-metal perovskite work function decreases and—for Co loadings greater than 15Pb:1Co—becomes shallower than the PEDOT:PSS work function, indicating a reversal in the polarity of the built-in electric field for these samples. This change in polarity is illustrated by the upward band-bending of the perovskite energy levels at the PEDOT:PSS/perovskite interface for the 15Pb:1Co and 7Pb:1Co compositions. Hence, introducing Co into the perovskite material shifts the work function into a more favorable alignment that is expected to improve hole extraction at the PEDOT:PSS interface, and thereby improve the photovoltaic performance of the device.

Open-Circuit Voltage Improvement.

In addition to producing an unfavorable electric field that opposes hole injection into PEDOT:PSS, the downward band-bending illustrated in FIG. 41 for the MAPbI$_3$/PEDOT:PSS interface could drive electrons in MAPbI$_3$ toward the PEDOT:PSS, which presents a possible leakage pathway through the device. In contrast, the upward band-bending of the mixed-metal perovskites with higher Co content could provide a beneficial interfacial barrier that reduces electron leakage into the PEDOT:PSS. This reduction in election leakage into the PEDOT:PSS should correspond to a decrease in forward-bias dark current. Although PEDOT: PSS is generally considered to be an electron-blocking material, the EDX maps of FIGS. 6A-6E in the main manuscript suggest that I, Pb, and Co atoms are all present in the PEDOT:PSS layer. It is possible that the electron-blocking property of PEDOT:PSS has been compromised by defect states resulting from the leaching of these elements from the perovskite into the PEDOT:PSS. Indeed, the UPS spectrum of PEDOT:PSS near the valence band edge (right-panel of FIG. 40) is quite broad without a sharp cut-off, suggesting that such states could extend into the band.

According to the standard diode model of the solar cell, the open-circuit voltage, $V_{OC}$, is logarithmically-inversely related to the diode saturation current density, $J_S$:

$$V_{OC} = \frac{nk_BT}{q}\ln\left(\frac{J_{SC}}{J_S} + 1\right), \tag{S1}$$

where n is the diode ideality factor, $k_B$ is Boltzmann's constant, T is temperature, q is the charge of the electron, and $J_{SC}$ is the short-circuit current density when under illumination.

Figure 42A:
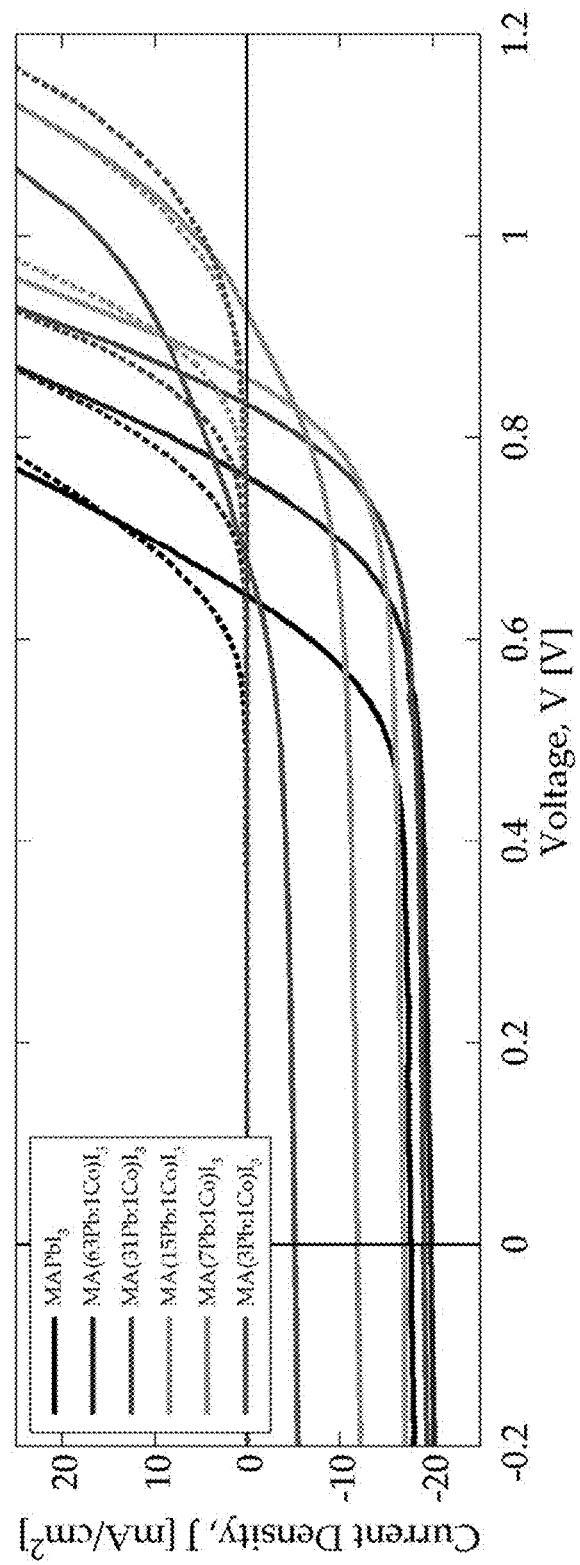
FIGS. 42A-42B show linear and semi-logarithmic current-voltage characteristics for representative MA(Pb:Co)I$_3$ mixed-metal perovskite solar cells under 1-sun illumination (solid lines) and in the dark (dotted lines).
Figure 42B:
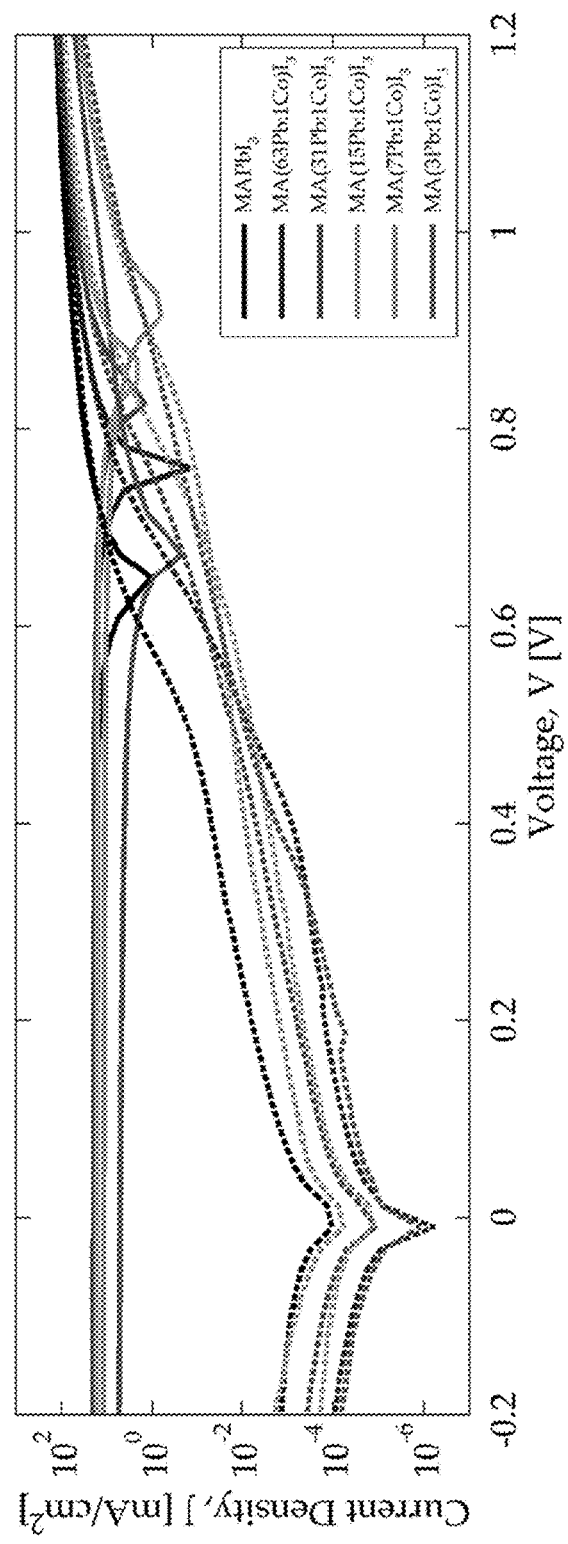

Equation S1 shows that the open-circuit voltage will increase if the diode saturation current is reduced (i.e. if there is less recombination current or leakage current through the solar cell, corresponding to a lower dark current). FIGS. 42A-42B shows that the forward-bias dark current decreases with increasing Co content, matching the trend of increasing $V_{OC}$ for these materials. This trend in dark current and $V_{OC}$ could be explained by the band-bending effects noted above: as the Co content is increased, the barrier to electron leakage into the PEDOT:PSS is strengthened, thus reducing the dark current and increasing the $V_{OC}$. The increasing conduction-band offset between the mixed-metal Pb:Co perovskites and PCBM as the Co content is increased could also decrease the forward-bias leakage current by making electron transfer from PCBM to the perovskite less favourable.

This relationship between Co content, Fermi level shift, leakage current, and open-circuit voltage offers an explanation why the reductions of the mixed-metal perovskite work function with Co content produces a more beneficial energetic configuration, which is consistent with the observed enhancement trends in open-circuit voltage produced by Pb:Co perovskite devices.

Pb:Sr Perovskites with Improved Thermal Stability

The construction of alternative direct analogues to lead-based metal halide perovskite materials requires that the B-site metal cation of the ABX$_3$ crystal lattice (FIGS. 43A-43C) be divalent. Mixed-metal perovskite materials can be integrated into an inverted device architecture using a one-step method where methylammonium iodide (MAI), lead acetate (Pb(OAc)$_2$), and strontium iodide (SrI$_2$) are dissolved in DMF, the solution is spin-coated onto PEDOT: PSS, and the perovskite is crystallized by drying and annealing the film. Therefore, the search for lead-free perovskites has presently focused almost exclusively on divalent ions found within the same column of the periodic table as Pb, mainly Sn$^{2+}$ and Ge$^{2+}$. Wholly tin-based perovskite solar cells built on mesoporous titania scaffolds have been reported with MASnI$_3$ and MASnI$_{3-x}$Br$_x$ devices reaching power conversion efficiencies (PcE) of 5-6%. See, Löper, P. et al. Organic-inorganic halide perovskite/crystalline silicon four-terminal tandem solar cells. *Phys Chem Chem Phys* 17, 1619-1629 (2015), and Mailoa, J. P. et al. A 2-terminal perovskite/silicon multijunction solar cell enabled by a silicon tunnel junction. *Appl. Phys. Lett.* 106, 121105 (2015), each of which is incorporated by reference in its entirety. Likewise the synthesis of several germanium-based perovskite materials has been reported, although working devices have yet to exceed 1% efficiency. See, Stoumpos, C. C. et al. Hybrid Germanium Iodide Perovskite Semiconductors: Active Lone Pairs, Structural Distortions, Direct and Indirect Energy Gaps, and Strong Nonlinear Optical Properties. *J. Am. Chem. Soc.* 137, 6804-6819 (2015), and Krishnamoorthy, T. et al. Lead-free germanium iodide perovskite materials for photovoltaic applications. *J Mater Chem A* 3, 23829-23832 (2015), each of which is incorporated by reference in its entirety. One of the major drawbacks of both Sn and Ge-based perovskites is that Sn$^{2+}$ and Ge$^{2+}$ readily oxidise to Sn$^{4+}$ and Ge$^{4+}$ upon exposure to air, which causes the perovskite to destabilise into multiple phases, thereby destroying photovoltaic performance. Thus, Sn and Ge-based solar cells will require robust encapsulation to avoid rapid degradation when operating in the field. From a manufacturing perspective, the ideal solar cell structure consists of planar material layers that are easily fabricated using either solution or vapour deposition techniques. The Sn-based materials reported to date are not compatible with planar interfaces due to their short carrier diffusion lengths (see, Noel, N. K. et al. Lead-Free Organic-Inorganic Tin Halide Perovskites for Photovoltaic Applications. *Energy Environ. Sci.* (2014), which is incorporated by reference in its entirety), and instead require more elaborate mesoporous or bulk-heterojunction architectures to achieve efficient charge collection. Furthermore, recent toxicological studies reveal that although Sn itself is inherently less toxic that Pb, tin-halide perovskites will decompose into an acid by-product more readily than lead analogues, thereby producing another health risk through environmental acidification. See, Babayigit, A. et al. Assessing the toxicity of Pb- and Sn-based perovskite solar cells in model organism *Danio rerio. Sci. Rep.* 6, 18721 (2016), which is incorporated by reference in its entirety. Hence, there is a pressing need for finding alternate metals other than Sn that are suitable for Pb replacement in perovskite materials.

The second issue of long-term stability in perovskite stems from the predominant use of the $MA^+$ ion at the A-site of the crystal lattice. If the methylammonium lead halide perovskite is heated to temperatures above ~120° C., the perovskite lattice will degrade by the methylammonium ion decomposing into hydroiodic acid and methylamine, which then leave the material through evaporation. See, Dualeh, A., Gao, P., Seok, S. I., Nazeeruddin, M. K. & Grätzel, M. Thermal Behavior of Methylammonium Lead-Trihalide Perovskite Photovoltaic Light Harvesters. *Chem. Mater.* 26, 6160-6164 (2014), which is incorporated by reference in its entirety. Likewise, degradation also occurs by moisture due to the solubility of the perovskite in water. At the moment, the most successful strategies to improving the stability of the perovskite material is to replace the methylammonium ion with different ions such as formamidinium (FA) and cesium (Cs). See, Sutton, R. J. et al. Bandgap-Tunable Cesium Lead Halide Perovskites with High Thermal Stability for Efficient Solar Cells. *Adv. Energy Mater.* 1502458 (2016), and Eperon, G. E. et al. Inorganic caesium lead iodide perovskite solar cells. *J Mater Chem A* 3, 19688-19695 (2015), each of which is incorporated by reference in its entirety. Cs-based perovskites can withstand remarkably high temperatures, up to several hundred degrees celsius, but the perovskite phase is meta-stable at room temperature and will transition into a crystal phase that is not photovoltaic upon moisture exposure. Likewise, FA-based perovskites also demonstrates improved thermal stability, albeit less than cesium analogues, however it is also prone to destabilization in a humid environment. While these alternate A-site cations have yielded working solar cells, the current champion solar cells are based on a mixture of MA and FA, achieving a PCE of 21%. See, Bi, D. et al. Efficient luminescent solar cells based on tailored mixed-cation perovskites. *Sci. Adv.* 2, (2016), which is incorporated by reference in its entirety. Therefore, it is desirable to find a pathway that is capable of resisting thermal degradation without wholly removing methylammonium.

A composition disclosed herein simultaneously reduces toxicity while improving the resistance of methylammonium-based perovskites to thermal degradation. This is achieved by replacing a portion of the Pb content in the perovskite material with a non-toxic alkaline earth metal, specifically strontium (Sr), to make methylammonium mixed-metal triiodide perovskites, denoted as $MA(Pb:Sr)I_3$, which contain the ions shown in FIG. 43B. As shown in FIG. 43C, the perovskite solar cells were fabricated using acetate and iodide salts as the precursors and the inverted device configuration, where the perovskite is deposited on a hole transporter such as PEDOT:PSS and use fullerene derivatives as an electron transporter layer. See, Snaith, H. J. Perovskites: The Emergence of a New Era for Low-Cost, High-Efficiency Solar Cells. *J. Phys. Chem. Lett.* 4, 3623-3630 (2013), Boix, P. P., Agarwala, S., Koh, T. M., Mathews, N. & Mhaisalkar, S. G. Perovskite Solar Cells: Beyond Methylammonium Lead Iodide. *J. Phys. Chem. Lett.* 6, 898-907 (2015), and Mitzi, D. B., Chondroudis, K. & Kagan, C. R. Organic-inorganic electronics. *IBM J. Res. Dev.* 45, 29-45 (2001), each of which is incorporated by reference in its entirety. Inverted devices exhibit minimal hysteresis effects and this configuration was chosen to eliminate the device architecture itself as a source of hysteresis in the event mixed-metal devices displayed such behavior in the current-voltage characteristics. Lead acetate was chosen as the metal precursor materials because the process produces remarkably smooth perovskite films. See, Snaith, H. J. Perovskites: The Emergence of a New Era for Low-Cost, High-Efficiency Solar Cells. *J. Phys. Chem. Lett.* 4, 3623-3630 (2013), which is incorporated by reference in its entirety. As is represented by the schematic in FIG. 43C, a 3:1 molar ratio of $MAI:Pb(OAc)_2$ was blended with a 1:1 molar ratio of $MAI:SrI_2$ in DMF. To build the inverted device architecture, the perovskite solution was spin-coated on a PEDOT:PSS layer and crystallised by drying and annealing the film. This was followed by spin-coating and heat-treating a layer of the n-type fullerene derivative, phenyl-C61-butyric acid methyl ester (PCBM), and the sequential deposition of Ca and Al as the top electrode materials through thermal evaporation.

Figure 44A:
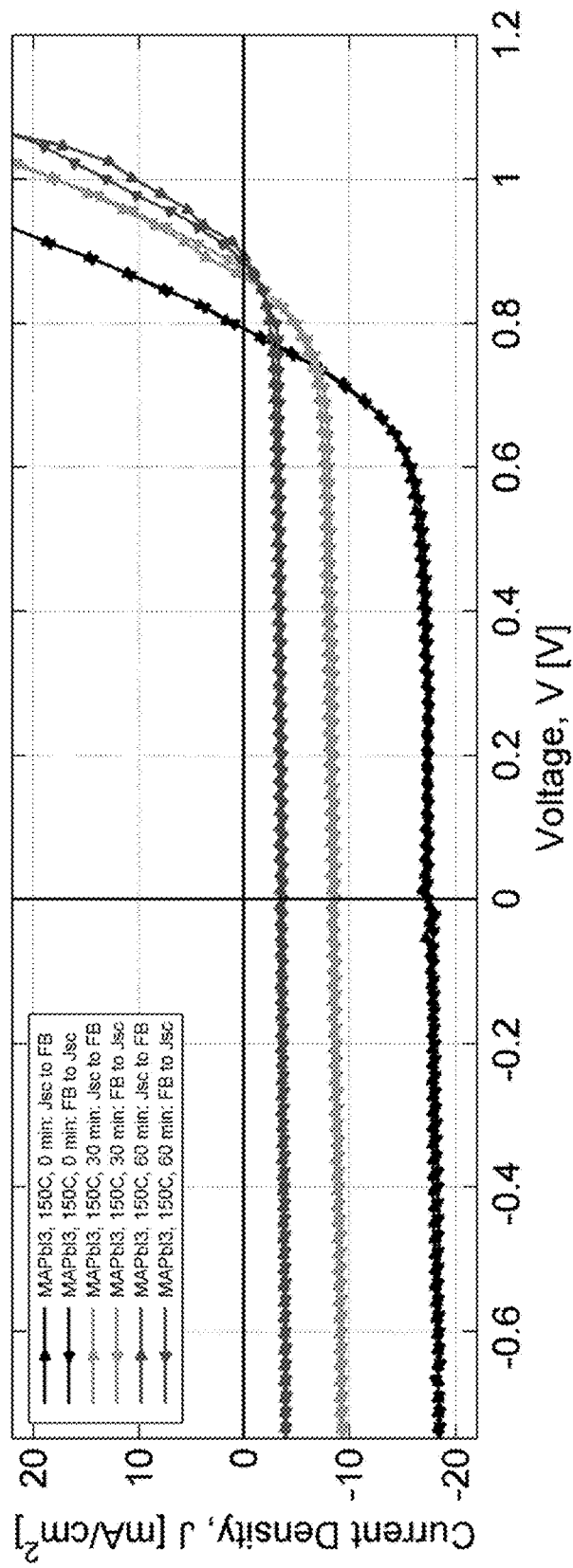
FIGS. 44A-44B show forward (right-pointed triangles) and reverse (left-pointing triangles) current-voltage (JV) characteristic scans measured from the best performing solar cells of MAPbI$_3$ (FIG. 44A) and MA(15Pb:1Sr)I$_3$ (FIG. 44B) assembled after heating the perovskite film at 150° C. in an nitrogen atmosphere for 0, 30, and 60 minutes.
Figure 44B:
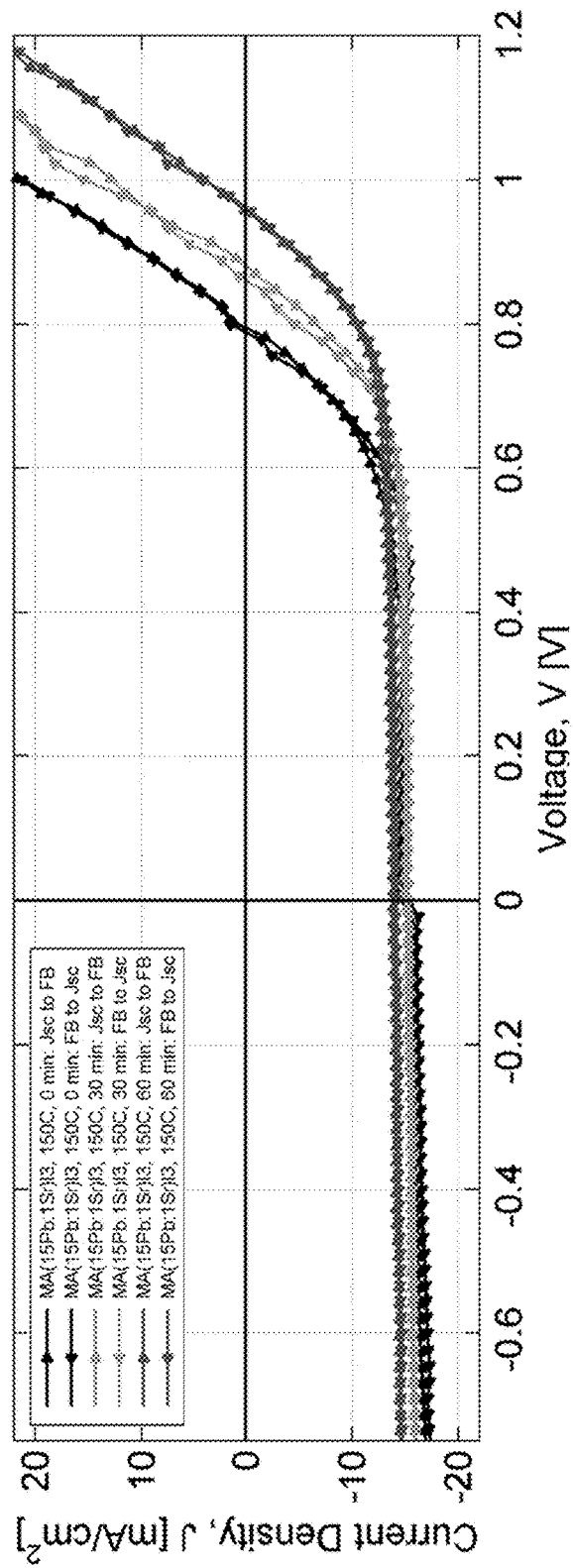
Figure 45:
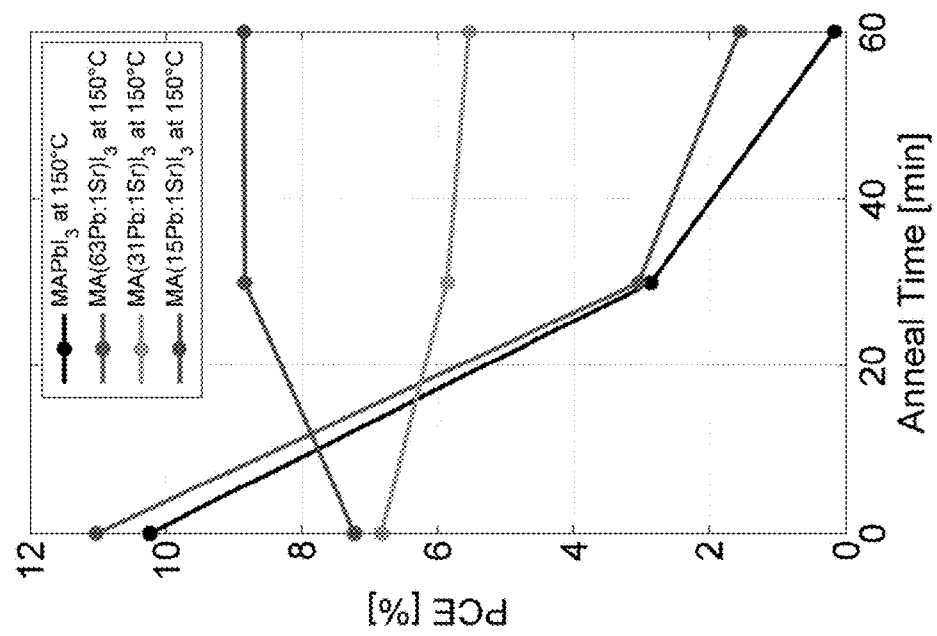
FIG. 45 shows power conversion efficiency of champion device of MAPbI$_3$ and MA(Pb:Sr)I$_3$ mixed-metal perovskite assembled after heating the perovskite film for various times at 150° C. in an inert nitrogen atmosphere.
Figure 46A:
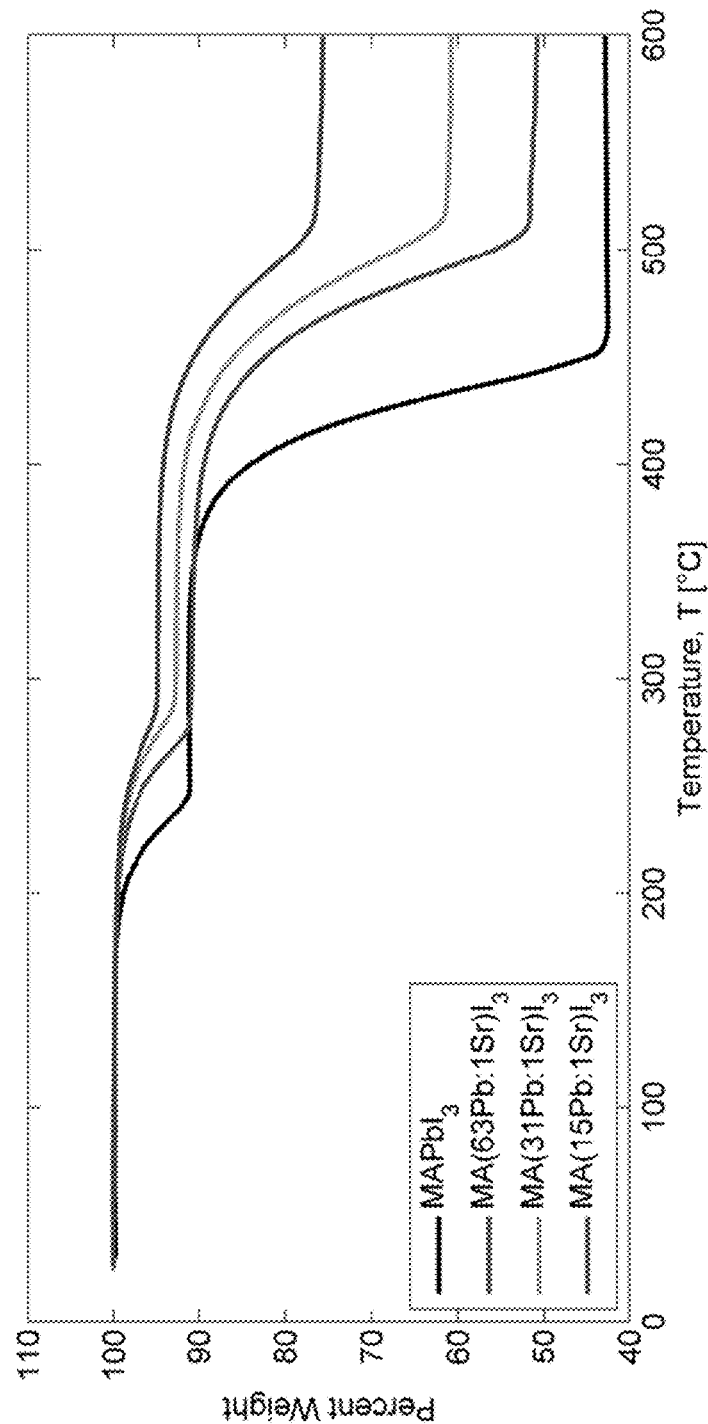
FIG. 46A shows a plot of percent mass as a function of heating temperature.

Thermal degradation in photovoltaic performance was empirically assessed by testing devices constructed from perovskite films that had been heated to elevated temperatures in an inert atmosphere for various periods of time. FIGS. 44A-44B shows the champion current-voltage (JV) characteristics of solar cells assembled from $MAPbI_3$ and $MA(15Pb:Sr)I_3$ (i.e. where $1/16^{th}$ of the Pb content has been replaced with Sr) after heating at 150° C. for 0, 30, and 60 minutes. As is evident from the JV curves, heating the $MAPbI_3$ material at 150° C. dramatically reduces the efficiency, whereas the $MA(15Pb:1Sr)I_3$ composition can resist performance degradation even after an hour of heat treatment. As is shown by the champion PCE presented in FIGS. 46A-46B, the resistance to thermal degradation improves as the molar metal fraction of Sr is increased, which indicates this secondary metal species has an active role in improving thermal stability.

Figure 46B:
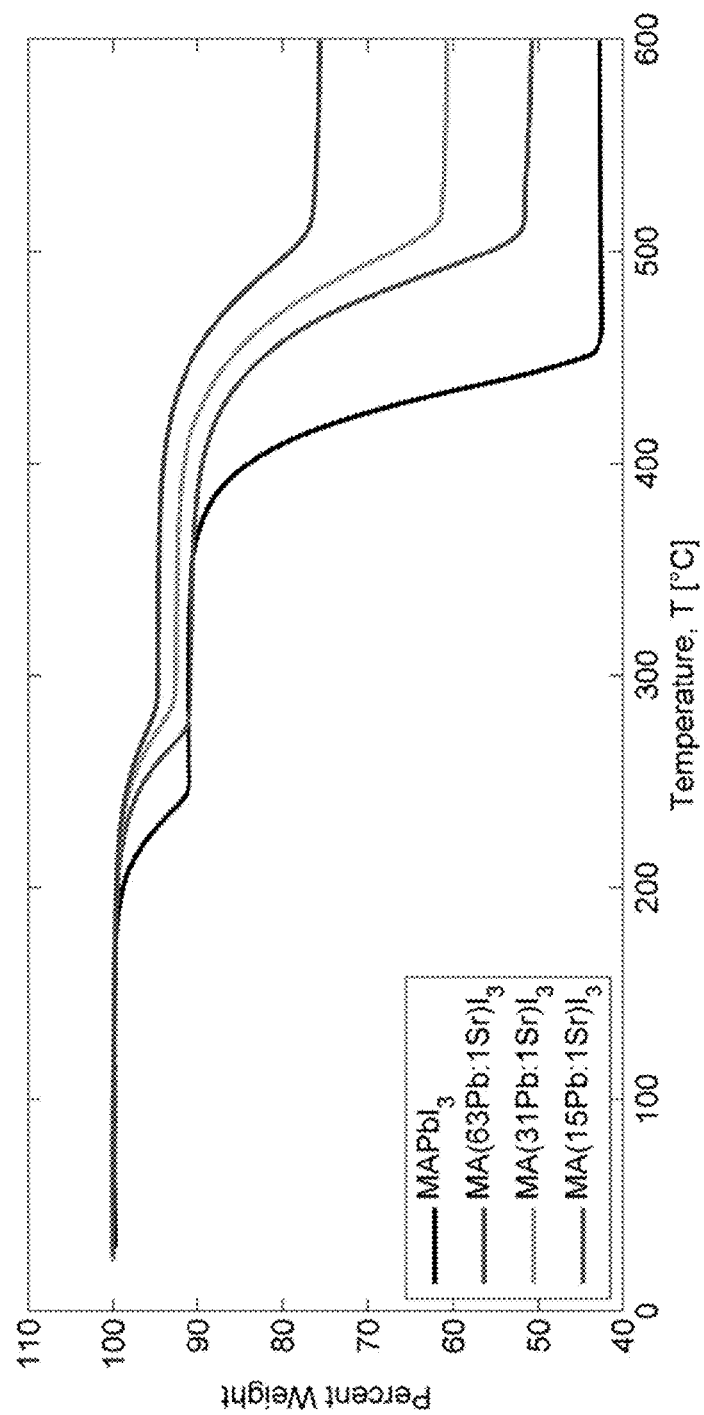
FIG. 46B shows a plot of its derivative, as obtained by thermogravimetric analysis performed in a nitrogen atmosphere, for MAPbI$_3$ and MA(Pb:Sr)I$_3$ perovskites reveals that introducing Sr into the perovskite material raises the temperatures at which degradation stages occur.
Figures 47A, 47B:
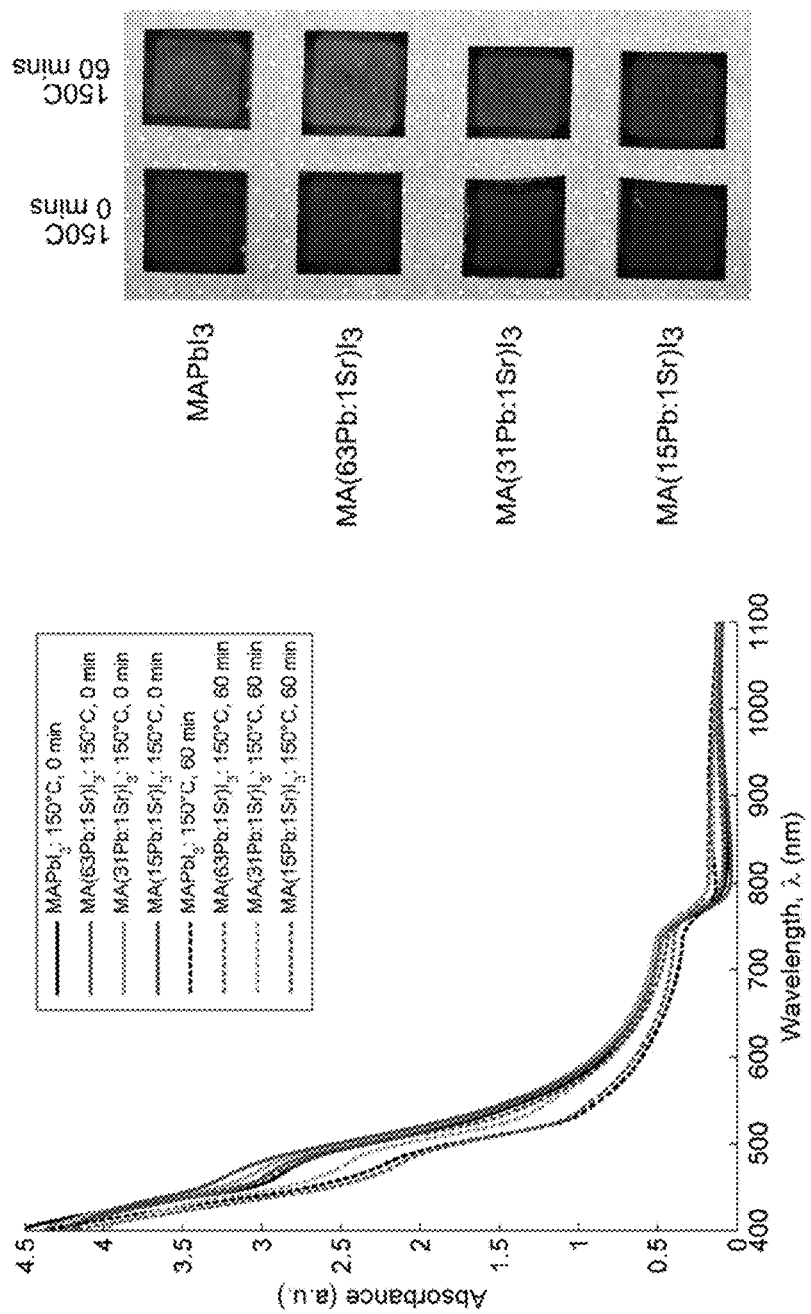
FIG. 47A shows the absorbance spectra of companion films of MAPbI$_3$ and MA(Pb:Sr)I$_3$ perovskite materials that have not received heat treatment at 150° C. (solid lines) against those that were heated at 150° C. for 60 minutes (dotted lines).
FIG. 47B shows photos of MAPbI$_3$ and MA(Pb:Sr)I$_3$ perovskite films with and without heat treatment at 150° C.

The improved resistance of the Pb:Sr mixed-metal perovskite compositions to thermal degradation is directly related to the improved thermal stability of the perovskite material. This is evidenced by the thermogravimetric analysis (TGA) curves presented in FIGS. 46A-46B, which show how each of the perovskite composition decomposes by reporting the percentage of initial mass as a function of temperature and its derivative. FIG. 46B clearly shows that the stages of decomposition for the $MA(Pb:Sr)I_3$ materials, which correspond to the peaks, occur at temperatures that are around 50° C. higher than those for $MAPbI_3$. Likewise, optical photos of companion perovskite films for each material shown in FIG. 47B show that the $MAPbI_3$ film becomes observably lighter in color after heating at 150° C. for an hour, whereas the corresponding $MA(Pb:Sr)I_3$ films are darker and become increasingly closer to the hues of the unheated films with increasing Sr content. This change occurs because the perovskite films are degrading into the characteristic yellow color of lead iodide ($PbI_2$) films as the methylammonium cation decomposes and evaporates from the perovskite film. This ability of the perovskite films to absorb light is quantified by measuring the absorbance spectra (FIG. 47B) of the photographed perovskite films with a UV-visible spectrophotometer. The absorbance spectra show that the $MAPbI_3$ experiences the largest degradation, as is evidenced by the absorption edge around 780 nm becoming less sharp and by a significant decrease in the absorbance in the visible range. In contrast, the $MA(Pb:Sr)I_3$ materials are all degraded to a lesser degree with very little difference arising between the spectra of the MA(15Pb:1Sr) $I_3$ composition that was heated at 150° C. for an hour and that which was not. Hence, this material evidence reveals that increasing the Sr content in the Pb:Sr mixed-metal perovskite materials delays the perovskite degradation by preventing the decomposition of the methylammonium ions.

In summary, it was demonstrated that $MA(Pb:Sr)I_3$ mixed-metal perovskite films demonstrate improved resistance to degradation compared to $MAPbI_3$ at elevated temperatures. This is evident by experimental evaluation of both the material properties and photovoltaic performance of device constructed from perovskite films that have undergone thermal treatment at 150° C. Although solar cells deployed in the field are unlikely to experience temperatures of this magnitude, degradation will still occur at lower temperatures over a much longer period of time. Hence, the heating the perovskite films to 150° C. is intended as an initial accelerated degradation test to demonstrate material resistance and it is likely Pb:Sr perovskite compositions will correspondingly extend the lifetime of perovskites that are heated at lower temperatures for a sustained time.

The planar mixed-metal perovskite films could be deployed for use in commercial photovoltaics or other optoelectronic devices such as photodetectors, light-emitting diodes, or field-effect transistors.

Materials:

Lead(II) acetate trihydrate (99.999%, $Pb(OAc)_2$), hydroiodic acid (57 wt % in water), chlorobenzene (anhydrous 99.8%, CB), and N,N-dimethylformamide (anhydrous 99.8%, DMF) were sourced from Sigma-Aldrich. Strontium iodide (anhydrous, 99.99%), calcium shot (99.5%), and aluminum shot (99.999% Puratronic) were sourced from Alfa Aesar. Methylamine solution (57 wt % in water) was sourced from TCI. Phenyl-C61-butyric acid methyl ester (99.5%, PCBM) was sourced from Nano-C, Inc. Poly(3,4-ethylenedioxythiophene)-poly(styrenesulfonate) (HTL Solar, PEDOT:PSS) was sourced from Heraeus.

Methylammonium Iodide Synthesis:

HI solution (30 mL, 57 wt % in water) and $CH_3NH_2$ solution (27.8 mL, 40 wt % in methanol) were mixed and stirred in an ice bath for 2 hours. MAI was produced by sequentially removing the solvent in a rotary evaporator, recrystallizing the solid with ethanol, and washing and filtering the precipitate with diethyl ether to achieve the purified product. The material, in the form of white crystals, was then dried in a vacuum oven at 60° C. for 24 hours and stored in a dark, dry environment until further use.

Mixed Metal Perovskite Solutions:

Mixed-mixed Pb:Sr perovskite precursor solutions were prepared by making separate stocks of (2.4 M MAI):(0.8 M $Pb(OAc)_2$) and (0.8 M MAI):(0.8 M $SrI_2$), respectively, in DMF. These two stock solutions were mixed immediately before use to achieve the desired ratios of Pb:Sr.

Solar Cell Fabrication:

Patterned ITO-coated glass substrates (Thin Film Devices Inc.) were cleaned by scrubbing and sonication in a detergent solution (Alconox) followed by thorough rinsing with Milli-Q water (Millipore). The substrates were then sequentially sonicated for around 10 minutes in Milli-Q water, acetone, and isopropanol solvents, dried under flowing nitrogen, and exposed to oxygen plasma for 10 minutes to remove any remaining organic contaminants and render the surface hydrophilic. The as-received PEDOT:PSS solution was warmed to room temperature, statically dispensed on the substrate, spin-coated at 5000 rpm for 35 s. The substrates were immediately transferred to an oven and annealed in air at 125° C. for 40 minutes, after which, they were transferred to a nitrogen glove box for the remainder of the device processing.

The PEDOT:PSS films was rinsed with CB and subsequently spin-coated at 1,750 rpm for 40 s. Immediately afterwards, 45 µL of a freshly prepared mixed metal perovskite solution was statically dispensed onto the substrate and spin-coated at 1750 rpm for 40 s. After spinning, the substrate was immediately removed from the spin-coater chuck and let rest at room temperature for 10 minutes, during which the film color slowly changed from colorless to a light brown hue. Each device was then annealed on a hot plate at 100° C. for 30 minutes and the perovskite film darkened to achieve its final color within minutes. Following annealing, the devices were left to rest at room temperature under inert atmosphere for 2 days.

A solution of $PC_{60}BM$ (30 mg $mL^{-1}$ in CB) was prepared the day before use and kept at 80° C. overnight to ensure full dissolution. The warm solution was filtered through both a 100 nm and 200 nm PTFE (Whatman) filter an hour before use and kept at 80° C. until spinning. The perovskite substrates were warmed at 80° C. for 10 minutes and 45 uL of the warm $PC_{60}BM$ solution was statically dispensed and spin-coated at 1200 rpm for 35 s (~100 nm film thickness). Each substrate was immediately transferred to a hotplate and annealed at 80° C. for 30 minutes. Afterwards, top electrodes consisting of 20 nm Ca and 90 nm of Al were thermally evaporated on top of the fullerene layer to complete the device. Finally, an aluminum film (25 nm thick) was patterned directly onto the glass backside of each device to act as an aperture mask during performance testing. The final patterned device substrate contained 10 individual solar cells, each with an apertured active area of 0.0113 $cm^2$.

Absorbance Spectra Samples:

These samples were prepared using the exact same method described for the solar cells except that the perovskite films were coated on PEDOT:PSS-coated glass wafers. The final perovskite films were capped with a layer of polymethylmacrylate (PMNIA) to prevent damage to the film from ambient moisture during subsequent measurement. This was accomplished by spin-coating a PMNIA solution (10 mg $mL^{-1}$ in CB) at 1200 rpm for 30 s.

Thermogravimetric Analysis Samples:

These samples were prepared using the exact same method described for the solar cells except that the perovskite films were coated on bare glass wafers after treatment with an oxygen plasma for 10 minutes. The final perovskite material was scraped off the glass slides and used in powder form for thermogravimetric analysis.

Device Characterization:

Current-voltage (JV) characteristics were recorded using a Keithley 2636A source meter under simulated solar light (1-Sun, 100 mW $cm^{-2}$) generated by a Newport 96000 solar simulator equipped with an AM1.5G filter. After warming the solar simulator, the light intensity was calibrated with a Newport 91150V reference cell prior to testing each batch of device. Each device was soaked under the AM 1.5G illumination for 5 minutes prior to measurement and the delay between data points was 20 ms. Devices were continuously kept in a nitrogen atmosphere after electrode evaporation, including during both JV measurements. Devices were tested within twelve hours of completion.

Other embodiments are within the scope of the following claims.

What is claimed is:

1. A composition comprising:
a perovskite material having the formula (I):

$$A'(Pb{:}B')X_3 \qquad (I)$$

wherein A' is an organic or inorganic cation, B' is a divalent metal cation, and X is a halide ion and B' replaces 0.5% to 50% of the Pb in the composition, wherein the divalent metal cation is $Co^{2+}$, $Sr^{2+}$, $Fe^{2+}$, $Mg^{2+}$, $Ni^{2+}$, or $Zn^{2+}$.

2. The composition of claim 1, wherein the A' is methylammonium, ammonium, formamidimium or phosphonium.

3. The composition of claim 1, wherein the A' is cesium.

4. The composition of claim 1, wherein the divalent metal cation is an alkaline earth metal cation or a transition metal cation.

5. The composition of claim 1, wherein the divalent metal cation is $Sr^{2+}$.

6. The composition of claim 5, wherein a ratio of Pb:$Sr^{2+}$=15:1.

7. The composition of claim 1, wherein an amount of the B' is between 1/64 and 1/4 of a total amount of the divalent metal cation.

8. The composition of claim 1, wherein the B' is $Co^{2+}$, $Sr^{2+}$ or $Zn^{2+}$, and a ratio of Pb:B'=63:1.

9. The composition of claim 1, wherein the B' is $Mg^{2+}$, or $Ni^{2+}$, and a ratio of Pb:B'=63:1.

10. The composition of claim 1, wherein the B' is $Co^{2+}$, $Sr^{2+}$ or $Zn^{2+}$, and a ratio of Pb:B'=7:1.

11. The composition of claim 1, wherein the B' is $Co^{2+}$, $Sn^{2+}$, or $Zn^{2+}$, and a ratio of Pb:B'=3:1.

12. The composition of claim 1, wherein the halide ion is $I^-$, $Br^-$ or $Cl^-$.

13. A solar cell comprising the composition of claim 1.

14. A structure comprising:
a hole transport layer;
an electron transport layer; and
a perovskite layer between the hole transport layer and the electron transport layer, wherein the perovskite layer includes a composition comprising:
a perovskite material having the formula (I):

$$A'(Pb{:}B')X_3 \qquad (I)$$

wherein A' is an organic or inorganic cation, B' is a divalent metal cation, and X is a halide ion and B' replace 0.5% to 50% of the Pb in the composition, wherein the divalent metal cation is $Co^{2+}$, $Sr^{2+}$, $Fe^{2+}$, $Mg^{2+}$, $Ni^{2+}$, or $Zn^{2+}$.

15. The structure of claim 14, further comprising a patterned transparent electrode and a pattered top electrode wherein the electrode are outside of the hole transport layer, the electron transport layer and the perovskite layer.

16. The structure of claim 15, further comprising a substrate outside of the patterned transparent electrode.

17. The structure of claim 15, wherein the A' is methylammonium, ammonium, formamidimium or phosphonium.

18. The structure of claim 14, wherein the hole transport layer includes PEDOT:PSS.

19. The structure of claim 14, wherein the electron transport layer includes a fullerene derivative.

20. A method of manufacturing a structure comprising:
preparing a solution including A'X, lead acetate (Pb(OAc)$_2$); and a divalent metal salt in a solvent, wherein A' is an organic or molecular cation and X is a halide ion, wherein the divalent metal cation is $Co^{2+}$, $Sr^{2+}$, $Fe^{2+}$, $Mg^{2+}$, $Ni^{2+}$, or $Zn^{2+}$;
spin-coating the solution onto a hole transport layer; and
crystallizing a perovskite film by drying and annealing the film.

21. The method of claim 20, wherein the divalent metal salt is a divalent metal acetate (B'(OAc)$_2$) or a divalent metal halide (B'X$_2$), wherein B' is a divalent metal cation, and X is a halide ion.

22. The method of claim 20, wherein A'X is methylammonium iodide (MAI).

23. The method of claim 22, wherein a molar ratio of MAI to a total metal salt content is 3:1, wherein the total metal salt content includes the lead acetate (Pb(OAc)$_2$) and the divalent metal salt.

24. The method of claim 21, wherein the divalent metal cation is $Sr^{2+}$.

25. The method of claim 24, wherein the strontium salt is strontium acetate (Sr(OAc)$_2$) and/or SrX, wherein X is a halide ion.

26. The method of claim 20, further comprising depositing a top electrode material.

* * * * *